(12) United States Patent
Tryon, III et al.

(10) Patent No.: US 8,290,753 B2
(45) Date of Patent: Oct. 16, 2012

(54) MATERIALS-BASED FAILURE ANALYSIS IN DESIGN OF ELECTRONIC DEVICES, AND PREDICTION OF OPERATING LIFE

(75) Inventors: Robert G. Tryon, III, Brentwood, TN (US); Animesh Dey, Brentwood, TN (US); Loren A. Nasser, Brentwood, TN (US); Ganapathi Krishnan, Brentwood, TN (US)

(73) Assignee: Vextec Corporation, Brentwood, TN (US)

( * ) Notice: Subject to any disclaimer, the term of this patent is extended or adjusted under 35 U.S.C. 154(b) by 1101 days.

(21) Appl. No.: 11/724,044

(22) Filed: Mar. 13, 2007

(65) Prior Publication Data

US 2008/0015827 A1 Jan. 17, 2008

Related U.S. Application Data

(63) Continuation-in-part of application No. 11/698,262, filed on Jan. 24, 2007.

(60) Provisional application No. 60/761,958, filed on Jan. 24, 2006, provisional application No. 60/778,196, filed on Mar. 1, 2006.

(51) Int. Cl.
*G06F 7/60* (2006.01)
*G06G 7/62* (2006.01)
*G01B 3/44* (2006.01)
*G01N 19/00* (2006.01)

(52) U.S. Cl. .................. 703/2; 703/13; 702/34; 73/804

(58) Field of Classification Search .............. 703/2, 13; 702/34; 73/804
See application file for complete search history.

(56) References Cited

U.S. PATENT DOCUMENTS

| | | | |
|---|---|---|---|
| 6,246,011 B1 * | 6/2001 | Abraham et al. | 174/260 |
| 6,301,970 B1 * | 10/2001 | Biggs et al. | 73/804 |
| 6,634,236 B2 * | 10/2003 | Mars | 73/799 |
| 6,874,370 B1 * | 4/2005 | Vachon | 73/808 |
| 7,006,947 B2 | 2/2006 | Tryon, III | |
| 7,016,825 B1 | 3/2006 | Tryon, III | |
| 7,480,573 B2 * | 1/2009 | Toyosada | 702/34 |
| 7,480,601 B2 | 1/2009 | Tryon, III | |
| 7,505,885 B2 * | 3/2009 | Deobald et al. | 703/7 |
| 2002/0139194 A1 * | 10/2002 | Mars | 73/799 |
| 2007/0185694 A1 * | 8/2007 | Rousselier et al. | 703/2 |

OTHER PUBLICATIONS

Patrick Onck, Erik van der Giessen, Growth of an initially sharp crack by grain boundary cavitation, Journal of the Mechanics and Physics of Solids, vol. 47, Issue 1, Dec. 4, 1998, pp. 99-139.*

(Continued)

*Primary Examiner* — Kamini S Shah
*Assistant Examiner* — Juan Ochoa
(74) *Attorney, Agent, or Firm* — VLP Law Group LLP; Richard G. A. Bone

(57) ABSTRACT

The technology includes methods, a system, and a computer readable medium for predicting the time to failure of an electronic component, by generating a finite element model of the component, developing a microstructure-based failure model for each representative volume element associated with each node in the finite element model, and calculating a time to failure of the component from the shortest predicted time to failure of any node when a value of a stress variable is applied to the microstructure-based failure model of each node. The technology further includes methods, system, and a medium programmed to predict failure of a system that includes an electronic component, based on predicting time to failure of the component.

9 Claims, 53 Drawing Sheets

OTHER PUBLICATIONS

Masahiro Toyosada, Koji Gotoh, Toshio Niwa, Fatigue crack propagation for a through thickness crack: a crack propagation law considering cyclic plasticity near the crack tip, International Journal of Fatigue, vol. 26, Issue 9, Sep. 2004, pp. 983-992.*

Masahiro Toyosada, Koji Gotoh, Toshio Niwa, Fatigue life assessment for welded structures without initial defects: an algorithm for predicting fatigue crack growth from a sound site, International Journal of Fatigue, vol. 26, Issue 9, Sep. 2004, pp. 993-1002.*

Knecht, et al., "Integrated Matrix Creep: Application to Accelerated Testing and Lifetime Prediction", in Solder Joint Reliability—Theory and Applications, Ed. J. H. Lau, Van Nostrand Reinhold, New York, 1991.

Knecht, S., "Integrated Matrix Creep: Application to Lifetime Prediction of Eutectic Tin-Lead Solder Joints", in Electronic Packaging Materials V Symposium, Mater. Res. Soc., Boston, MA, pp. 411-423, 1991.

Amagai, et al., "Mechanical Characterization of Sn-Ag Based Lead Free Solders", Microelectronics Reliability, vol. 42, 2002, pp. 951-966.

Dey, et al., "Automotive System Reliability Simulation Software", Huntsville Simulation Conference, Sep. 2000.

Iyer, et al., "Thermal Fatigue Characterization of Commonly-Used 63Sn37Pb Solder Joints in Electronic Assemblies", TMS (The Minerals, Metals & Materials Society) Annual Meeting & Exhibition held in Orlando, Florida, Published as "A Collection of Papers From the 2007 TMS Annual Meeting", Electronic, Magnetic, and Photonic Materials Division, Feb. 25-Mar. 1, 2007 (Eds. Long Qing Chen and Sung Kang).

Zahn, "Solder Joint Fatigue Life Model Methodology for 63Sn37Pb and 95.5Sn4Ag0.5Cu materials", Electronic Components and Technology Conference, 2003, pp. 83-94.

Lau, et al., "Solder Joint Reliability of BGA, CSP, Flip Chip and Fine Pitch SMT Assemblies", McGraw Hill, NY, 1997, Chapters 2 and 3.

Lefranc, et al., "Properties of Solders and Their Fatigue in Power Modules", Microelectronics Reliability, vol. 42, 2002, pp. 1641-1646.

Liang, et al., "An Integrated Fatigue Life Prediction Methodology for Optimum Design and Reliability Assessment of Solder Inter-Connectors", Advances in Electronic Packaging, vol. 2, 1997, pp. 1583-1592.

Line, et al., "Electronic Prognostics Through Advanced Modeling Techniques", Aerospace Conference, IEEE, Big Sky, MT, Mar. 3-10, 2007.

Liu, et al., "Thermomechanical Fatigue of Sn-37 wt.% Pb Model Solder Joints", Materials Science and Engineering, vol. A362, 2003, pp. 309-321.

Morris, et al., "The Influence of Microstructure on the Mechanics of Eutectic Solders", Advances in Electronic Packaging, vol. 2, 1997, pp. 1529-1534.

Nasser, et al., "Electronic Material Microstructural, Variability-Based, Total Life Fatigue Prediction Approach", International Conference on Intelligent Processing and Manufacturing of Materials, Monterey, CA, USA, Jul. 19-23, 2005.

Nasser, et al., "Material Simulation-Based Electronic Device Prognosis", IEEE Aerospace Conference, Mar. 5-12, 2005, pp. 1-6.

Pang, et al., "Low Cycle Fatigue Models for Lead-Free Solders", Thin Solid Films, vol. 462, 2004, pp. 408-412.

Schubert, et al., "Fatigue Life Models for Sn-Ag-Cu and Sn-Pb Solder Joints Evaluated by Experiments and Simulations", Electronic Components and Technology Conference, 2003, pp. 603-610.

Shi, et al., "A Modified Energy Based Low Cycle Fatigue Model for Eutectic Solder Alloy", Scripta Materialia, vol. 41, 1999, pp. 289-296.

Shi, et al., "Low Cycle Fatigue Analysis of Temperature and Frequency Effects in Eutectic Solder Alloy", International Journal of Fatigue, vol. 22, 2000, pp. 217-228.

Shohji, et al., "Tensile Properties of Sn-Ag Based Lead-Free Solders and Strain Rate Sensitivity", Materials Science and Engineering, vol. A3666, 2004, pp. 50-55.

Siewert, et al., "Properties of Lead-Free Solders, Release 4.0", National Institute of Standards and Technology and Colorado School of Mines, 2002.

Stinson-Bagby, "Microstructural Evolution in Thermally Cycled Large Area Lead and Lead-Free Solder Joints", Master's thesis, Virginia Polytechnic Institute and State University, 2002.

Tang, et al., "Experimental Characterization of Material Degradation of Solder Joint Under Fatigue Loading", Inter Society Conference on Thermal Phenomena, 2002, pp. 896-902.

Tryon, et al., "A Reliability-Based Model to Predict Scatter in Fatigue Crack Nucleation Life", Fatigue & Fracture of Engineering Materials & Structures, 1998, vol. 21, pp. 257-267.

Tryon, et al., "Probabilistic Mesomechanical Fatigue Crack Nucleation Model", J. Eng. Mat. and Tech., 119, Jan. 1997, pp. 65-69.

Tryon, "Probabilistic Mesomechanical Fatigue Model", NASA Technical Report NASA/CR-97-202342, Apr. 1997, pp. 1-29.

Tryon, et al., Reliability-based computational model for material development and structural design, Int. J. Mat. and Prod. Tech., (2001), vol. 16, p. 333-357.

Zhao, et al., "Fatigue Crack Growth Behavior of Sn-Pb and Sn-Based Lead-Free Solders", Engineering Fracture Mechanics, vol. 70, 2003, pp. 2187-2197.

* cited by examiner

FIG. 48A

Electronic Design Analysis Software Layout

MATERIALS-BASED FAILURE ANALYSIS IN DESIGN OF ELECTRONIC DEVICES, AND PREDICTION OF OPERATING LIFE

CROSS-REFERENCE TO RELATED APPLICATIONS

This application claims the benefit of priority of provisional application, Ser. Nos. 60/761,958, filed Jan. 24, 2006, and 60/778,196, filed Mar. 1, 2006, both of which are incorporated herein by reference in their entirety. The application is also a continuation-in-part of application Ser. No. 11/698,262, filed Jan. 24, 2007, which is also incorporated herein by reference.

ACKNOWLEDGMENT

The technology described and claimed herein was made with Government support under Contract No. N68335-05-C-0127, awarded by the Naval Air Warfare Center. The U.S. Government may have certain rights in the technology.

TECHNICAL FIELD

The technology described herein relates to a method, apparatus, and computer readable medium encoded with instructions for, designing an electronic system, module, or component based on models for predicting failure thereof, and for predicting lifetime of an instance of a system, module, or component, based on its operating history. More specifically, it relates to a method, apparatus, and programmed computer readable medium for designing an electronic system, module, or component, and for predicting lifetimes thereof, using a microstructure-based material fatigue model developed using probabilistic methods.

BACKGROUND

A reliable understanding of product failure is important at all phases of a product's life. Key, however, are the design phase—before a product is even built and tested—where the factors that contribute to increased longevity are important, and the operating phase, where a reliable estimation of a particular product's useful lifetime based on its specific use history is invaluable.

Furthermore, most products comprise many separate parts. The reliability of the product is a function of the reliability of all of the parts, including connections between the parts. Disregarding operator error—e.g., settings on the production line were grossly mis-set—products typically fail because of a material failure in a particular part. Materials can fail because repetitive stress applied over time causes internal micro-structures (e.g., grain domains) to move or distort sufficiently to nucleate a discontinuity, which leads to the propagation of a small crack, leading to a larger crack, and finally to outright failure of the part through an inability to sustain the loads applied to it. For example, electronic devices can fail when the material of an interconnect or its solder joint fails. Solder joints are particularly vulnerable to fatigue failure, as further discussed herein. As systems are powered up and down, these interconnect elements are subject to thermal gradient cycling, which, working in combination with vibration, impact, and shock loadings, create dynamic conditions conducive to fatigue.

Traditionally, reliability of electronic systems has been estimated based on engineering judgment about the applicability of past test results. The traditional measures of electronics systems reliability have been based on mean-time-to-failure (MTTF) and mean-time-between-failure (MTBF). Historically, these measures of reliability were developed based on the assumption that product failure rate is constant, i.e., a product is as equally likely to fail on its first day of use as it is ten years after being put into service. With today's computational design tools and techniques combined with better manufacturing controls, early failure is rare and long term wear-out, such as fatigue, are the predominant concerns. Given the latter, MTTF or MTBF are no longer good measures of reliability.

Imagine the fantasy of perfect reliability: applied to a single instance of a product, it would mean that the product always worked exactly as intended—however it was used, whatever conditions it was exposed to. Perfect reliability is hard enough to achieve in a single product, but very few products are built as single instances. Even without considering normal manufacturing variance, inherent randomness of the grain structure within a product's materials dictates that no two instances of a product could ever be built exactly alike. Just that level of variation at the grain structure level can give rise to differences in failure outcomes between different instances of a given product. Real world manufacturing processes then add further variance to different instances of the product. Once the product is put in service, the particular use history over the life-time of any instance will be unique (some instances may be overly stressed, others treated gently), and will take place under differing external conditions (heat, cold, shock loads, dust, etc.), all of which add further variation. Perfect reliability would mean that no instances ever failed—that in spite of manufacturing variances, differing uses, and exposure to differing conditions, nothing ever went wrong.

In normal practice, then, across all instances, all uses, and all exposures, some number of product failures will occur. Coming to a quantitative understanding of these failures—how many are likely to occur, when they are likely to occur, under what conditions they will occur, why they will occur, how to reduce their occurrence, therefore would have significant benefits.

Electronic devices are complex multilayered systems consisting of different materials with inherent variability. Competitive pressures are demanding that electronics be operated under increasingly harsh environments and operating conditions. For example, power supply systems are—compared to other electronic systems—highly susceptible to failure due to the high voltage and current conditions in which they routinely operate. Also, the trend to provide more processing power from smaller and smaller integrated circuits is accelerating. However, even electronic devices fail eventually, regardless of how well they are engineered. Unlike mechanical systems, electronic systems rarely actively display conventional fault signals prior to failure. Failure can frequently be attributed to structural, material, or manufacturing defects.

Electronic devices are particularly reliant on the integrity of interconnects or solder bonds. The reliability of interconnects is a concern because it is widely expressed in the scientific literature that fracture failures in solder joints account for up to 70% of failures in electronic components (see, e.g., Zeng, K., Tu, K. N., (2002) "Six cases of reliability study of Pb-free solder joints in electronic packaging technology", *Materials Science and Engineering R*, Vol. 38, pp. 55-105, incorporated herein by reference). Interconnect or solder degradation and failure is principally due to thermomechanical and vibratory fatigue mechanisms. As a device is operated, thermal and/or mechanical loads are induced in it. These loads are translated from the device level to the localized interconnect level. Thermal gradient cycling during normal system operation eventually results in thermo-mechanical fatigue induced failure.

Failure analysis has revealed that actual component loadings are often well below the steady loads that can cause failure. What distinguishes failures attributed to actual loadings is the fact that the loads have been applied repeatedly. This is classic fatigue. It is estimated that perhaps 90% of all machine failures are caused by fatigue. Fatigue, or more specifically fatigue crack initiation and growth, is therefore a damage mechanism that degrades the reliability and safe life of components subjected to repeated loads. Such loads could be from thermal, vibratory, shock, and electromagnetic loadings. Although less obvious, this same mode of failure applies to static structures as well as those that are in motion. Static structural components are subject to vibrations and movements created from thermal expansion and contraction. Electronic systems are static structures that are subject to these same types of phenomena. Though the movements may be slight, large cyclic forces can result. Designing for fatigue has been difficult hitherto because fatigue typically manifests itself with greatly varying effects on similar components.

Fatigue can occur in any device with either static or moving components, even where the movement is imperceptible, such as is the case with interconnects or solder joints, where there can be very small displacements but very large strains (displacements per unit length). Component failure is frequently insidious, with no prior indication that damage had occurred. Sometimes fatigue can cause intermittent failure. For example, an initiated fatigue crack in solder can cause the device in which the solder is found to operate sporadically due to metallic contact bridging.

Solder joints are particularly vulnerable to fatigue failure. As systems are powered up and down, interconnect elements are subject to thermal gradient cycling, which, working in combination with vibration, impact, and shock loadings, creates dynamic conditions conducive to fatigue. The typical electronics printed circuit board (PCB) manufacturing processes, in which solder is melted and then cooled, creates joints with complex internal grain structures. These grain structures are stressed by the cooling process, and undergo continuous movement in response to these stresses. This movement, which is on-going even as the system is sitting under non-working conditions in a warehouse, is in itself sufficient to contribute to fatigue vulnerability.

A failure at the module or component level often leads to failure of the whole system. Such failures can result in immediate electronic system shutdown with no advanced fault or warning signals, thus preventing the use of conventional fault-to-failure detection approaches as a means of predicting maintenance need. Such failures can also present safety or maintenance concerns, and often result in economic setbacks such as loss of market share when the product's failure rate becomes sufficiently notorious.

The consequences of failure of a product to the immediate user therefore range from minor inconvenience, to major annoyance, or to catastrophe. Repercussions from such failures ultimately transform into consequences for the manufacturers of the product. It is such consequences that motivate product manufacturers to develop rational strategies to minimize occurrence of failure. The strategies vary depending on specific motivating circumstances, but all involve economic considerations and trade-offs. Even if a product has a significant potential to produce catastrophic results, economic trade-offs cannot be ignored (for one can always spend more and take more time testing, to achieve still higher levels of safety).

Engineers have tried to design electronics for high reliability, but most often the reliability information comes very late in the design process. Normally, a statistically significant quantity of reliability data is not obtained until after product launch, and warranty claims from use by consumers have been fielded. This lack of data inspired engineers in the past to make their designs more robust by using safety factors that ensured the designs would meet predefined reliability goals.

Since similar components frequently present great lifespan variations (for example, one electronic element might last many years, but another element produced by the same manufacturer could fail in a few months), traditional methods of component design attempt to moot the effects of great uncertainty or scatter in lifespan by applying large safety factors to ensure low probabilities of failure. Safety factors, however, are subjective in nature and are usually based on historical use. Safety factors are likewise unsatisfactory methods for predicting the life of an individual since they are based on historical information obtained from a population. Safety factors are also an unsatisfactory method for quickly and efficiently designing against failure since they rely on historical information obtained from test and component data which may not be available in the design phase.

Now that modern manufacturers are incorporating new technology and manufacturing methods faster than ever before, exactly what safety factor is appropriate in today's complex, state-of-the-art, electronics is seldom, if ever, known with certainty. This complicates the engineering design process. Designed-in safety factors tend to add material or structural components, or add complexity to the manufacturing process. Safety factors are counterproductive where industry is attempting to cut production costs or reduce weight of products.

Additionally, given that true operational performance is so difficult to predict accurately, it is common practice within the electronics industry to achieve high reliability through redundancy. Although redundancy allows an electronic system to continue to operate after one or more components have failed (because another component is present to perform the same role), this practice is costly and presents a barrier to electronics miniaturization. Designing cost effective and highly reliable electronics through maximizing component life therefore requires the ability to reduce reliance on safety factors as much as possible for a given design. In other industries (e.g., aircraft parts), where the true operating life of the component could be much greater than its predicted life, to ensure that no component fails during operation, components are often retired well before exhausting their useful lifetime.

In attempting to reduce reliance on safety factors, designers have developed models for the more prevalent damage mechanisms that lead to failures. Failures can be attributed to many different kinds of damage mechanisms, including electro-migration, buckling, and corrosion. Models for these mechanisms can be used during the design process, usually through deterministic analysis, to identify feasible design concept alternatives. Nevertheless, poor, or less than desired, reliability is often attributed to variability amongst the population of products, and deterministic analysis which utilizes single values for all design, manufacturing, and usage variables to calculate a single value of reliability, cannot account for variability.

Variability affects reliability of electronic systems through any number of factors including loading scenarios, environmental condition changes, usage patterns, and maintenance habits. Even the response of a system to a steady input, such as a constant voltage supply, can exhibit variability due to parameters such as a varying ambient temperature.

Previously, the reliability of electronic devices has also been assessed using empirically-based models. Experimental design is a commonly used tool in which the experimental conditions are systematically varied and a mathematical relationship is "fit" to the data that represents the influence of the conditions to the time or cycles to failure. However, one drawback of this approach is the fact that there is so much variation in the time or cycles to failure that device life can only be conveyed in the form of a statistical average, such as mean time to failure (MTTF) or the mean time between failure (MTBF). Although these statistical averages provide a general sense about average overall failure, they are a holdover from a time when computer processing power was expensive. They only provide a single point number and offer no insight about real world probabilistic variation, true failure mechanisms or the impact those mechanisms have on how a specific design will react to actual field conditions. Accordingly, although such metrics are appropriate in the context of manufactured fleet lot reliability they lack the fidelity for accurate representation of individual device reliability in the field.

Over the years, probabilistic techniques have been developed for predicting variability and have been coupled with damage models of failure mechanisms to provide probabilistic damage models that predict the reliability of a population. But, given variability, a prediction of the reliability of a population says little about the future life of an individual member of the population.

Historically, testing has been the primary means for evaluating the effects of variability. Unfortunately, testing is slow, expensive and burdensome, and evaluation of every possible source of variability is impractical. Furthermore, it is simply not practical to directly sense the degradation of electronic components. Their damage states are usually structural and, due to their size, structural response signatures of electronic components are not directly monitored. For example, it would be both difficult and expensive to directly sense the cracking of a single emitter wire bond on a circuit board comprised of thousands of emitter wires. Yet, the failure of a single emitter wire can cause the failure of the entire device. None of the electronics industries traditionally used fatigue models to account for the large scatter in the properties of solder weld.

The trend away from physical testing has been forced in part because the cost of physical tests are rising whereas the cost of computer cycles are plummeting, thereby increasing the practicality of replacing the old "test it" paradigm with a "compute it" paradigm.

If there were an effective way to predict the impending failure of an electronic system, module, or component, operators could repair or retire a system before an actual failure, thus avoiding the negative consequences of failure. Thus, accurate prediction of impending failure could have great economic impact on industries whose products rely on electronic components, industries as diverse as aerospace, automotive, communications, medical device, domestic appliance, and related sectors.

In the case of fatigue failure, scatter in component life is quantified by a coefficient of variation (COV) which is usually determined based on a large number of fatigue life tests on many material specimens, or by full-scale testing of prototype electronic systems. Even under well-controlled laboratory tests of annealed smooth specimens at room temperature, the COV varies from less than 10% to over 500% for different interconnect alloys. Thus, the considerable scatter in the fatigue reliability of components in operation may be substantially attributed to considerable scatter of component material fatigue behavior.

Life scatter of components made from a given material, on the other hand, is due to the fact that, generally, materials have inhomogeneous microstructures. To the naked eye, it may appear that a component is composed of continuous homogeneous material. However, microscopic examination reveals that metals, for example, are comprised of discontinuous inhomogeneous material having individual crystalline grains, pores, and defects. Cracks nucleate and grow on the order of grain size according to the properties of the individual grains, with growth rates as varied as grain properties. As these cracks grow, the rate and behavior of the crack approaches the bulk or average properties of the material. Therefore, for large cracks, traditional methods for modeling crack growth, such as elastic fracture, plastic fracture, and combined elastic/plastic fracture mechanics, are appropriate. Traditional methods, however, cannot determine the probability of crack initiation or describe crack growth of nearly grain-sized cracks. In many applications, failure can occur before the fatigue damage reaches the long crack stage because although the damage is very small, the strain energy associated with the damage is very high.

As a result, there exists a need for a method and apparatus for accurately predicting failure that accounts for the microstructural properties of materials and sequential variation in the loading, and relates them to fatigue scatter. In particular, there exists a need for a method and apparatus for accurately predicting electronic component, module, and/or system failure that accounts for variability without the need for extensive test data on the electronic component and/or system. This can be accomplished by accurately assessing a component's life by determining the effects of fatigue on it.

U.S. Pat. Nos. 7,006,947, and 7,016,825, both of which are incorporated by reference in their entirety, have shown that grain by grain simulation of the materials from which individual components are made has proven successful for fatigue life prediction on large structural components, as well as providing prognoses of failure when using measured data. However similar approaches to predict reliability of small-scale components such as interconnects has not previously been thought possible or practical.

The discussion of the background to the technology herein is included to explain the context of the technology. This is not to be taken as an admission that any of the material referred to was published, known, or part of the common general knowledge as at the priority date of any of the claims.

Throughout the description and claims of the specification the word "comprise" and variations thereof, such as "comprising" and "comprises", is not intended to exclude other additives, components, integers or steps.

SUMMARY

In short, material failure must be considered a primary mechanism behind electronics failure, and applying the types of modeling techniques advocated in this application can lead to major improvements in the understanding of electronic system reliability.

To approach reliability at a strategic level, an organization must properly integrate reliability factors into the details of its product design process, deciding throughout the design process how much reliability to purchase—that is, how to make rational decisions at all steps along the way about the economic trade-offs associated with the benefits versus the costs of achieving ever greater reliability. Manufacturers that understand reliability properly, and are able to execute according to that understanding, should in the long run significantly out-perform manufacturers that do not. This represents a paradigm shift from old methods in which a reliability specialist designed an analysis framework, tested a product or component in that framework, and repaired or adjusted the product or component accordingly. In approaches advocated herein, so-called reliability-based design, a designer uses a knowledge of failure to develop an understanding of component life, thereby permitting control of various factors.

Product reliability is inherently probabilistic, driven by natural randomness in the grain structures of the materials from which the product is made, and the necessarily random response these grain structures have to the application of stress. This randomness manifests itself as an inherent spread in point of failure, and time to failure, for any macro-scale object or structure. The methods described herein explicitly use this fundamental property of materials as input and are thus able to account for failure in ways that traditional methods cannot.

Testing cannot be completely eliminated today; physical modeling paradigms are not yet sufficiently robust to allow that. However, in the approaches to reliability prediction expressed herein, testing can be focused on providing data for the critical inputs to the modeling process, allowing mathematical techniques, such as performed on a computer, to proceed to provide a vivid and detailed picture of failure mechanisms—far beyond what testing alone could ever provide. Computational reliability modeling (CRM) significantly reduces engineering costs while simultaneously providing a more detailed insight into the reliability issues facing a given product design. The goal of CRM is to allow the design engineer to achieve desired levels of product reliability assurance across the widest possible range of operating conditions, including edge states that bedevil the most robust testing programs.

Products are composites of many component elements, all of which are individually subject to various stresses during their lifetimes. The reliability of an overall product is a function of the reliability of all of the parts, including interconnections between the parts. It is a premise of the technology described herein that if reliability of components and interconnects is sufficiently understood, it becomes possible to mathematically model the contributions to overall system reliability from each of the lower level elements. This is achieved by various simulation techniques as adapted herein. Furthermore, methods herein also make it possible to work in reverse, and apportion a top down 'reliability budget' on a system's component parts based on a needed overall system level reliability. Such a method can be expanded to allow engineers to explore various options by analytically gauging the trade-off of reliability improvements in specific components against the costs of making those improvements.

With inputs from all of the parameters discussed herein, plus parameters inherent to the materials themselves, the processes are physically deterministic at a fundamental microstructural level. One of the inputs to the methods, however, is the particular alignment of any grain with respect to any other. In real materials these alignments are random, and this randomness must be explicitly brought into the calculations of failure. So, while all grains will respond to the applied stress in a manner governed by a common physics, the random geometries of the grain structure determines that a specific failure outcome at the macro level will be probabilistic, not deterministic. It is this randomness of grain properties that gives rise to the failure mechanisms observed in real physical systems—macroscopically identical parts subjected to the same stress profile will fail differently, with a probability distribution governed by the specifics of the grain structure and part geometry. It is possible to mathematically model these material level failure mechanisms by combining the physics of grain structure response to stress with a Monte Carlo simulation of the randomness of grain size and orientation. The outcome from these models matches to a high degree of accuracy with experimental data gathered from actual testing, and can be fed into the higher level system roll-up models discussed herein.

The technology described herein provides a method of predicting time to failure of an electronic component, the method comprising: generating a finite element model of the component, wherein the finite element model comprises a plurality of nodes, and wherein a value of at least one stress variable is associated with each node of the plurality of nodes; defining at least one representative volume element for each node of the plurality of nodes whose value of at least one stress variable exceeds a threshold; developing a microstructure-based failure model for each of the representative volume elements, wherein the microstructure-based failure model uses random initial values for one or more properties of the microstructure, and wherein the microstructure-based failure model comprises one or more cyclic fatigue models selected from the group consisting of crack nucleation, short crack growth, and long crack growth models, and further comprises one or more time-dependent fatigue models selected from the group consisting of crack nucleation, short crack growth, and long crack growth models; simulating failure of each node by applying the value of the at least one stress variable for that node to the microstructure-based failure model for each of the representative volume elements for that node, thereby calculating a predicted time to failure for each representative volume element; and calculating a time to failure for the component by choosing the shortest predicted time to failure for any node.

The method further comprises: performing the simulating of failure for each node a plurality of times, using different initial values for the one or more properties of the microstructure, thereby producing a plurality of predicted times to failure for the component; and deriving a probabilistic model of failure of the component based on the plurality of predicted times to failure.

The technology herein further comprises a computer system, configured to predict time to failure of an electronic component, the system comprising: a memory; and a processor, wherein the processor is configured to execute instructions for: generating a finite element model of the component, wherein the finite element model comprises a plurality of nodes, and wherein a value of at least one stress variable is associated with each node of the plurality of nodes; defining at least one representative volume element for each node of the plurality of nodes whose value of at least one stress variable exceeds a threshold; developing a microstructure-based failure model for each of the representative volume elements, wherein the microstructure-based failure model uses random initial values for one or more properties of the microstructure, and wherein the microstructure-based failure model comprises one or more cyclic fatigue models selected from the group consisting of crack nucleation, short crack growth, and long crack growth models, and further comprises one or more time-dependent fatigue models selected from the group consisting of crack nucleation, short crack growth, and long crack growth models; simulating failure of each node by applying the value of the at least one stress variable for that node to the microstructure-based failure model for each of the representative volume elements for that node, thereby calculating a predicted time to failure for each representative volume element; and calculating a time to failure for the component by choosing the shortest predicted time to failure for any node.

The technology further comprises a system, wherein the processor is further configured to execute instructions comprising: performing the simulating of failure for each node a plurality of times, using different initial values for the one or more properties of the microstructure, thereby producing a plurality of predicted times to failure for the component; and deriving a probabilistic model of failure of the component based on the plurality of predicted times to failure.

The technology further comprises a computer readable medium, configured with instructions to predict time to failure of an electronic component, the instructions comprising instructions for: generating a finite element model of the component, wherein the finite element model comprises a plurality of nodes, and wherein a value of at least one stress variable is associated with each node of the plurality of nodes; defining at least one representative volume element for each node of the plurality of nodes whose value of at least one stress variable exceeds a threshold; developing a microstructure-based failure model for each of the representative volume elements, wherein the microstructure-based failure model uses random initial values for one or more properties of the microstructure, and wherein the microstructure-based failure model comprises one or more cyclic fatigue models selected from the group consisting of crack nucleation, short crack growth, and long crack growth models, and further comprises one or more time-dependent fatigue models selected from the group consisting of crack nucleation, short crack growth, and long crack growth models; simulating failure of each node by applying the value of the at least one stress variable for that node to the microstructure-based failure model for each of the representative volume elements for that node, thereby calculating a predicted time to failure for each representative volume element; and calculating a time to failure for the component by choosing the shortest predicted time to failure for any node.

The technology further comprises a computer readable medium, wherein the medium is further encode with instructions to: perform the simulating of failure for each node a plurality of times, using different initial values for the one or more properties of the microstructure, thereby producing a plurality of predicted times to failure for the component; and derive a probabilistic model of failure of the component based on the plurality of predicted times to failure.

Probabilistic analysis of an electronic system can predict system and/or module and/or component failure, or reliability, based on acquired data in conjunction with data obtained from the scientific and technical literature and data inferred from the acquired data. This prediction of failure or reliability is then communicated to those using or monitoring the system. Furthermore, the analyzed system can be stationary or mobile with the method or apparatus of analysis and communication of the failure prediction being performed either on the system or remotely from the system. In addition, the apparatus may interface with other computer systems, with these other computer systems supplying the required data, or deciding whether and/or how to communicate a prediction.

An advantage of one embodiment is that it divides system variables into three types: directly sensed—those that change during operation or product use; referred—those that do not (significantly) change during operation or product use; and inferred—those that change during operation or use but are not directly sensed. This approach divides the probabilistic approach into two broad categories, pre-process off-board analysis and near real time on-board or off-board analysis, allowing for prediction of a probability of failure based on both immediate and historic use.

In one embodiment, a computer implements a method for predicting failure in an electronic system. This method comprises: obtaining data associated with an electronic system; creating a prediction of a failure of the electronic system using a model of the system and the data; and communicating the prediction to a user or operator.

A second embodiment is an apparatus for predicting failure of an electronic system. This apparatus comprises: sensors for acquiring data from the electronic system and a computer, the computer having a processor and memory. Within the memory are instructions for measuring the data from the sensors; instructions for creating a prediction of a failure of the electronic system using a model and the data; and instructions for communicating the prediction to a user. The apparatus also comprises communication means for communicating the prediction.

A third embodiment of the technology is a computer program product for predicting failure of an electronic system, for use in conjunction with a computer system. The computer program product comprises a computer readable storage medium and a computer program mechanism embedded therein. The computer program mechanism comprises: instructions for receiving data; instructions for storing the data; instructions for creating a prediction of failure of the system using a model and the data; and instructions for communicating this prediction. Furthermore, embodiments of these apparatuses and this method use a system model developed with probabilistic methods.

The methods described herein are equally applicable in the design phase of a product or component as they are in the prognosis of a product lifetime during its operation and/or use. The way in which the respective methods operate is largely equivalent, but the input data is different. Thus, at the design phase, data is typically obtained from literature and historical data, whereas in a prognosis application, data is typically obtained from specific measurements of the component or product in question, taken either in real-time, or built up over a period of use.

BRIEF DESCRIPTION OF THE DRAWINGS

The foregoing and other aspects and advantages of the present technology will be better understood from the following detailed description of preferred embodiments of the technology with reference to the drawings, in which:

Figure 48A:
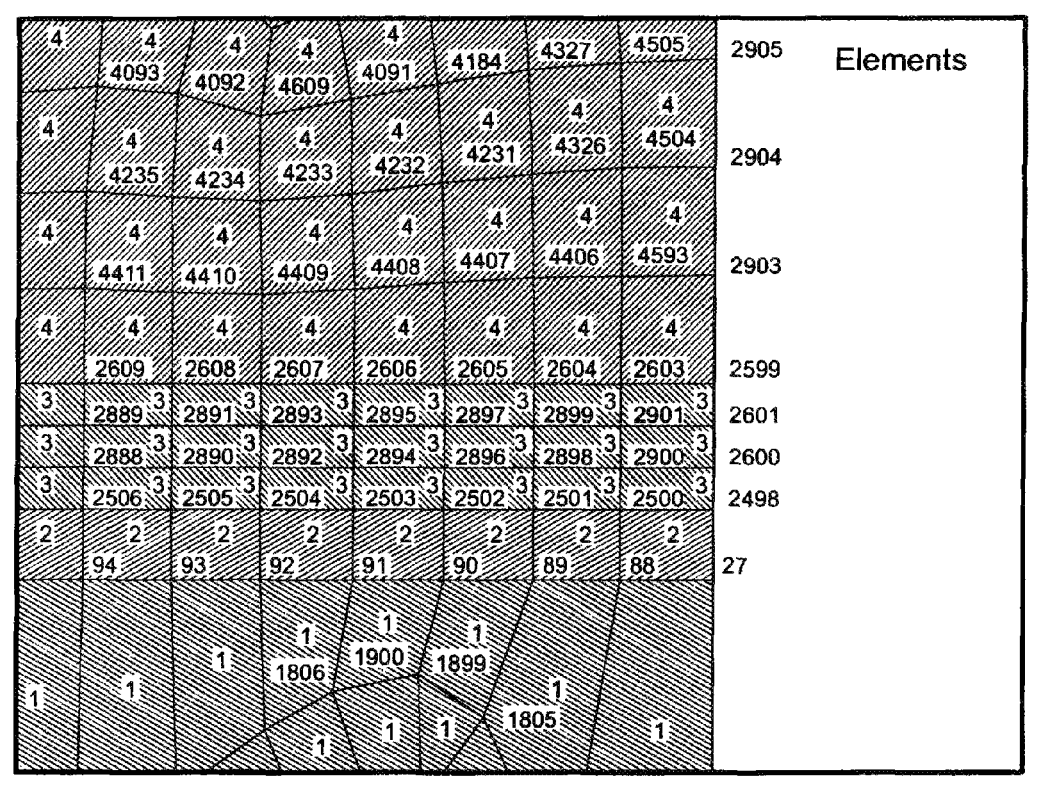

FIGS. 48A and 48B: FEA representation of material layer variability.

Similar reference numerals refer to corresponding elements throughout the several drawings.

DETAILED DESCRIPTION

Introduction

A product, such as a television, a radar system, an automobile, or a piece of military hardware, comprises many parts. It can be analyzed hierarchically, so that the overall product—which may be referred to as a system—has a number of components, which may, in turn, comprise a number of different pieces. The methods described herein model failure of products that include at least one electronic component. By electronic component is meant piece of electronic circuitry such as a resistor, capacitor, or interconnect. A product may have many hundreds, thousands, or millions of electronic components as well as non-electronic components, therefore. The methods described herein model electronic components at the material level and are thus able to incorporate a description of fatigue that is based on physical models that are consistent with the known laws of physics.

As understood by one of ordinary skill in the art, fatigue is damage that is caused to a material as a result of a cyclic loading. Such a loading is characterized by being applied repeatedly, rather than by having a particular magnitude. Thus, even though the load that is applied to the material at any instant would not by itself be sufficient to cause the material to fail, the fact that the load has been applied repeatedly and in the same way to the material is sufficient to cause failure in the long term.

Failure of a material, as understood by one of ordinary skill in the art, is the point at which the material no longer meets its intended function. It is not required that the material in question has actually disintegrated or fragmented, but it may be that on inspection, the material can be seen to have sustained the kind of damage that means that it cannot be expected to safely fulfill its intended role. As is also understood by one of ordinary skill in the art, fatigue failure is a localized, material-driven process, wherein high stresses are translated from global loadings to the local material.

Figure 1:
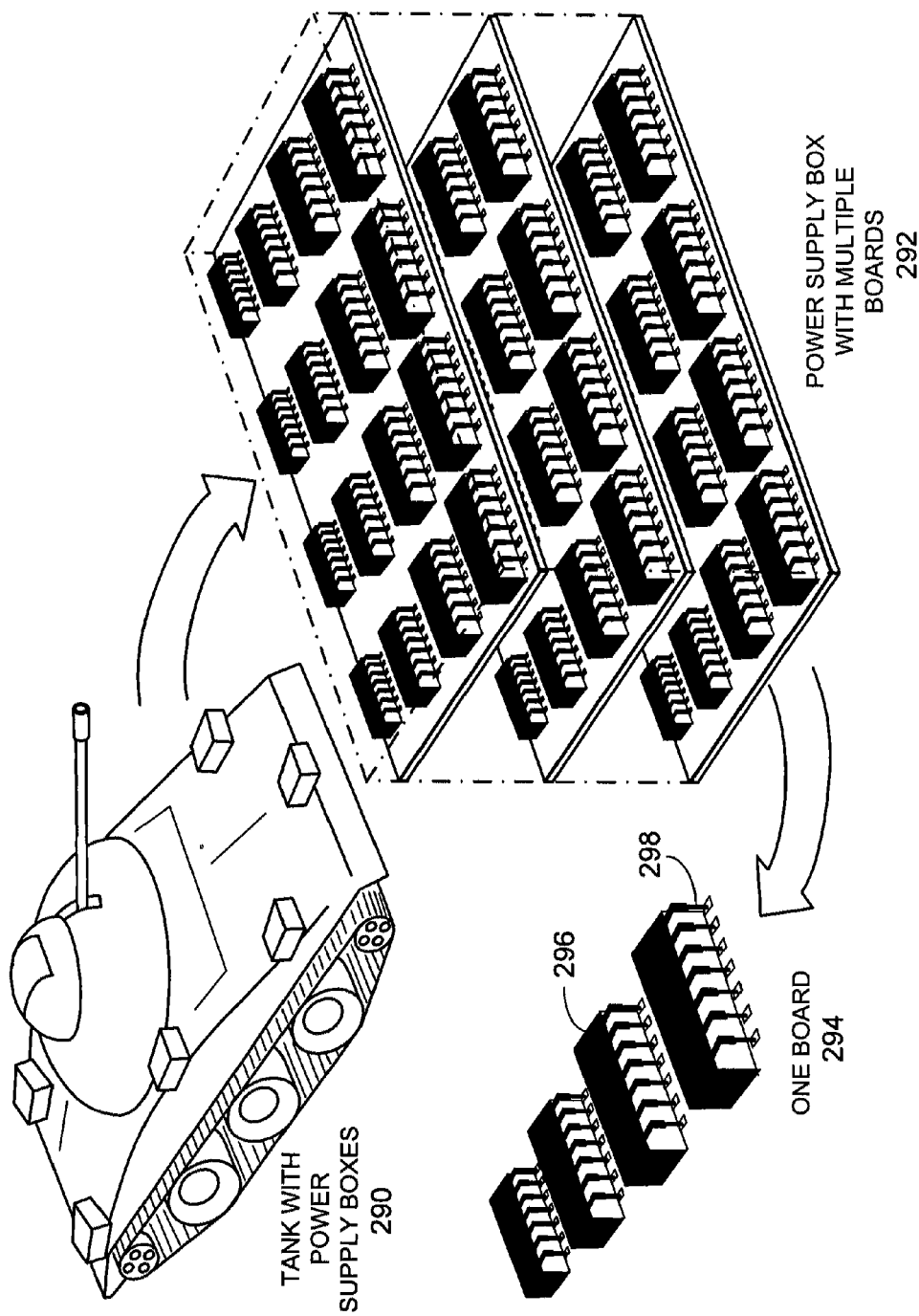
FIG. 1: Hierarchy of a system.

Product hierarchy is shown schematically in FIG. 1 for a military vehicle 290. The vehicle (the 'system' level) comprises a number of power supply boxes 292, one of which is shown. A power supply box itself comprises a number of boards, one of which 294 is shown. Each board comprises a number of electronic circuits ('chips') 296 as shown, attached to the board via one or more terminals 298. Each chip may itself comprise a number of electronic components, such as interconnects, resistors, gates, etc. (not shown in FIG. 1).

Within the described technology, failure can therefore be represented as it actually happens rather than as an approximation based upon averages; therefore engineers gain a far truer picture of the actual spreads in reliability performance to be expected for their designs in real life operation. Beyond this, the technology allows engineers to know the impact of each individual design decision on reliability, and an explicit understanding of the impact of individual component reliability performance on system level reliability, and, conversely, the apportionment of a reliability budget at the component level to achieve desired system level reliability goals. Finally, the technology permits the computation of the impact of endogenous factors such as shock, thermal, and vibration, on reliability, and even allows computing the potential impact of edge states that fall outside of the realm of the most robust testing programs.

Conceptually, the reliability of a product is related to the probability that the product will perform its intended function in a satisfactory manner for a specified period of time under realistic conditions. Mathematically, reliability is understood to be given by 1−p(failure), where p(failure) is the probability of failure after a particular length of time. Thus reliability is a probabilistic measure. In practice, the fatigue reliability measure as output from a simulation using these models, as further described herein, is a probabilistic model that provides a statistical distribution of time (e.g., measured as a numbers of hours) to failure. Thus, identifying a particular lifetime for the material permits one to deduce the probability that the material will survive that long. Conversely, one who has a predetermined reliability threshold, below which product reliability is unsatisfactory, can determine the number of hours of service that the product can endure before the probability of fatigue-based failure introduces too high a level of risk.

The reliability of a digital circuit board is a function of the reliability of all of its parts, including interconnects. If component and interconnect reliability is sufficiently understood, it becomes possible to mathematically model the contributions to overall system reliability. This can be accomplished herein using various simulation techniques.

Ignoring effects of operator error, products fail because of a material failure in a component or interconnect. As an example, materials fail because repetitive stress applied over time causes internal micro-structures (e.g., grain domains) to move or distort sufficiently to nucleate a discontinuity which leads to the propagation of a small crack, leading to a larger one, and finally to outright material separation and failure. With inputs from all load and geometric conditions, plus parameters inherent to the material itself, this process is physically deterministic at a fundamental microstructural level. On the smallest scale, the technology described herein considers the randomness of grain properties that gives rise to the failure mechanisms observed in real physical systems—macroscopically identical parts subjected to the same stress profile will fail differently, with a probability distribution governed by the specifics of the grain structure and part geometry. In order to predict overall board reliability, the technology rolls up various contributions from material failure to the overall system level.

In short, fatigue must be considered a primary mechanism behind electronics failure, and applying the types of modeling techniques described herein leads to major improvements in the understanding of electronic system reliability.

Electronics reliability analysis encompasses the process of analyzing for variability. Real world variability occurs due to the different ways the same product design is used, the environmental influences imposed on the product, processing variations allowed through the tolerance controls and inspection intervals implemented, and the raw material variations that were accepted prior to processing.

For example, the nature of the packaged components and variability within the assembly process creates large variations in the solder welds for even the strictest manufacturing tolerances. The very small size of the welds causes variation of the weld footprint from weld to weld. In addition, the microstructural development of the weld is greatly controlled by rate of cooling from the melt stage. Purely empirically derived models do not account for this real world variability.

Variability can be analyzed at every level of product hierarchy according to the methods herein. This is from the lowest level where physics of failure describes the process for fatigue crack initiation and development within the material microstructure, to the complex electronic interconnect, the electronic control unit (ECU), and finally to the overall vehicle system of ECU's. The oversimplification that every element within the system of ECUs has a constant failure rate is not assumed. In fact, no assumptions are made about failure rates. Physics of failure models are used to predict failure rates based on measured statistical variations. Statistical measurements of manufacturing process control determine the statistical variations in the geometric dimensions and product material properties. Warranty records, customer surveys and built-in diagnostics are used to determine the statistical variation in how the product is used. These statistical distributions are combined with the physics of failure within a virtual representation of the electronics product to simulate the product's real world performance. Thus, reliability can be estimated while a product is still on the drawing board.

Material simulation is rolled up to the overall board or system level to predict overall electronics reliability. Electronic design automation (EDA) software is used throughout the industry for electronic layout and functioning, thermal, and even stress analysis. Methods described herein may be integrated seamlessly with commercially available EDA environment(s). As a designer uses EDA software drag-and-drop functions to build a prototype system, representative reliability statistics for the individual system elements can follow-on with already built in electronic attributes. Data mining techniques can be used to access warranty, test, or "stored" engineering knowledge, so that a designer can readily perform reliability assessments. Although it is acknowledged that initially the data available to be mined might be minimal or sketchy, over time—as the capability for these data become apparent—the data available for mining will become more accurate and complete.

System-level reliability "roll-up" methodology can use existing failure data, test data or reliability estimates for the various elements that make up the system. The mathematics behind simulation processes, such as the Monte Carlo methods, have been used within reliability analysis circles. Previous barriers to wide-spread use of such simulations include the fact that a typical designer doesn't have access to reliability data needed to accomplish a system roll-up process. For example, warranty data with relatively good accuracy is readily available to corporate reliability groups, and these relatively few number of engineers are the only ones who have been able to perform high quality reliability assessments for concept designs.

Deficiencies of simple MTBF and MTTF models would be compounded when used to represent a component level roll up into a total system reliability analysis. In fact, each component in such a system has its own probabilistic distribution of failure. A way to obtain meaningful information about system failure by summing component level failure is to take specific account of all of these distributions via a process such as Monte Carlo simulation. System reliability using modeling of components has been described elsewhere (see e.g., Ang, A. H. S., and Tang, W. H., *Probability Concepts in Engineering Planning and Design*, Vol. II, John Wiley & Sons, (1975)), but where such methods use an MTBF or MTTF, which assume some average failure rate, not a probabilistic distribution, they cannot achieve the accuracy offered here.

Furthermore, it is possible to apportion a top down 'reliability budget' on system component parts based on a needed overall system level reliability. This top down technique allows engineers to confidently explore hypotheticals by analytically gauging the trade-off of reliability improvements in specific components against the costs of making those improvements.

It is possible to use software that implements the approaches described herein to quickly identify reliability driving parameters within the system. However, this analysis process becomes many times more useful if, through additional data mining, costs can be integrated within the simulation. A cost can be associated with reliability through repair/replacement metrics. Most large automakers, for example, have this type of maintenance cost data—even categorized by geographic labor costs and expected supplier variability. The designer will have the ability to identify system cost drivers as well as reliability drivers. These two analyses often yield different results for a single system roll-up. Given this, management has a newfound ability to decide whether the system should be designed for reliability, cost, or an optimized balance of the two. Never before has this kind of immediate engineered reliability and reliability cost projection information been available for management decision making. Models based on historic cost statistics, used predominantly throughout at least the auto industry, do not accurately reflect future engineered designs. This capability will change the manner in which contracts are prepared, warranty strategies are formed, and sales/marketing strategies are implemented.

The simulation virtually "drives" or tests the specified number of systems.

Overview

Figure 2:
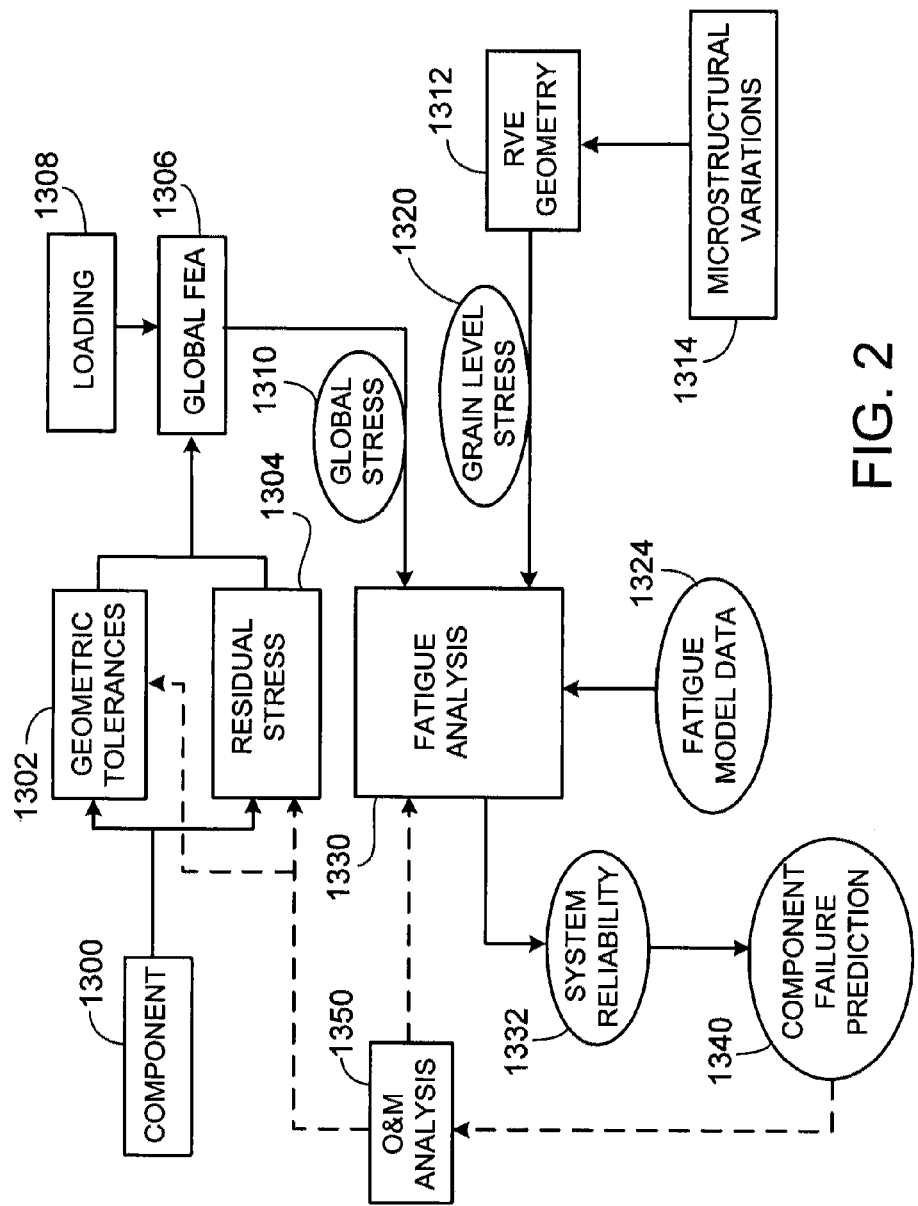
FIG. 2: Overview of proposed conceptual software operational characteristics.

An overview of the method described herein is shown in FIG. 2. From a description of an electronic component 1300, such as a chip on a circuit board, geometric tolerances 1302 and residual stresses 1304 are derived. These quantities are input to a global finite element analysis model 1306 of the component, constructed by application of finite element analysis. Construction of a global finite element model is described elsewhere herein, for example, in connection with FIG. 7(d). Additional inputs to the global finite element model include various loadings 1308 experienced by the component, including but not limited to one or more of thermal, vibrational, and impact/shock loadings. The output from the global finite element calculation is a set of global stresses 1310 experienced by the component, which are then input to a fatigue analysis 1330, which is further described in FIG. 7(a), herein. Additionally, a microstructural finite element analysis calculation is carried out, using a representative volume element of the material 1312. Input to the microstructural finite element analysis includes data on microstructural variations 1314, as further described in FIG. 7(a), herein. Such data may be calculated directly prior to carrying out the finite element analysis but may also be retrieved from a library of pre-computed data. The microstructural finite element calculation can be performed before, after, or concurrently with the global finite element analysis 1306. Output from the microstructural finite element analysis is a set of grain level stresses 1320 that is input to the fatigue analysis 1330. Additional input to the fatigue analysis 1330 includes outputs from calculations of model fatigue mechanisms 1324, as further described in FIGS. 7(a), 7(b), and 3. Output from fatigue analysis 1330 is a measure of system reliability 1332, from which a component failure prediction 1340 can be made. Component failure prediction 1340 can be carried out according to methods described in FIGS. 7(c,d).

Optionally, the component failure prediction can be used in an operation an maintenance analysis 1350 in situations where, for instance, an expensive circuit board on which a single component has failed, is simply repaired and re-installed into its original operating environment. This information can be fed-back into fatigue analysis 1330, and can also be used to update geometric tolerances 1302 and residual stresses 1304 associated with the component that has failed and is being replaced. Thus, field data can be obtained and used to update the component model.

System

An embodiment of the present technology uses historical data combined with probabilistic models based on engineering analysis to provide a method for predicting the probability of failure of an electronic component, or a system. This embodiment uses probabilistic analysis models to address, on a system by system basis, the effects of the random nature associated with use, loading, material makeup, environmental conditions, and manufacturing differences. This embodiment assumes that the underlying physics of the system behavior is deterministic and that the random nature of the system response is attributed to the scatter (variability) in the input to the system and the parameters defining the physics of failure.

The underlying physics of the behavior of the electronic system is captured by developing a system response model. This model, which represents the nominal response of the system, uses random variables as input parameters to represent the random behavior of the system. The system response model may be based on the explicit mathematical formulas of electricity and magnetism of materials, thermodynamics, etc. Computational methods such as TCAD (Technology Computer Aided Design), finite element analysis and computational heat transfer analysis are sometimes used to assess the response of the system. Closely coupled with the system response models are failure models. The failure models, which address both initial and progressive damage, may be either in the form of maximum load interactive criteria, or more specific models, which have been developed by the system's original equipment manufacturers (OEM's), such as electro-migration models.

Probabilistic analysis then determines the variation in the electronic system response as well as variation in the module and component system response. This probabilistic analysis also quantitatively assesses the importance of each of the random variables on the variation in the system response. This allows for development of a rational design framework for deciding which variables need to be controlled and how to increase the reliability of the system. The embodiment of the technology incorporating probabilistic analysis, therefore, provides for more accurate predictions of failure. Thus, this embodiment also provides a basis for rational design decisions, while reducing expense and time to market.

In an embodiment, the principal inputs to the simulation of a material are details of the grain structure properties of the material being simulated, and the external conditions the material experiences. Because grain structure orientation is randomly distributed through any macro sized structure, a Monte Carlo simulation is used to give a probabilistic distribution of fatigue failure outcomes over the operating life of the structure. (See, e.g., Tryon, R. G. and T. A. Cruse, "A reliability-based model to predict scatter in fatigue crack nucleation life," *Fatigue & Fracture of Engineering Materials & Structures*, (1998), incorporated herein by reference.) In the case of solder joint interconnects, this process can be applied to all joints in the system, with each joint being appropriately loaded and heated depending on its position in the system.

The reliability of structural elements with complex stress distributions can be predicted by integrating a fatigue simulation model with traditional structural finite element analysis FEA (or TCAD in the case of electronic components). Material libraries (for, e.g., steel, nickel, titanium, lead solder) containing microstructural characterization data (comprising commonly understood quantities such as Modulus, yield strength, and others that are susceptible to routine measurement), and failure mechanism algorithms can be developed by one of ordinary skill in the art. In some instances, the data to input into the library is available from the literature and/or from a manufacturer's product data sheets, or from ASTM. However, for many specialist materials, or newly developed materials such as particular alloys, libraries of data must be independently developed, such as by performing tests on the material and making appropriate measurements. Exemplary libraries are shown in tables in connection with the Examples herein.

Preferred embodiments of the present technology use probabilistic analysis methods to address the effects of the random nature associated with material microstructure, loading, and manufacturing differences, assuming that the underlying physics of the component behavior are deterministic and that the random nature of the component response is attributed to the variability in the input to the component and the parameters defining the failure physics.

Theory of Fatigue

Figure 3A:
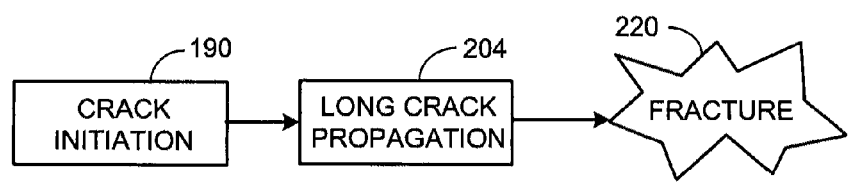
FIGS. 3A, 3B, and 3C illustrates three levels of fatigue damage in a material, and models for the same.

Fatigue life prediction methods applied to electronic components consider three stages, shown in FIG. 3A: crack initiation 190, long crack propagation 204, and finally fracture 220. Long crack propagation and final fracture are stages of damage accumulation that are well characterized using models such as linear elastic or elastic-plastic fracture mechanics (see, e.g., Suresh, S., Fatigue of Materials, Cambridge University Press, Cambridge, UK, (1998)). The early stage of damage accumulation, however, referred to as crack initiation, is characterized by small cracks having dimensions less than several grain diameters. The behavior of early stage cracks has been observed to deviate significantly from predicted long crack fracture mechanics, a fact attributed to the heterogeneous nature of the material at the scale on which small cracks evolve. The crack initiation phase accounts for the majority of scatter in fatigue life for many alloys. A crack can typically be related back to particular grain or defect from which it originated.

Figure 3B:
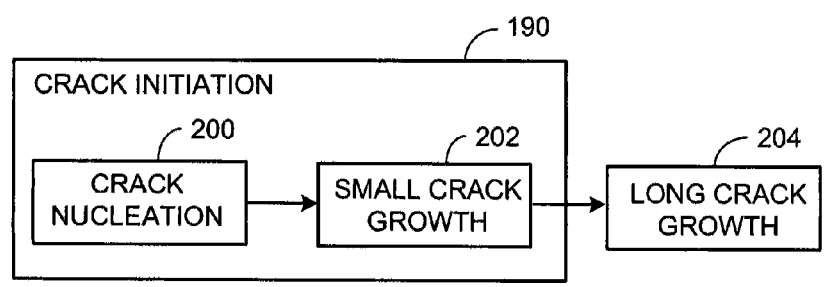

FIG. 3B depicts three levels of fatigue damage prior to fracture that may occur in a typical component. The crack initiation stage 190 contains two phases: crack nucleation 200 and small crack growth 202. First, a crack nucleates 200 on a small scale on the order of the grain size of the material, or less. Thus, crack nucleation is a locally complex crack formation on the microstructural scale. Examples of crack nucleation mechanisms include, but are not limited to, transgranular (matrix) cracking, particle/matrix interface cracking, inclusion induced transgranular cracking, and pore induced cracking, all of which are suitable for deployment in the methods described herein. Then the crack grows as a microscopically small crack 202 in which the crack lies in between (intergranular growth) or across (transgranular growth) relatively few grains. Thus, small crack growth is the process that occurs after, and is similarly complex to, crack nucleation. There are understood to be at least three mechanisms of small crack growth that include, but are not limited to: Opening (mode I), Sliding (mode II), and tearing (mode III), as further described herein. Models of each of these mechanism are suitably deployed with the methods herein. The material properties, averaged along the front of the crack, approach bulk or average material properties as the crack grows and the number of grains intercepted by the crack front increase. When the crack intercepts enough grains, traditional crack growth models such as linear elastic fracture mechanics may be used to study crack growth. But the majority of crack life for electronic components is spent in the nucleation 200 and small crack growth 202 regime. Thus, understanding the early crack growth and behavior is most important for design of electronic systems and prognosis of failure of such systems. One example exhibited by materials having a propensity for planar slip is the smooth fracture at angles inclined to the loading direction caused by cracking along crystallographic plane near 45 degrees to the loading axis.

Figure 3C:
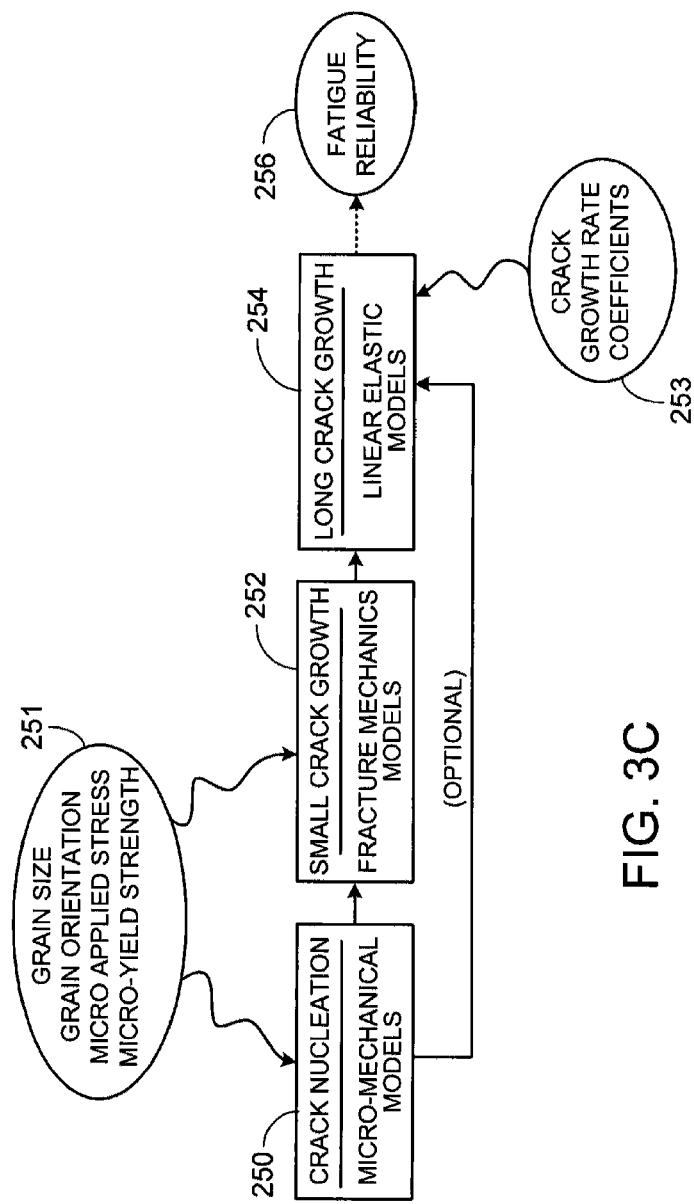

FIG. 3C shows exemplary categories of model for describing the three phases of fatigue damage of FIG. 3B, as used in conjunction with the present technology. A simulation can proceed through as many as all of the three different levels of fatigue damage accumulation, each of which has its separate modeling regimes. Crack nucleation 250 may be described by one of a number of micromechanical models, as further described herein. The crack nucleation model determines the number of cycles to create a crack equal to the grain size. As depicted in FIG. 3C, the output from the crack nucleation model provides the input to a small crack growth model. Small crack growth 252 can be described by one of a number of fracture mechanics models, as further described herein. The small crack growth model determines the number of cycles and the size of a crack for which the long crack growth model is applicable. Finally, long crack growth 254 can be modeled by one of a number of linear elastic models. The long crack growth model determines the number of cycles to exceed a critical crack length or the fracture strength. The ultimate output from a simulation as further described herein, is an estimate of fatigue reliability 256, developed by properly sequencing the damage accumulation models as shown in FIG. 3C.

In each stage of FIG. 3C, models can be used directly as reported in the literature, or with minor adjustments to make them more adaptable to electronic components. It is preferable that the different models are coupled such that, where a particular parameter for a material is used in more than one model, the same value of the parameter is used for each model. However, the material parameters used can be different for each stage of damage growth shown in FIG. 3C. Furthermore, any combination of the damage models can be used, i.e., damage can be predicted starting with a manufacturing defect using the crack nucleation model or damage can be predicted starting from a large crack using only the long crack growth model.

Although FIG. 3C shows that output from micromechanical models of crack nucleation become an input of fracture mechanics models of small crack growth, and similarly that output from fracture mechanics models of small crack growth become an input to a linear elastic model of long crack growth, one of ordinary skill in the art would appreciate that, depending upon the materials and particular circumstances to hand, one or more of the models could be omitted. Thus, for example, one or both of models of crack nucleation, or fracture mechanics, may be omitted. As shown then, in FIG. 3C, output from micromechanical models of crack nucleation may be input directly into linear elastic models of long crack growth, where small crack growth models are omitted.

Additional inputs 251, 253, to the various models are also shown in FIG. 3C. Thus, the two categories of crack initiation models typically require four random variables as input: grain size, grain orientation (i.e., the orientation of crystal lattice axes), local (micro) applied stress, and local (micro-yield) strength. The linear elastic models of long crack growth typically require only one randomized variable, the crack growth rate coefficient. For the case where the material being modeled is solder, as found in electronic components, additional random variables may be required, such as the rate of coarsening of the grains, i.e., grain growth parameters according to one or more phase coarsening models, and the thickness of the intermetallic layers, as further described herein. When crack initiation is defined in two or more stages, such as nucleation and short crack growth, if the two stages are governed by some of the same variables then the values of those variables must be consistent with one another, i.e., correlated. Use of variables correlated in this manner is desirable because it reduces effort in determining input data and also assists with tying together the various models.

The simulation of material fatigue, for example as performed on a computer, can be set up using predefined libraries with the proper material properties, failure mechanism models, and appropriate modeling linkages to predict the scatter in fatigue life.

For the majority of structural materials, most of the crack life is spent in either nucleation or small crack growth regimes. The simulation of this early crack behavior is therefore important to prediction of fatigue, yet has typically not been considered by other researchers when modeling fatigue mechanisms. The methodology described herein takes specific account of these regimes by modeling the grain size, grain orientation, micro-applied stress and micro-yield strength. Crack nucleation and small crack growth models incorporate this randomness using Monte Carlo probabilistic techniques. Given that there is much less overall scatter in the time spent in long crack growth than in crack initiation stages, the models for describing long crack growth are usually more robust than the models that describe crack initiation and, accordingly, randomness can be incorporated into long crack growth models by simply allowing the crack growth rate coefficient to vary.

Representative fatigue damage accumulation mechanisms and associated models suitable for use with the methods described herein are as follows.

Crack Nucleation Models

Models of fatigue crack nucleation include transgranular (Matrix) cracking, particle/matrix interface cracking, inclusion induced transgranular cracking, and pore induced cracking.

Transgranular (matrix) cracking models are crack nucleation models based on cracking due to the build up of dislocation density and can be incorporated into a probabilistic fatigue algorithm. One such model is proposed by Tanaka and Mura (Tanaka, K., Mura, T. (1981) "A Dislocation Model for Fatigue Crack Initiation", *ASME J. Appl. Mech.*, Vol. 48, pp. 97-103, incorporated herein by reference) and modified herein for transgranular nucleation. This model was extended to account for grain orientation as $$W_S = \sum_{n=1}^{j} \frac{\pi d}{4G} \left( \frac{1}{M_S} \Delta\sigma - 2k \right)^2 (1-\nu) \quad (1)$$

where $W_S$ is the accumulated fracture energy per unit area in a grains of size d after j cycles of fatigue loading, G is the shear modulus, $\sigma$ is the local applied stress, $M_S$ is the grain orientation factor (reciprocal Schmid factor), k is the frictional stress which must be overcome to move dislocations, $\nu$ is Poisson's ratio, and d is the grain diameter. The grain cracks when $W_S > W_T$ where $W_T$ is the specific fracture energy per unit area. (Due to the random nature of the microstructure, the applied stress state is tri-axial even for uni-axial globally applied stress. Therefore $\sigma$ and $M_S$ are the tri-axial vectors of the stress and orientation.)

To model particle/matrix interface cracking, Tanaka and Mura (*ASME J. Appl. Mech.*, Vol. 48, pp. 97-103, (1981)) proposed models for fatigue cracks initiating along the interface between inclusion (particle) and the matrix, crack initiation from pores, and slip bands emanating from inclusions. One of their models has been modified herein for crack initiating along the inclusion-matrix interface, as follows:

$$W_I = \sum_{n=1}^{j} \frac{aG'}{G(G+G')} \left( \frac{1}{M_S} \Delta\sigma - 2k \right)^2 \quad (2)$$

where $W_I$ is the accumulated fracture energy per unit area of the interface after j cycles of fatigue loading, G' is shear modulus of inclusion, G is a shear modulus as in equation (1), and a is inclusion size.

Inclusion induced transgranular cracking in the case of fatigue crack initiation at slip bands emanating from inclusions, can be modeled as follows:

$$W_{IS} = \sum_{n=1}^{j} \frac{1}{4l} \left[ \begin{array}{c} \frac{\pi \beta \Delta\sigma^2 a^2}{G}\left(1 - \frac{a}{\sqrt{l^2+a^2}}\right) + \\ \frac{\pi(\Delta\sigma - 2k)}{2G}\left\{\beta\Delta\sigma l^2 + 2\Delta\sigma a^2\left[1 - \frac{a(3l^2+2a^2)}{2(l^2+a^2)^{3/2}}\right]\right\} + \\ \frac{\pi \Delta\sigma^2 a^5}{G}\left[\frac{\frac{4a^4+2a^2l^2+l^4}{4a^3\sqrt{l^2+a^2}}-1}{(l^2+a^2)^{3/2}}\right] \end{array} \right] \quad (3)$$

where $W_{IS}$ is the accumulated fracture energy per unit area after j cycles of fatigue loading, 2l is the grain size, and $$\beta = 1 - \frac{2k}{\Delta\sigma} + \frac{a^3}{(a^2+l^2)^{3/2}}. \quad (4)$$

Pore induced cracking, for modeling fatigue crack initiation from pores, can be modeled as follows:

$$W_{PS} = \sum_{n=1}^{j} \frac{\Delta U}{4l} \quad (5)$$

where $W_{PS}$ is the accumulated fracture energy per unit area after j cycles of fatigue loading, and $\Delta U$ is the self energy of dislocations accumulated per half cycle, given as, $$\Delta U = \frac{\Delta\sigma(\Delta\gamma^T - \Delta\gamma^N)}{2} - k\Delta\gamma^L \quad (6)$$

$$\Delta\gamma^T = \frac{a+b}{a} \frac{\beta\Delta\sigma}{2A}\left[c^2 + \frac{b(c^2-a^2)^{1/2}}{a}\right] + \quad (7)$$

$$\frac{2ka(c^2-a^2)^{1/2}}{\pi A} + \frac{4kb}{\pi A}\left[(c^2-a^2)^{1/2} - al\right] + \frac{2abk}{A}$$

$$\Delta\gamma^N = \frac{(a+b)a\Delta\sigma}{2A} \quad (8)$$

$$\Delta\gamma^L = \frac{a+b}{a} \frac{\beta\Delta\sigma}{\pi A}\left[c^2 \cos^{-1}\left(\frac{a}{c}\right) - a(c^2-a^2)^{1/2} + \frac{\pi b}{2a}(c^2-a^2)\right] + \quad (9)$$

$$\frac{4ka}{\pi^2 A}\left[(c^2-a^2)^{1/2}\cos^{-1}\left(\frac{a}{c}\right) + 2a\ln\left(\frac{a}{c}\right)\right] + \frac{4kb}{\pi A}\left[(c^2-a^2)^{1/2} - al\right]$$

$$I = \frac{1}{\pi a^2}\int_a^c \frac{\xi^2}{(\xi^2-a^2)^{1/2}} \ln\left|\frac{\xi(c^2-a^2)^{1/2}+a(c^2-\xi^2)^{1/2}}{\xi(c^2-a^2)^{1/2}-a(c^2-\xi^2)^{1/2}}\right| d\xi \quad (10)$$

$$\beta = -1 - \frac{b}{a+b} + \frac{2k}{\Delta\sigma} - \frac{a}{a+b}\frac{4k}{\pi\Delta\sigma}\cos^{-1}\left(\frac{a}{c}\right) \quad (11)$$

$$A = \frac{G}{2\pi} \quad (12)$$

a and b are the semi-major and minor axes of the pore, c is the distance between the crack initiating site and slip-band tip, $\Delta\gamma^T$ is the relative displacement due to the pore, and the slip band. $\Delta\gamma^N$ is the relative displacement of pore when no slip bands exist. $\Delta\gamma^L$ is the relative displacement due to the dislocation increment in the slip bands. The first term in square brackets in equation (7) is as reported in the literature. Alternative implementations of this term use a factor a instead of b/a.

Small Crack Growth Models

Models of small crack growth include models of opening (mode I), sliding (mode II), and tearing (mode III).

In one embodiment, a small crack growth model is based on a model developed for metallic microstructures. An experimentally observable parameter that has been correlated to the varying small crack growth rate is the crack tip opening displacement (CTOD).

$$\frac{da}{dN} = C'(\Delta CTOD)^{n'} \quad (13)$$

where a is the crack length, N is the number of cycles, C' and n' are empirical constants based on material testing. The CTOD is a measure of the amount of damage associated with the crack tip.

CTOD is commonly divided into three types of opening (along each of the three local orthogonal axes). Mode I is the opening mode in which the crack opens (and closes) perpendicular to the direction of crack growth, and perpendicular to the crack growth plane. Mode II is the sliding mode in which the crack slides back and forth parallel to the direction of crack growth and parallel to the crack growth plane. Mode III is the tearing mode in which the crack slides back and forth perpendicular to the direction of crack growth, and parallel to the crack growth plane. Small crack growth is generally dominated by Mode II when the small crack is very small (one to two grain sized in depth) and transitions to Mode I as the small crack becomes larger. Of course there are many exceptions to this generality.

Sliding small crack growth (Mode II) can be modeled by a dislocation theory model based on Taira et al. (Taira, S., Tanaka, K., Nakai, Y., "A Model of Crack Tip Slip Band Blocked by Grain Boundary," *Mech. Res. Comm.*, Vol. 5, No. 6, pp. 375-381 (1978)), and modified herein, to predict the CTOD based on the microstructure surrounding the crack tip. In this model, the CTOD $\phi_t$ is given by:

$$\phi_t = \frac{2k_j a}{\pi^2 A}\ln\frac{c}{a} + \sum_{i=j+1}^{n}\frac{(\tau_{i-1}-k_{i-1})-(\tau_i-k_i)}{\pi^2 A}g(a;c,L_{i-1}) \quad (14)$$

$$A = \begin{cases} G/2\pi(1-v) & \text{for edge dislocations} \\ G/2\pi & \text{for screw dislocations} \end{cases}$$

$$g(a;c,L) = L\ln\left|\frac{\sqrt{c^2-L^2}+\sqrt{c^2-a^2}}{\sqrt{c^2-L^2}-\sqrt{c^2-a^2}}\right| - a\ln\left|\frac{a\sqrt{c^2-L^2}+L\sqrt{c^2-a^2}}{a\sqrt{c^2-L^2}-L\sqrt{c^2-a^2}}\right|$$

where $\tau$ is the resolved applied shear stress of the $i^{th}$ grain, G is the shear modulus, $v$ is Poisson's ratio, a is the crack depth, c is the crack depth plus the slip band depth, L is the depth to the $i^{th}$ grain boundary, and k is the friction stress (which must be overcome to move dislocations) of the grain in which the crack tip and slip band lie. This model is used in a simulation routine to predict the COD as the crack grows through the microstructure.

A solution for opening small crack growth (Mode I) loading is easily obtained by the above equations by substituting the shear stress $\tau$ with the normal stress $\sigma$.

For models of small crack growth in electronic components, it is typically not necessary to include specific models of mode III. However, in circumstances where it is proved important, it may employ models known in the art, such as that described in Feng, M. L., Ding, F., Jiang, Y. Y., "A study of loading path influence on fatigue crack growth under combined loading" *International Journal of Fatigue*, Vol.: 28, Issue: 1, January 2006. pp. 19-27, incorporated herein by reference in its entirety.

Long Crack Growth Models

Models of long crack growth include models of growth rate using linear elastic (or elastic plastic) fracture mechanics. In certain embodiments, the microstructural variations are not explicitly considered and all variation in long crack growth is modeled by allowing the fracture mechanics coefficients to be random variables.

In some embodiments, only the Paris law is used to model long crack growth. Three other long crack growth algorithms—for example as used within the aerospace industry—can be used with the methods described herein, as further described in the following.

The Paris law represents a surface crack in a semi-infinite body subjected to a constant stress cycle as (see, e.g., Paris, P. C., Gomez, M. P. and Anderson, W. P. (1961), "A rational theory of fatigue," *The Trend in Engineering*, Vol. 13, pp. 9-14; Paris, P. C. and Erdogan, F. (1963). "A critical analysis of crack propagation laws," *Journal of Basic Engineering*, Vol. 85, pp.528-534):

$$\frac{da}{dN} = C\Delta K^n \quad (15)$$

where a is the crack length, N is the number of cycles, C and n are material properties and $$\Delta K = \beta(\sigma_{max}-\sigma_{min})\sqrt{a} = \beta\Delta\sigma\sqrt{a} \quad (16)$$

where $\sigma_{max}$ and $\sigma_{min}$ are the maximum and minimum values of the stress cycle and $\beta$ is a crack geometry constant ($1.12\sqrt{\pi}$ for a semicircular surface crack in an infinite half plane).

To account for material uncertainty in crack growth rates, C is considered a random variable in the probabilistic microstructural fatigue models.

The Paris law model does not explicitly account for the mean stress effect (stress ratios, R). For the same value of $\Delta K$, the crack growth rate is a function of stress ratios. Therefore, to account for mean stress effect, C and n in Eq. (15) must be functions of stress ratios. Accordingly, three exemplary models that can be deployed are as follows.

Nella et al., (Nella, R. K., Boyce, B. L., Campbell, J. P., Peters, J. O., Ritchie, R. O., "Influence of the microstructure on HCF of Ti-6Al-4V," *Metallurgical and Materials Transactions A*, Vol. 33A, pp. 899-918, (2002)) suggest a variation on the Paris law for a unified stress ratios model such that:

$$\frac{da}{dN} = C_r\Delta K^{n1} K_{max}^{n2} \quad (17)$$

where $C_r$, n1 and n2 are material properties and $$K_{max} = \beta\sigma_{max}\sqrt{a} \quad (18)$$

The material parameters $C_r$, n1 and n2 are determined using a best fit to the data for all stress ratios. Equation (16)

accounts for the mean stress effect by explicitly defining the stress range $\Delta\sigma$ and the maximum stress $\Delta\sigma_{max}$. To account for material uncertainty in crack growth rates, $C_r$ is considered a random variable in the probabilistic microstructural fatigue software.

Another long crack growth model is a variation on the hyperbolic sine law (deLaneuville, R. E., and Heath, B. J., "Fracture Mechanics Life Prediction System Using Crack Closure methodology", AIAA-86-2094, AIAA/SAE/ASME/ASEE 23$^{rd}$ Joint Propulsion Conference, San Diego, Calif., (1986)). The hyperbolic sine law states that:

$$\frac{da}{dN} = \exp(C_1 \sinh[C_2 \log \Delta K + C_3] + C_4) \quad (19)$$

where $C_n$ are material parameters.

Another long crack growth is a variation on the Walker model (see, e.g., Walker, K. (1970), "Effect of Stress Ratio during Crack Propagation and Fatigue for 2024-T3 and 7075-T6 Aluminum," in *Effects of Environment and Complex Load History on Fatigue Life*, ASTM, Philadelphia, Pa., pp.1-14) for stress ratios effects such that:

$$da = e^b \left(\frac{K_{eff}}{K_{th}}\right)^p \left(\ln\left[\frac{K_{eff}}{K_{th}}\right]\right)^q \left(\ln\left[\frac{K_c}{K_{eff}}\right]\right)^d dN \quad (20)$$

where $K_{th}$, b, p, q, d and $K_c$ are material constants and $$K_{eff} = (1-R)^m K_{max} \quad (21)$$

where m is determined using a best fit to the data.

By contrast to the methods used herein, crack initiation models prevalent in the art, such as Coffin-Manson (see, e.g., Coffin, L. F., "A study of the Effects of Cyclic Thermal Stresses on a Ductile Metal," *Transactions of the ASME*, Vol. 76, pp. 931-950, (1954), and Manson, S. S., "Behavior of Materials under Conditions of Thermal Stress," NACA Report 1170, Lewis Flight Propulsion Laboratory, Cleveland, (1954), incorporated herein by reference), are based on empirical testing, causing crack initiation models to be simple parametric functions of applied stress variables, independent of any underlying mechanism. As such, these macrostructural models assume a homogeneous, continuous material. Empirical fatigue life models such as Coffin-Manson use statistical concepts, where the independent variable, usually applied global stress or strain, is considered deterministic, and the dependent variable, usually life, is considered random. Typically a database of input data for the model is constructed, based on running different tests at different loads, etc. But these models do not account for the mechanisms of the microstructural parameters that regulate the early stages of fatigue damage (i.e., microstructural crack initiation, which includes both crack nucleation and small crack growth). Since these models do not include this major source of scatter, they are necessarily unsatisfactory because they cannot represent the heterogeneous material in which the damage processes occur.

Because traditional crack initiation models such as the Coffin-Manson model are empirical, they cannot represent conditions not included in the database that is established to fit the test program, such as sequential variation. Sequential variation is due to a component's use in many different scenarios. For example, an automobile is driven differently during each trip, and an unlimited number of sequential variations would have to be considered to represent the true operating characteristics of electronics systems within an automobile. While current long crack growth propagation models can account for sequential variation in the component usage, it is impractical from a time and cost standpoint to include sequential variations in the applied stress under most test programs. To ensure reliability, therefore, crack initiation tests are generally conducted at a maximum, i.e., "worst case", stress. Thus components are generally systematically over-designed assuming unlikely worst-case material properties to compensate for the lack of true understanding of fatigue behavior of the materials. Additionally, the traditional models are unsatisfactory for predicting individual component failure because the vast majority of components by definition do not possess the unlikely worst-case material properties. Predictions made using such models are based upon the worst-case material properties and are thus inaccurate.

Creep Models

In addition to fatigue based models of failure, methods herein may consider creep-based or time-dependent models of failure, in a manner analogous to the way in which fatigue-based models are used. Creep models are also based principally on models of: transgranular crack nucleation, intergranular crack nucleation, and intergranular short crack growth. Time-dependent models of failure prove particularly important when modeling fatigue in electronic components because of the changes in material microstructure that occur over time, regardless of use. This is because at normal operating conditions—even in ambient temperatures—are close enough to the materials' natural reaction points, that changes occur at a noticeable rate.

Transgranular Crack Nucleation Models include a model proposed by Tanaka and Mura (Tanaka, K. and Mura, T. (1981). "A Dislocation Model for Fatigue Crack Initiation," ASME *Journal of Applied Mechanics*, Vol. 48, pp. 97-103) for fatigue damage without dwell. This relation can be modified to obtain a physics-based damage model at high temperatures for creep-fatigue conditions. The total energy $\Delta U_{pl-cr}$ due to cyclic plasticity and the additional term due to creep is:

$$\Delta U_{pl-cr} = \frac{(\Delta\tau - 2k)^2 d^2}{8A} + \frac{(\tau_{max} - \tau_r)^2 d^2}{16A} \quad (22)$$

where $\Delta\tau$ is the applied stress range, $\tau_{max}$ is the maximum applied stress, $\tau_r$ is relaxed creep stress, A is a material parameter, and k is the local yield stress for a grain with diameter d. From this relationship, the nucleation life is:

$$N_n = \frac{4GW_s}{\left\{(\Delta\tau - 2k)^2 + \frac{(\tau_{max} - \tau_r)^2}{2}\right\} \pi (1-\nu) d} \quad (23)$$

where G is the shear modulus of the material, and $W_s$ is the material-specific fracture energy.

Intergranular crack nucleation, in the creep framework, is modeled as follows. When both creep and fatigue mechanisms are active at grain boundaries, nucleation life becomes a function of both creep and fatigue damage. For a critical value of $W_c$ for creep damage, assuming first that a linear damage summation rule is valid, and second that the hysteresis loop is stable, resulting in uniform damage over different cycles, the cycles to initiation N is given as (Skelton, R. P., (2003). "Creep-Fatigue Interations (Crack Initiation)," in *Comprehensive Structural Integrity*, Vol. 5, Ed. A. Saxena, Elsevier, Oxford, UK):

$$N = \frac{1}{\left\{\frac{w_f}{W_f} + \frac{w_c}{W_c}\right\}} \quad (24)$$

where $w_c$ is the creep work done per cycle, $w_f$ is the fatigue work expended per cycle and $W_f$ is the critical value for fatigue damage.

Intergranular short crack growth, in the creep framework, is modeled as follows. The HRR-type solution (Hutchinson, J. W. (1968), "Singular behavior at the end of a tensile crack in a hardening material," *Journal of Mechanics and Physics of Solids*, Vol. 16, pp. 13-31; Rice, J. R. and Rosengren, G. F., (1968), "Plane strain deformation near a crack tip in a power-law hardening material," *Journal of Mechanics and Physics of Solids*, Vol. 16, pp. 1-12, both of which are incorporated herein by reference) for the stress field in a creep zone for an elastic power-law creeping material is given in terms of the parameter C(t) as (Riedel, H. and Rice, J. R. (1980) "Tensile Cracks in Creeping Solids," *Fracture Mechanics*, ASTM STP-700, ASTM, Philadelphia, Pa., pp. 112-30, incorporated herein by reference):

$$\sigma_{ij} = \left(\frac{C(t)}{I_n A r}\right)^{1/(n+1)} \tilde{\sigma}_{ij}(\theta) \quad (25)$$

where $I_n$ is an integration constant, $\tilde{\sigma}_{ij}(\theta)$ is the orientation tensor whose component values are tabulated elsewhere (see Shih, C. F. (1983) "Tables of Hutchinson-Rice-Rosengren Singular Field Quantities," Report MRL E-147, Materials Research Laboratory, Brown University, Providence, R.I., incorporated herein by reference), while A and n are material parameters from the creep constitutive law. An interpolation for C(t) (Ehlers, R., and Riedel, H., "A Finite Element Analysis of Creep Deformation in a Specimen Containing a Macroscopic Crack," *Advances in Fracture Research*: Proceedings of the Fifth International Conference of Fracture: ICF-5, Pergamon Press, pp. 691 (1981), incorporated herein by reference) during transition from SSC to extensive secondary creep is given as:

$$C(t) = [1 + t_T/t]C^* \quad (26)$$

where $t_T$ is the transition time. The C* parameter for a plane strain problem can be evaluated by the formula (Li, F. Z., Needleman, A., and Shih, C. F., (1988) "Characterization of near tip stress and deformation fields in creeping solids," *International Journal of Fracture*, 36(3), pp. 163-186):

$$C^* = \dot{\varepsilon}_0 \sigma_0 a \pi \sqrt{n} \left[\frac{\sqrt{3}}{2} \frac{\sigma^\infty}{\sigma_0}\right]^{n+1} \quad (27)$$

where $\dot{\varepsilon}_0$ and $\sigma_0$ are the reference strain rate and stress respectively, $\sigma^\infty$ is the far field applied stress and a is the crack length.

Figure 4:
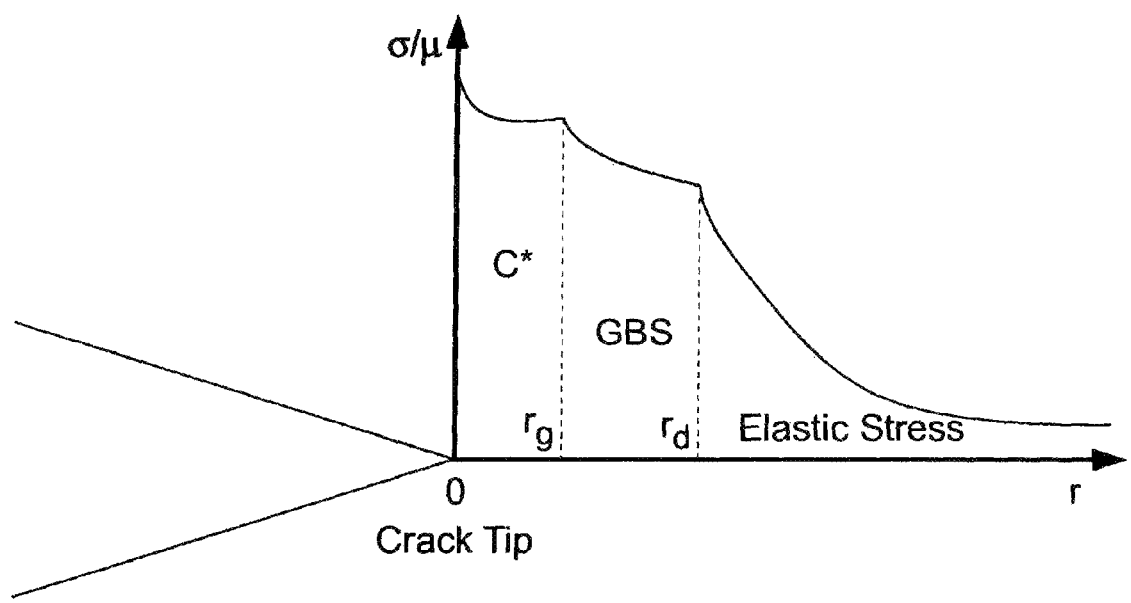
FIG. 4: stress distribution ahead of the crack tip in the three zones.

The stress zones ahead of a crack tip are shown in FIG. 4. The zone closest to the crack tip is the intragranular slip region where the constitutive relation is controlled by the C* parameter. The next zone is the region controlled by grain boundary sliding mechanism and the last region is the elastic stress region. The division of the microstructure into stress zones is motivated by Ashby fracture mechanism maps where different mechanisms operate at high temperatures for different stresses.

Once the local stress field is obtained, the grain boundary sliding (GBS) strain rate is given in terms of the local shear stresses as (Wu, X.-J. and Koul, A. K. (1995) "Grain Boundary Sliding in the Presence of Grain boundary Precipitates during Transient Creep," *Metallurgical and Materials Transactions A*, 26A, pp. 905-914):

$$\dot{\varepsilon}_{gbs} = B\sigma_{eff}^2 = B(\sigma - \sigma_{threshold})^2. \quad (28)$$

The average crack growth rate is then given in terms of the grain boundary size, defect spacing, and damage zone size as (Xu, S., Wu, X.-J., Koul, A. K. and Dickson, J. I., (1999). *Metallurgical and Materials Transactions A*, 30A, pp. 1039-1045):

$$\frac{da}{dt} = \left(\frac{d}{\lambda}\right) L \dot{\varepsilon}_{gbs}. \quad (29)$$

Phase Coarsening Model

As referenced hereinabove, for materials such as solder that are relevant to the modeling of electronic components, additional models may be deployed. One such model is a phase coarsening model, as follows. Phase coarsening is a process by which grains naturally tend to increase in size over time, as (in the case of a eutectic alloy) different elements migrate towards one another in an effort to attain a lower energy state. For example the tendency is towards reaching grains that have either lead or tin in them, but not both. Usually, geometric constraints deny the possibility that the material will simply separate into two large grains, each having elemental purity.

Upadhyayula (Upadhyayula, K., S., "An incremental damage superposition approach for surface mount electronic interconnect durability under combined temperature and vibration environments," Ph.D. Thesis, University of Maryland, (1999), incorporated herein by reference) modified the Senkov-Myshlyaev coarsening model (S-M model) known to those of ordinary skill in the art, which accounts for only bulk volumetric diffusion, to also account for the effects of stress. The underlying S-M model is suitable for the applications herein because it has a sound theoretical basis and has been verified extensively by experimental studies described elsewhere. In particular, its applicability to eutectic solders has been verified by experiment.

The modified S-M model is given by the equation:

$$d^3(t) - d_0^3(t) = \frac{c_1 t}{T} \exp\left(-\frac{\Delta H_g}{RT}\right)\left[1 + \left(\frac{\Delta \tau}{C_2}\right)^{n_c}\right] \quad (30)$$

Where d is the mean phase diameter at time t; $d_0$ is the reference grain size (initial t=0); $c_1$ is a kinetic factor that depends on matrix composition; $\Delta H_g$ is the activation energy for volume diffusion of atoms; R is the universal gas constant; T is the absolute temperature; t is the time in hours; $\Delta \tau$ is the applied stress range; $C_2$ is the reference stress; $n_c$ is the stress exponent. The values for the various parameters used in the model are listed in Table 1.

TABLE 1

Coarsening model parameters (Upadhyayula, Ph.D. Thesis, 1999)

| MODEL PARAMETER | VALUE |
|---|---|
| $\Delta H_g$ (Activation energy for volume diffusion) | 94 kJ/mol. |
| R (Universal gas constant) | 8.314 J/mol. K |
| $c_1$ (Kinematic factor depending on matrix composition) | 4.2e+15 µm³ K/hour |

TABLE 1-continued

Coarsening model parameters (Upadhyayula, Ph.D. Thesis, 1999)

| MODEL PARAMETER | VALUE |
|---|---|
| $n_c$ (Stress exponent) | 1 |
| $C_2$ (Reference stress) | 64.52 MPa |

The assumptions in the analysis and the methodology used to obtain the parameters in the above equations is as follows.

The stress exponent $n_c$ is assumed to be 1.0. The basis for this assumption is that a linear relation exists between time dependent creep deformation and stress, when bulk diffusion is the primary driving force for phase coarsening.

Experimental data from Hacke et al., (Hacke, P., L., Fahmy, Y. and Conrad, H., 'Phase coarsening and crack growth rate during thermo-mechanical cycling of 63Sn37Pb solder joints,' *Journal of Electronic Materials*, Vol. 27, No. 8, pp. 941, (1998)) was used to estimate the value of $c_1$. The change in grain size under isothermal conditions is plotted against aging time. The slope of the line fitted to this data provides the value of $c_1$. The data being isothermal causes the reference stress $c_2$ to be set to 0.

The value of $c_2$ is also estimated from experimental data from Hacke et al. The phase coarsening at a given temperature (85° C.) is plotted against stress range for known aging times. The slope of the line fitted to this data provides the value of $c_2$.

This model has been selected due to its advantages, which include: it accounts for stress, and therefore can be used to model shelf dwell (the time that a component is stored without being used) when only the residual stress at room temperature drives coarsening; its computational implementation is efficient and all the constants have been provided; the methodology used to obtain the model constants has been laid out clearly, therefore new model parameters can be obtained from applicable experimental data; the method has been specifically applied to model coarsening in eutectic solders with satisfactory results; and the model satisfies a range of operating conditions, and is therefore widely applicable.

However the model has several shortcomings, including: the parameters have been found at 85° C. based on published experimental data and, accordingly, their applicability at other temperatures may be subject to further evaluation; the assumption that the stress exponent is 1 provides satisfactory results under the operating conditions used in the experiments, but whether the same conditions prevail at shelf dwell may warrant further investigation; and the saturated grain size (maximum grain size that the lead phase can coarsen) is assumed to be 40 µm, which although reasonable and consistent with data in literature, may be subject to variation under other conditions.

Figure 5A:
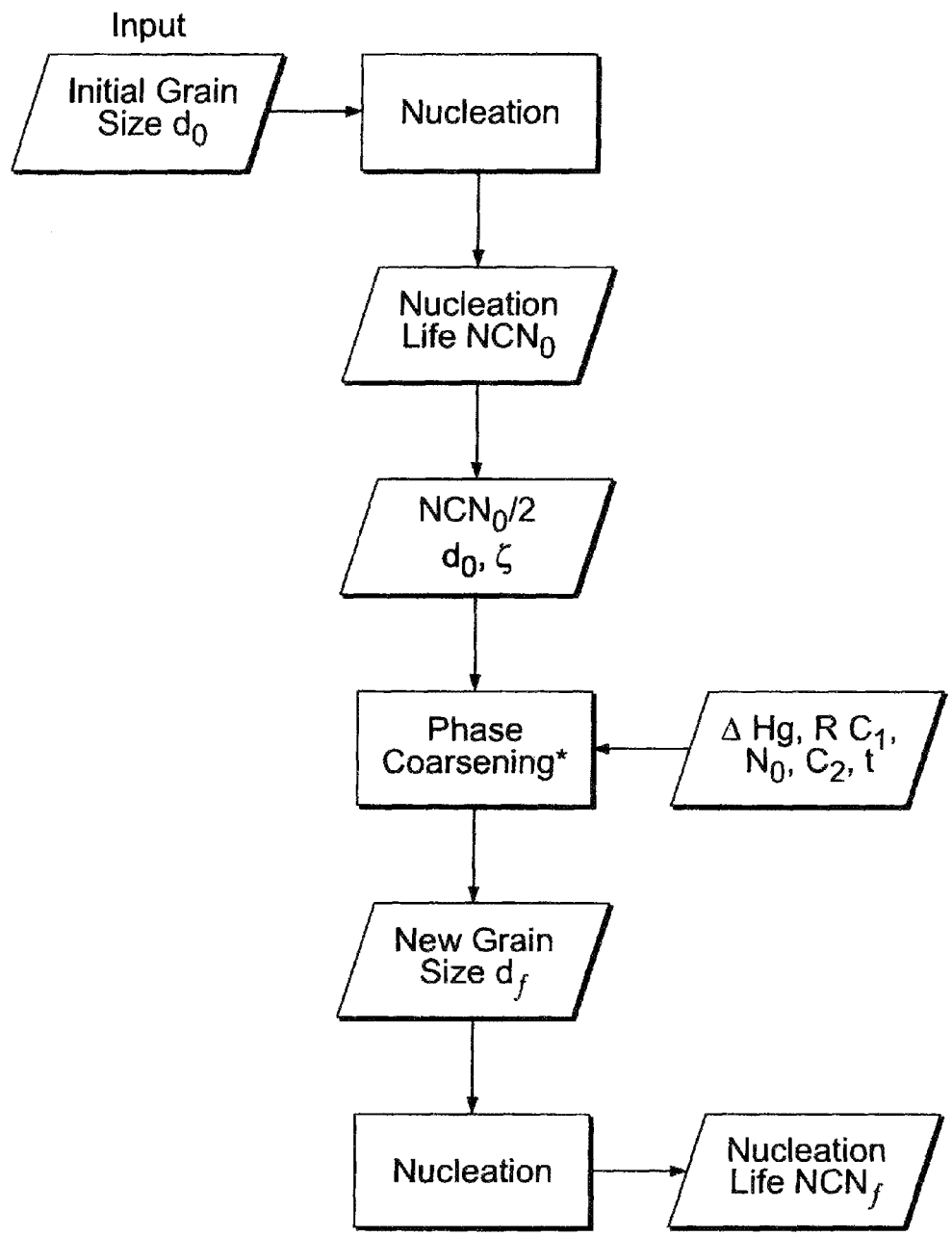
FIG. 5A: phase coarsening in nucleation regime.
Figure 5B:
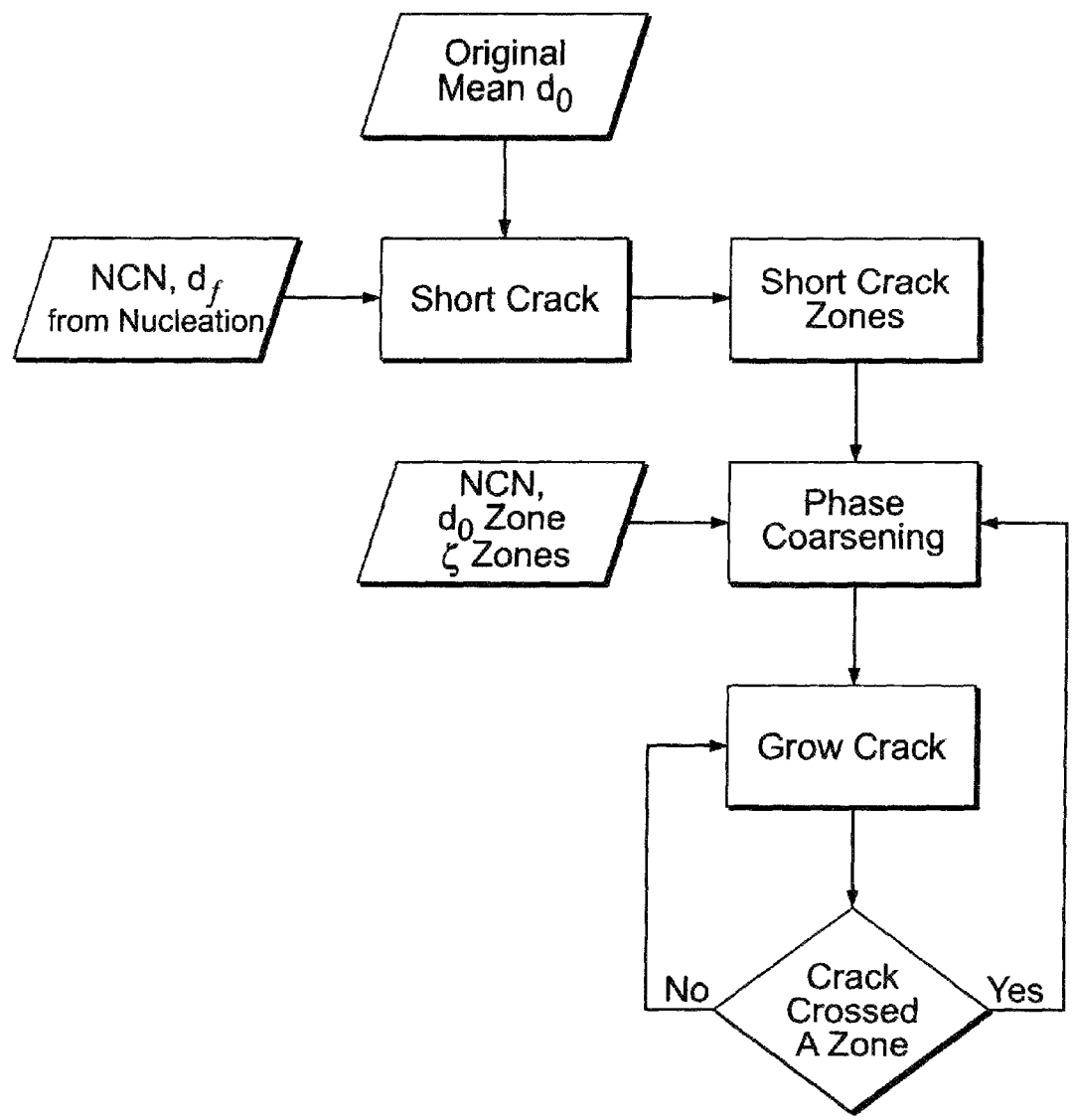
FIG. 5B: phase coarsening in short crack regime.

An implementation of the phase coarsening model into the physics of failure models described herein is depicted in the flow-charts in FIG. 5A and FIG. 5B for the nucleation and short crack growth regimes. It has been tested for various cases and found to provide both good computational efficiency and accuracy in modeling the phase coarsening phenomenon.

In FIG. 5A, an exemplary application of phase coarsening to crack nucleation is described. The input is an initial grain size $d_0$, which in the first instance is used to carry out a simulation in the absence of phase coarsening to obtain a time to crack nucleation (given by $NCN_0$, a number of cycles to nucleation). This time is halved (to give $NCN_0/2$, a notional 'half-life') and the simulation rerun with a contribution from a phase coarsening model using input values for the variables, as described hereinabove. This calculation gives a new grain size $d_f$, at which crack nucleation occurs, in a lifetime $NCN_f$, which takes into account phase coarsening. In other alternative embodiments, this procedure may be repeated more than once, and iterated. Thus, phase coarsening and crack nucleation are not independent of one another, but simple models like the one herein described, in which their effects are modeled consecutively instead of concurrently can still be useful.

In FIG. 5B, is shown a protocol for modeling the combined effects of phase coarsening on short crack growth. This process is iterative. The initial crack size is chosen to be the grain size from a previous calculation of crack nucleation, for example, $d_f$. This data is input into a short crack model in connection with a model of microstructure zones (as further described in U.S. Pat. No. 7,016,825 at FIG. 8, and cols. 14-15, as incorporated herein by reference). The crack is now grown according to a short crack growth model—e.g., as further described herein—initially for the same number of cycles as obtained for the crack nucleation lifetime, and until the crack crosses a zone. Then a phase coarsening model is applied and the crack growth algorithm is run again for as long as it takes to cross a zone plus the number of cycles to crack nucleation. The time employed at each iteration is extended in this fashion until the crack reaches the limit of the short crack growth threshold.

Thus, in coarsening models, the microstructures in the representative volume elements vary—through coarsening—with time.

In one embodiment, the following approximations can be made to improve the model's efficiency, but these approximations can be modified if the phase coarsening is rapid. In the nucleation regime, crack coarsening is implemented through a very approximate mid-point rule, wherein it is assumed that the coarsening occurs only over half the nucleation life based on the initial grain size. A cycle by cycle model (wherein a solution is recalculated for each cycle, and the model is updated after each calculation) may affect the computational efficiency of the nucleation algorithm. For a cycle-by-cycle model, FPM cannot be used; instead, simulation techniques must be used.

In the short crack zone, the original mean grain size is used to generate the microstructure, the zones are then coarsened based on the nucleation life, and subsequent coarsening happens only when the crack crosses a zone. The zones ahead of the crack are coarsened based on the average stress on each zone and the total life (short crack life+nucleation life) of the crack at that instant. By short crack zone is meant the distance in microstructure over which a crack is considered short; i.e., the physical distance between nucleation and the size of a long-crack. For example, the nucleation size for transgranular nucleation is the size of the grain; for pores, it is the size of the pore; for defects it is the size of the particular class of defect. Typically the upper limit of the short crack zone is about 10 grain sizes, taking into account the fact that grain size varies significantly across materials, and samples of material.

Material Microstructure

The technology described herein is based on a 3-D computer model of component, and uses prototypical loads and material properties, to predict when component will fail. In that sense, the technology can be described as a virtual prototyping technique, where non-virtual means doing a physical test. The technology relies on computer simulation of real material behavior to predict when an electronic component will fail due to fatigue. The fatigue life of a component is recognized to be a characteristic property of the material from which the component is composed. A component is made up of an ensemble of discrete microscopic structural elements of a material such as grains, colonies, and nodules. Many different materials, e.g., metals, intermetallics, ceramics, and some plastics, are composed of such discrete microscopic structural elements. The methods of the instant technology are aimed at predicting the variation in fatigue life of a component based on the statistical variation of the microscopic structure of the material. Material parameters at metallic grain level are used along with based on models of the fundamental physical mechanisms of fatigue to predict component damage as it accumulates from the nucleation of cracks, through small crack growth and long crack growth, to final failure.

The computer models simulate many identical instances of the components (that may be, for example, identical in geometry and composition only) but uses a different sample of material microstructure for each simulation. The microscopic structure of each simulated material model or "realization" for each component is properly sampled from the known or specified range of material microstructures. Each of the instances is then virtually tested using computer simulation to simulate real-world conditions of usage. The virtual testing allows data to be produced quickly on thousands or even millions of instances of the component. This virtual testing addresses variations in the microscopic substructure by modeling the grain size, grain orientation, micro-applied stress and micro-yield strength as random. These parameters are then used in modeling crack nucleation and small crack growth. All of the variation in the long crack growth is simulated by the variability in crack growth rate coefficient.

Method of Predicting Failure of a Component

Figure 6:
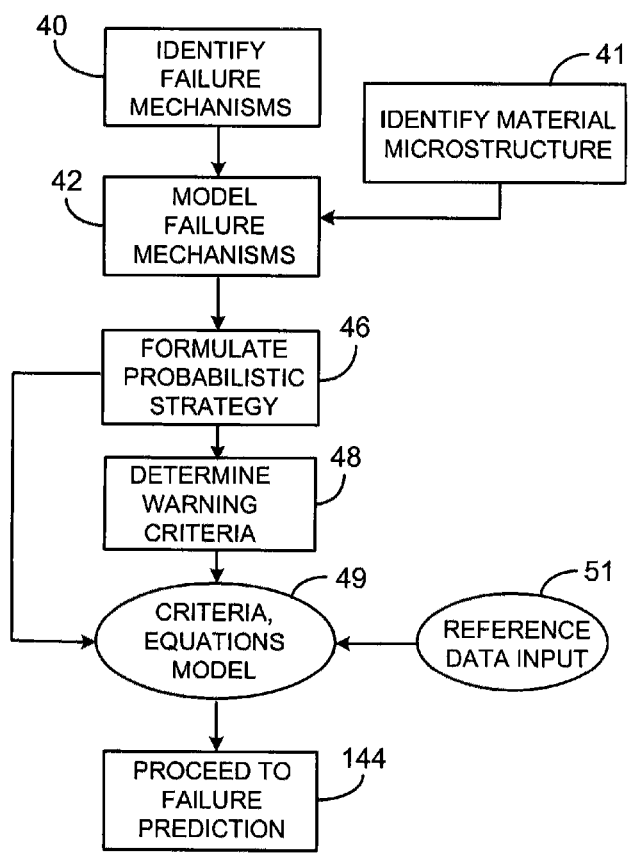
FIGS. 6-14 illustrate an embodiment of a method further described herein.

FIGS. 6, and 7-14 are flow charts depicting operation of a method for failure prediction of an electronic component. FIG. 6 shows the method in overview: at 40, one or more failure mechanisms is identified. At 41, which may be carried out in parallel with step 40, the microstructure characteristics of the material(s) in question are identified. At step 42, one or more models for the failure mechanisms is identified and chosen, based on the failure mechanisms identified in step 40, and material microstructure information obtained from step 41. A probabilistic strategy 46 for each of the models is formulated, followed by—particularly for the case where a particular instance of a product is being directly monitored—determining one or more warning criteria 48. The process in FIG. 6 results in creation of criteria, equations, models 49, into which reference data 51 (such as material properties obtained from the literature and not sensed directly from the component, and outputs from a finite element analysis on the electronic component, as further described herein) may be subsequently input, and from which it is possible to proceed to failure prediction 144. Each step in FIG. 6 is now outlined in further detail.

Figure 7:
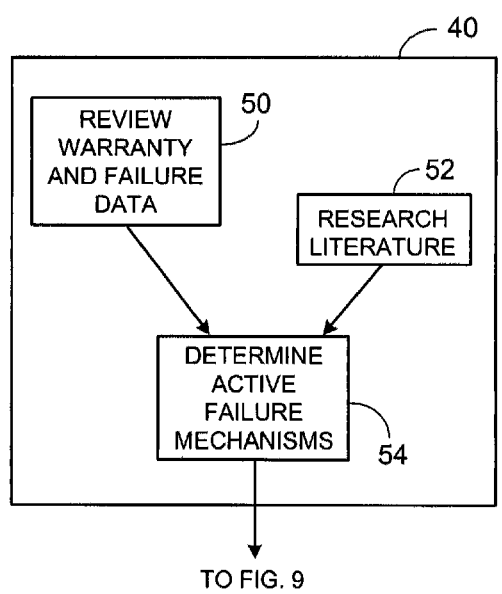

The method begins by identifying failure mechanisms at step 40, shown in FIG. 7. Failure mechanisms describe how and why the component fails. For example, mechanisms for delamination in a multi-layered FR-4 circuit board can include shear forces between the layers, adhesive decomposition, or manufacturing defects. Identification of failure mechanisms can comprise one or more of: review of warranty and failure data for the component or product in question, obtainable, e.g., from the manufacturer (step 50); and research of literature on the material(s) from which the component or product are made (step 52). The goal is to determine which of the possible failure mechanisms for each phase of crack growth are actual active failure mechanisms (step 54) for the product or component in question. Step 40, and the various steps of which it is comprised, are most effectively performed by a human and may comprise, e.g., discussions with electronic system design staff. Accordingly, determination of active failure mechanisms can include a variety of evaluations, discussions, and interpretations of both component, module, and system response.

Figure 8:
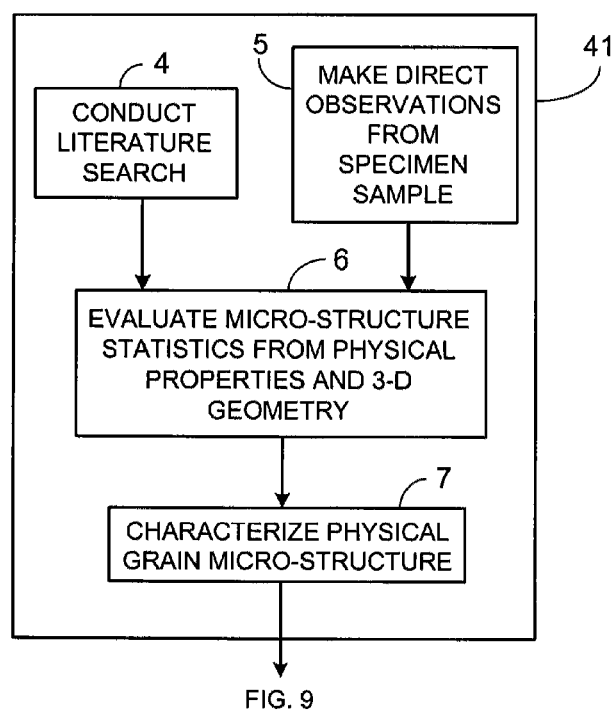

Referring to FIG. 8, a step of identifying the material microstructure 41 may include one or more of: conducting a literature search 4 for available data on the material; making direct observations about the material's microstructural configuration based on specimen samples 5; and evaluating microstructure statistics for physical properties and 3-D geometry 6 based on the literature search and/or direct measurements on the specimens. The statistics gathered may vary depending on the material and microstructural arrangement, but will usually include data pertaining to grain size, orientation, applied microstress, defect size, defect density, and estimates of volume fraction of each of the phases in the material. Identifying the material microstructure 41 culminates with characterizing the physical grain microstructure 7 based on the statistics gathered.

Failure mechanisms are then modeled at step 42 by evaluating failure physics (step 56) and by evaluating inter-relationships between the various models (step 66). Evaluating failure physics (step 56) can involve, for each mechanism determined from step 40, identifying models from the product or component designer, or from the open literature (step 58) using characteristics of the grain microstructure from step 41, identifying the significant random variables (step 59), evaluating and selecting the appropriate models (step 60), and developing models for unique failure mechanisms (step 62) if no existing models are appropriate. Identifying the significant random variables (step 59) involves determining whether variation in a particular input variable changes the outcome of the system. If so, then that variable is significant to some extent. Evaluating and selecting appropriate models can involve, e.g., discarding those that do not use variables that are significant. In practice, once models have been identified for particular failure mechanisms, they are frequently found to be generally applicable to many materials and products and do not require very much adjustment.

Inter-relationships between the selected models (step 66) are evaluated, e.g., by literature review and designer interview (step 68) with the appropriate models tied together to simulate inter-relationships (step 70). Tying the models together as is appropriate to simulate inter-relationships (step 70) may also involve identifying inputs and outputs for each model (step 72), identifying variables that are common to more than one model, and developing a strategy for running the various models in an appropriate chronological sequence (step 74). Identifying inputs and outputs for each model also facilitates developing a sequencing strategy (step 74). A chronological sequence is principally based on underlying physical principles surrounding which crack mechanisms precede others and, thus, which models depend for their input(s) upon the output(s) of which other models.

Figure 10:
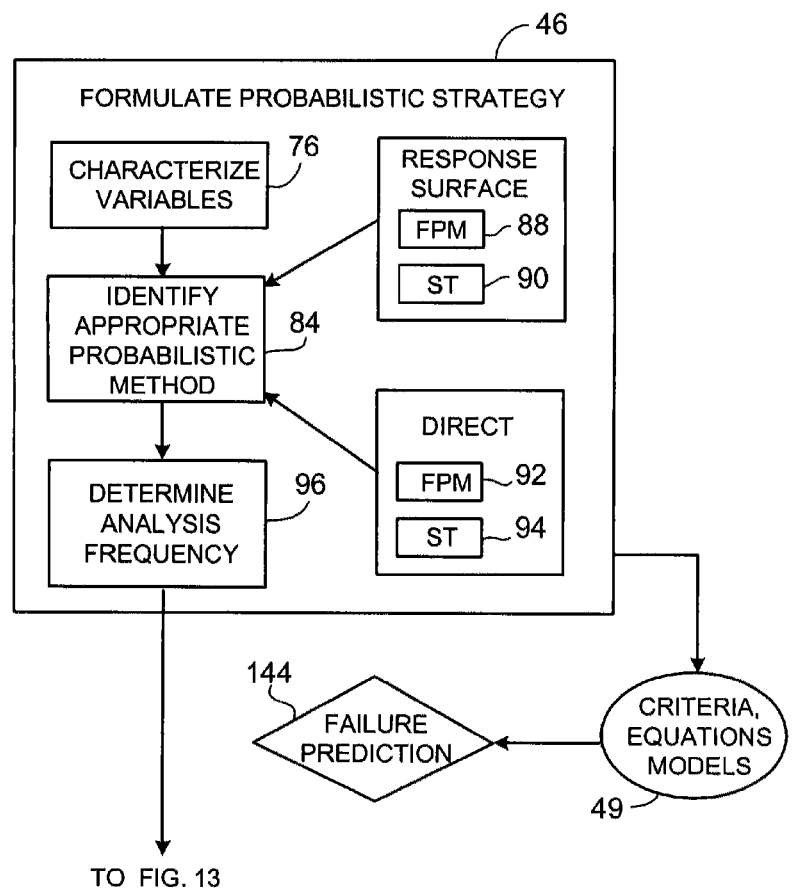

FIG. 10 shows steps in formulation of a probabilistic strategy, step 46. Formulating a probabilistic strategy involves predicting a probability of failure that considers the variability of the input and system parameters. The practice of formulating a probabilistic strategy varies according to whether it is desired to predict the life of a particular instance of a product, based on measured data from the product itself, or whether it is desired to predict overall failure rates for a fleet of products. Thus, in FIG. 10, the steps of characterizing variables 76 and determining analysis frequency 96 (both of which are further described hereinbelow) may only be necessary in the situation where the reliability of a particular instance of a product is required. In either situation, step 84, wherein appropriate probabilistic methods are identified, is performed, using as input a selection of response surfaces, both based on fast probability methods 88 and simulation techniques 90, and a selection of direct methods, also both based on fast probability methods 92 and simulation techniques 94, as further described hereinbelow. In certain circumstances, after the conclusion of step 46, it is possible to proceed directly to failure prediction 144.

Failure prediction 144 can include prediction of failure, independently, from different mechanisms, and from different components. In one embodiment, the overall prediction of failure is governed simply by the component having the shortest predicted lifetime.

Figure 11:
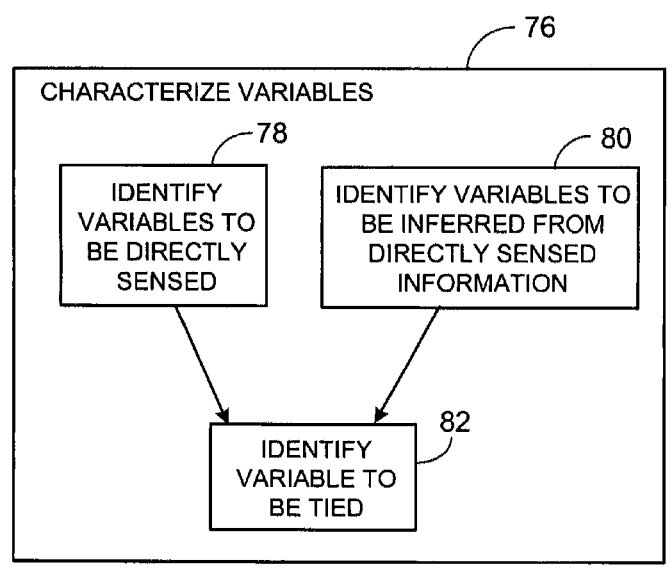

In FIG. 11, a first step in formulating a probabilistic strategy is to characterize the input variables (step 76). Variables are classified as those that can be directly sensed 78, or that can be inferred 80 from directly sensed information. An example of inferred data is a stress that is inferred from a measured temperature, as used in a finite element model. Steps 78 and 80 may be performed simultaneously or serially. All of the variables used in the model for design purposes are referenced, i.e., historical, data 82. A step in characterizing variables (step 76) is also to identify the randomness of each variable, i.e., determine the statistical variation of each variable. When predicting failure rates for a fleet of products, it may be the case that all data is inferred, in which case steps 78 and 80 are unnecessary.

Figure 13:
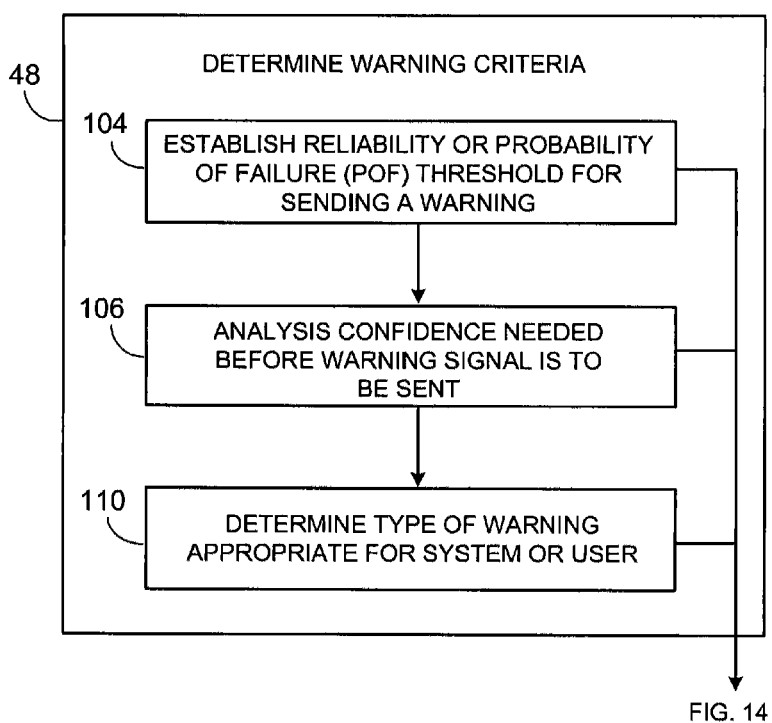
Figure 14:
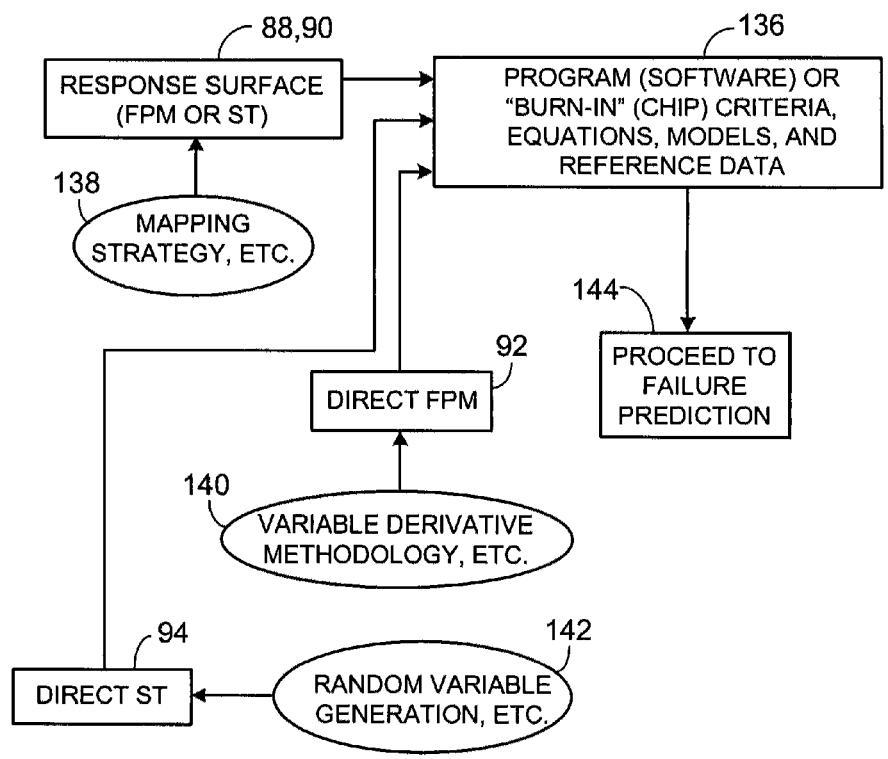

In FIG. 10, formulation of probabilistic approach at step 84 involves identifying and selecting an appropriate probabilistic method to describe the output from the mathematical models of crack nucleation and growth. One of several approaches is used, of which representative techniques are response surface-based 88, 90, or direct 92, 94, as illustrated in FIGS. 13 and 14 further discussed hereinbelow. Two primary probabilistic approaches may be appropriate for prediction analysis: fast probability methods (FPM's), or simulation techniques (ST's). A hybrid of both approaches may also be used, where different approaches are used for different stages of crack growth: for example a direct method is used for small crack growth, but a fast probability method is used for crack nucleation. FPM's include response surface FPM 88 and direct FPM 92 techniques. A response surface approximates the failure physics of the system with a single mathematical relationship. A direct method can have disjoint mathematical relationships and is typically more simplistic. ST's include response surface ST 90 and direct ST 941 (See, e.g., Ang and W. Tang, *Probability Concepts in Engineering Planning and Design*, Vols. I and II, John Wiley & Sons, (1975)). Several factors are typically considered during selection of probabilistic strategy (step 46) including one or more of: available computational limitations, such as processor power, disc-space, or memory; whether it is possible to formulate a response surface equation; the mathematical form of the selected failure models (steps 60, 62) (FIG. 9); the needed prediction accuracy; the characteristics of the monitored system; and the desired update speed or efficiency, among others. All or many of these factors are weighed and balanced by one of ordinary skill in the art, recognizing that engineering analysis is best suited to determine which probabilistic technique is most appropriate for prediction analysis for the particular type of system. The system to be modeled itself may dictate the approach.

Figure 12:
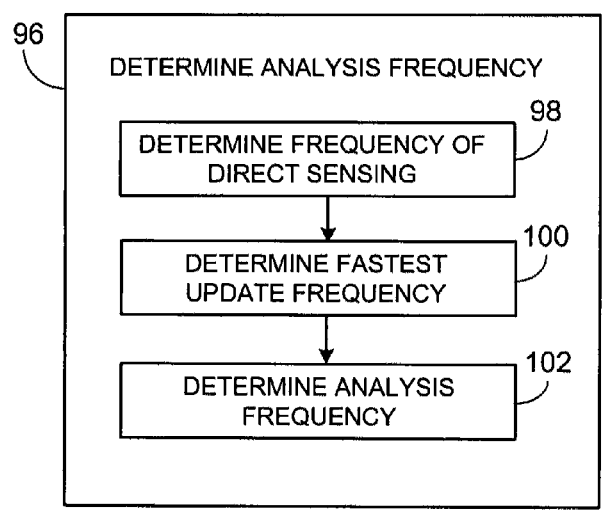

In FIG. 12, to determine analysis frequency (step 96) factors involved include how often relevant direct sensed data is acquired and processed (step 98), the fastest update frequency desired (step 100), and the appropriate analysis frequency (step 102). For example, the direct sensed data may be acquired every 30 ms, whereas the fastest update frequency for the algorithm herein may be only once per hour. Typically, update frequency in step 100 is the same as analysis frequency in step 102.

Of the primary probabilistic techniques available for use herein, direct FPM 92 and ST 94 methods will always provide a solution to the system. Response surface FPM 88 and ST 90 methods, however, do not always provide a workable solution. For example, a response surface cannot be formed when modeling variables that vary with time, and are not differentiable or are discontinuous. Direct methods are then necessary, and are generally used when a numerical, rather than an analytic, solution is desired. Potentially, such a situation could be handled using multiple nested response surface equations. Where a response surface may be used, however, its use can increase the efficiency of the prediction calculations, although its ultimate success depends on its goodness of fit, usually a user choice.

Referring to FIG. 13, response surface methods 88, 90, can be based on a number of underlying mathematical techniques. FPM approaches to response surface modeling 114 include but are not limited to first order reliability methods (FORM), second order reliability methods (SORM), advanced mean value (AMV) methods, and mean value (MV) methods. ST approaches to response surface modeling 120 include but are not limited to Monte Carlo (MC), and importance sampling methods.

Response surface techniques, whether based on FPM 88 or ST 90, are divided into capacity and demand segments (steps 112, 118) respectively. Capacity is a measure of the component's strength, whereas demand is a measure of the load placed upon it. When demand exceeds capacity, under a given set of conditions, failure occurs. The response surface is the locus of points for which capacity and demand are equal and thus represents a boundary between non-failure and failure of the component. Since there are usually more than two random variables, the response surface is usually a complex function in a multi-dimensional space, and cannot always be represented simply as a surface. When constructing a response surface, it is important to be able to categorize terms in the analytical form as being those which either contribute to demand, or to capacity. The equation for the response surface modeling using FPM desirably balances capacity terms on one side against demand terms on the other side. For a response surface using ST, the various terms can be mixed up.

For response surface FPM 88, the chosen method, e.g., one of FORM, SORM, AMV methods, or MV methods, is used to produce a full cumulative distribution function (CDF, where $0<=CDF<=1$) for the capacity portion of the response surface equation (step 114). The CDF is obtained by computing the area underneath (in more than two dimensions, a volume enclosed by) the response surface, and represents a probability of component failure. If the response surface happens to be not bounded, the response surface method cannot be used. A CDF is a plot describing the spread or scatter in the results obtained from only the capacity portion. For response surface ST 90, either MC or importance sampling methods, for example, are used to produce a full CDF for the capacity portion of the response surface equation 120. An equation is then fit to the CDF plots (steps 116, 122).

For both FPM and ST response surface methods, a probability of failure may be obtained directly from CDF of the response surface.

Figure 9:
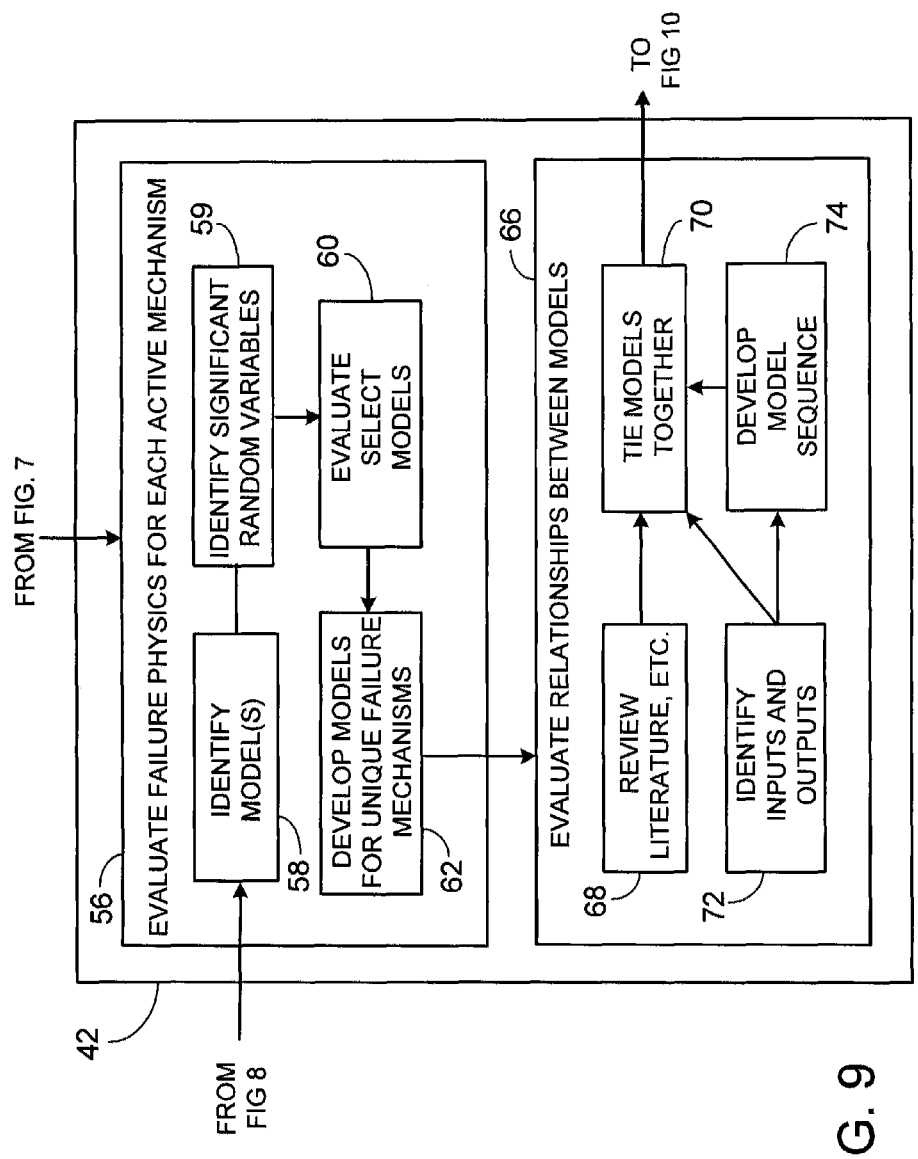

By contrast, direct techniques FPM 92 or ST 94 also have both capacity and demand designations, but are used when those variables cannot be separated, and where no response surface is involved. Direct methods are therefore most often appropriate when a response surface cannot be created. The first step in direct FPM 92 is to establish a method for generating random variables and calculating the corresponding random variable derivatives (step 124). Such derivatives give an indication of sensitivity of the component to failure. The next step is to establish a scheme for using the random variable derivatives in a failure model (step 126). The failure model is one developed in model failure physics (step 42) (FIG. 6). The scheme established in step 126 serves to produce many random variable derivatives for input into the failure model from step 42 (FIGS. 6, 9). Then one determines one or more convergence criteria (step 128) to ascertain when to cease inputting the random variable derivatives into the failure model. The model is solved numerically for each probability of failure.

Similarly, direct ST 94 uses a failure model from model failure physics (step 42). Direct ST is a method of general applicability that can be used, by default, in the case that all other methods are inapplicable. Direct ST 94 starts by choosing a random number generation method (step 130), of which many are known (see, e.g., *Numerical Recipes*, Press, et al., (1992)). This is particularly useful in a situation where little is understood about the behavior of the variables in question. But direct ST 94 does not calculate derivatives of these random variables. The next step using direct ST 94 is to choose a method for using the random variables themselves in the failure model (step 132). Such methods can include but are not limited to Monte Carlo, simulated annealing, Latin hypercube, and adaptive importance. The last step is to determine the number of simulations to be conducted (step 134), which sometimes is based on trial and error, and involves determining the number of simulations necessary to give a failure prediction with a desired precision. Methods such as Monte Carlo are typically applied one grain at a time, through both crack nucleation and short crack growth phases.

Referring to FIG. 14, determining warning criteria 48 can involve one or more steps, that can be performed in any order, as follows: establishing the reliability or probability of failure (POF) threshold for sending a warning (step 104); setting the level of analysis confidence needed before a warning signal is to be sent (step 106); and determining a type of warning appropriate for the system or user (step 110). The various steps are typically only applicable in the situation where prognosis of failure of a specific instance of a product is desired. It may additionally be of interest to establish warning criteria during product design. The steps, in general, address the issue of what risk level to set, before which the user is informed. Steps 104 and 106 may be performed simultaneously, because the confidence level is simply a second order term in the probability. Examples of warnings that can be generated at step 110 include but are not limited to visual indicators such as lights, or aural indicators such as buzzers, or motion-based indicators such as a vibration of the component, or any combination of the foregoing.

Now referring to FIG. 14, in a situation where prognosis of failure of a particular instance of a component is being carried out, optimally the results of the previous steps can, at step 136, be programmed into software, or burned into a memory device, such as a chip. Such results can include, as appropriate, criteria, equations, models, and reference data. For response surface FPM 88 or ST 90, the appropriate criteria, equations, models, and reference data typically include 138: a mapping strategy for each variable and response surface equation; a statistical distribution, or CDF, of the capacity portion of response surface equation; and an analysis frequency strategy and warning criteria. The mapping strategy essentially relates sensed, inferred, and referenced data to the variable in the analysis that represents that data. For direct FPM 92 the appropriate criteria, equations, models, and reference data 140 include: a variable derivative method for FORM, SORM, AMV methods, or MV methods analysis; a convergence criteria; and an analysis frequency strategy and warning criteria. For direct ST 94 the appropriate criteria, equations, models, and reference data 142 include: a random variable generation method for MC or importance sampling analysis; a number of simulations to be conducted; and an analysis frequency strategy and warning criteria. One of ordinary skill in the art will know to mesh the technology with the system of interest in a way that allows both the technology and system to operate correctly.

Once programmed, the results of the foregoing are ripe to proceed to a failure prediction calculation for the instance of the product, or to a prediction of overall product reliability.

Simulation of Solder Fatigue in Electronic Components

An extensive amount of research has been conducted as to how and why cracks initiate and grow within solder connections. This knowledge was adopted within the developed local simulation modeling approach. The most commonly used solder fatigue models are based on Coffin-Manson plastic strain equations developed for solder interconnects. Due to the low melting temperatures, most electronic devices operate at temperatures above solder creep thresholds. Since Coffin-Manson models do not explicitly address creep strains, specific solder models have been developed to incorporate creep (see, e.g., Knecht, S., Fox, L. (1991) "Integrated matrix creep: application to accelerated testing and lifetime predictions," in *Solder joint reliability theory and applications*, Van Nostrand Reinhold, New York, Syed (Ed.), (1997)). All of the fatigue models in use today assume large scale similitude, i.e., the structure (weld footprint or wire diameter) is large compared to the crack, the crack is large compared to the crack tip plastic zone and the crack tip plastic zone is large compared to the microstructure. These assumptions are fundamentally incorrect for today's small scale devices.

Figure 15:
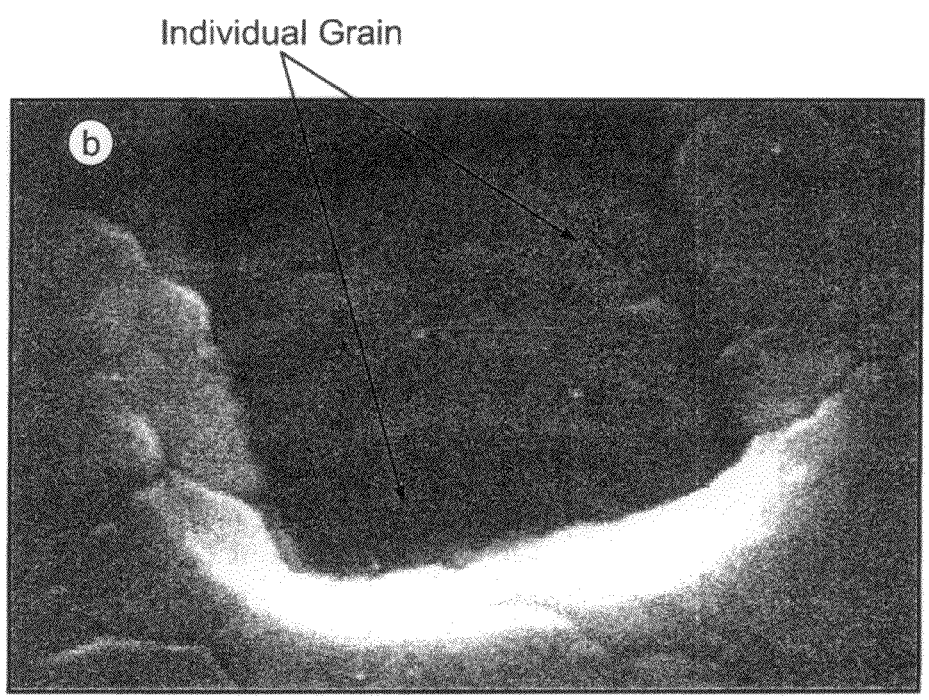
FIG. 15: This figure shows a microscopic view of a metallic structure showing grains of various shapes and sizes and illustrates the relatively few number of grains that make up a typical solder contact area.

Energy-based solder fatigue models have been developed to account for the large crack size compared to the weld geometry (Liang, J., Gollhart, N., Lee, P. S., Heinrich, S., Schroeder, S. (1997) "An integrated fatigue life prediction methodology for optimum design and reliability assessment of solder inter-connectors," *Advances in Electronic Packaging*, Vol 2), and Morris and Reynolds (Morris, J. W., Reynolds, H. L. (1997) "The influence of microstructure on the mechanics of eutectic solders," *Advances in Electronic Packaging*, Vol 2) point out the importance of the size of the material microstructure compared to the size of the damage. Emitter bond wires are usually 300 to 500 microns in diameter and the metallization layer to which they are bonded have a thickness of 3 to 5 microns. With polycrystalline grain sizes as large as 150 microns, microstructural similitude cannot be assumed for crack initiation and growth. FIG. 15 shows the relative size of the grains compared to the overall solder contact area in an exemplary piece of solder.

None of the previously described fatigue models addresses the large scatter in the solder weld properties. The nature of the components on circuit board and the assembly process creates large variations in the solder welds for even the strictest manufacturing tolerances. The very small size of the welds causes variation of the weld footprint from weld to weld. In addition, the microstructural development of the weld is greatly controlled by rate of cooling from the melt stage. Some of the components on the board are specifically designed with heat sinks for thermal management during operation. These heat sinks are activated during the assembly process by the heat of the welding although they may not have been specifically designed for this purpose. This heat transfer action causes uneven cooling of the welds from component to component and uneven cooling of the different emitter bonds within a single component. Other methods for electronic device reliability prediction, largely empirically derived, do not account for this real world variability. Thus, variation in the geometry and material properties of the weld must be considered in order to prognosticate reliability accurately.

Industry research indicates that thermo-mechanical fatigue damage mechanisms in Sn/Pb solder as time dependent (creep) shear stress induced cracks initiate and propagate in the solder near the intermetallic interface. The fatigue response of the solder changes due to instability (coarsening) of the microstructure. Although, both intergranular and transgranular fracture surfaces are observed, depending on loading and temperature, transgranular appears to predominate.

Electronic device operating principles require that the design parameters be accurately coupled. In order to assess the physical changes in variables at the electronic system level, appropriate system reliability modeling techniques should be applied. For example, temperature gradients are caused by the complex heat transfer characteristics within the device. In general, chips consist of material layers which serve as heat sources where other layers serve as heat sinks. Other device elements are generating or absorbing heat depending on their proximity to heat sources or sinks. Computational analysis techniques such as finite element analysis (FEA) are often used to assess the complex thermal environment during design. Such an environment can be simulated as a temporal thermal mission with start-up and shutdown transients along with steady state conditions. Electronics industry research indicates that the highest stresses imposed within the device are the result of temperature gradients created during mission transients. The stresses caused by thermal gradients can be combined with the purely mechanically induced stresses (such as vibration) within the FEA to predict the overall device stresses. The resulting stress prediction is used within VPS-MICRO™ to predict the expected cyclic life of the device.

The electronics industry has combined physics-based thermal or vibration models with empirically-based fatigue models to make a rough order of magnitude prediction of device life. However, this semi-empirical approach lacks the required fidelity to be useful in the prognosis of thermo-mechanical fatigue for individual components. Lau and Pao (Lau, J. H. and Pao, Y. H. (1997), *Solder Joint Reliability of BGA, CSP, Flip Chip and Fine Pitch SMT Assemblies*, McGraw Hill, NY) point out some of the issues of using the current semi-empirical (MTTF or MTBF) approach. These issues, along with the methodology described herein for overcoming these, are as follows.

Geometry: Dimensional variation of components within electronic packages can be of several orders of magnitude, e.g., a 0.08×0.1 mm solder bump versus a 150×150 mm Printed Wiring Board (PWB). This necessitates breaking down the numerical analysis into multi-scale (local and global) analyses. Also there is a difference in the actual and simplified geometries of the component or interconnect. For example, the actual geometry of a solder joint depends on a number of parameters such as solder-paste volume, reflow temperature and flux, which can result in a wide range of different shapes. Oversimplification may eliminate geometric discontinuities or defects, which may be intimately associated with a significant part of fatigue life. To address geometry issues, the present invention comprises multi-scale finite element models to relate the global stresses and strains caused by the thermal mismatch between the electrical device and the circuit board to the local stresses and strains in the intermetallic solder layers. These methods allow for statistical variations in the complex geometry at the global, local and any intermediate level.

Meshing: Electronic packages are bi-material and tri-material bonded edges and interfaces. Stress concentrations cause interfacial damage or cracks to initiate. Capturing detailed stress-strain distributions with reasonable meshes near these concentrations is difficult. Also, many materials used in packaging are of thin layer shapes, such as thin and thick films. Thus, aspect ratio becomes a problem and a large number of elements are required to accurately model the behavior of these thin layers. The multi-scale finite element models used herein address meshing issues by incorporating a representative volume element (RVE) approach in which different size scales are modeled with separate RVE's. These RVEs are properly linked using "nested models". This approach allows for small regions of highly concentrated stresses and strains to be modeled with separate RVE's and then linked to the next higher size scale. Typically, more than one RVE may be used for a given element or node of a finite element analysis model, in which case the RVE's are the same. Thus RVE's having different properties are typically not mixed within a single volume element.

Figure 16:
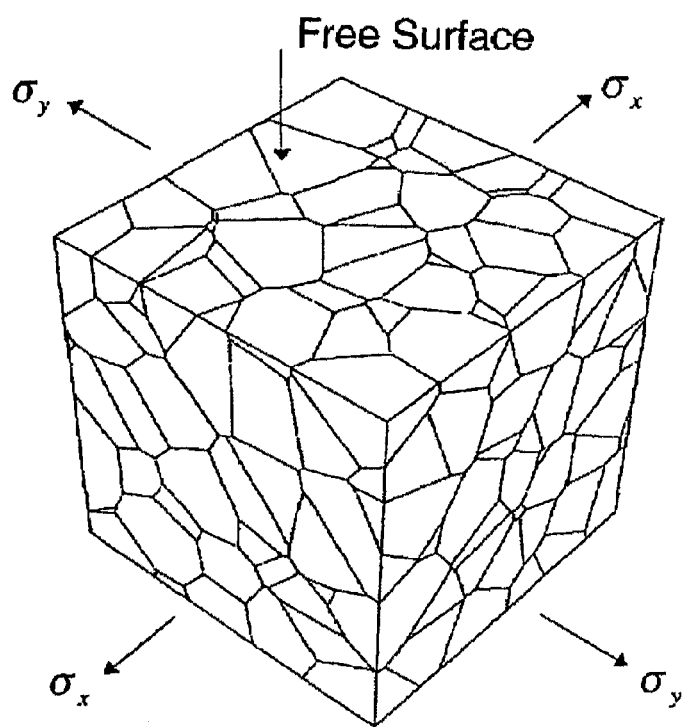
FIG. 16 shows a cubic representative volume element.

Illustrated schematically in FIG. 16 is a cubic piece of a Representative Volume Element (RVE) of a material. Stresses, $\sigma$, in both directions along each of three mutually orthogonal axes are shown. Not shown are shear forces, $\sigma_{xy}$, $\sigma_{xz}$, and $\sigma_{yz}$ (sometimes designated as $\tau_{xy}$, $\tau_{xz}$, and $\tau_{yz}$ in the art), that represent twisting forces in plane. The forces are constrained to balance so that there are no net forces on the cube. In certain embodiments, such as where the material is a solder or an intermetallic layer, the grains are permitted to change in size and/or orientation with time.

Material Properties: Properties of internal solder layers, such as intermetallic regions between the solder and silicon substrate, are not well known. Most properties are temperature and time dependent. The mechanical behavior of a solder joint, for example, depends on strain rate, temperature, cooling rate, loading history and microstructure. Mechanical properties measured using relatively large scale and bulk specimens generally are not the same as those for actual solder interconnects. To address material property issues, VPS MICRO™, a physics-based fatigue analysis approach models the interaction of the fatigue damage with the material microstructure. The material microstructure is explicitly modeled at the crystalline level; no bulk assumptions are made.

Component Simulation

Figure 17:
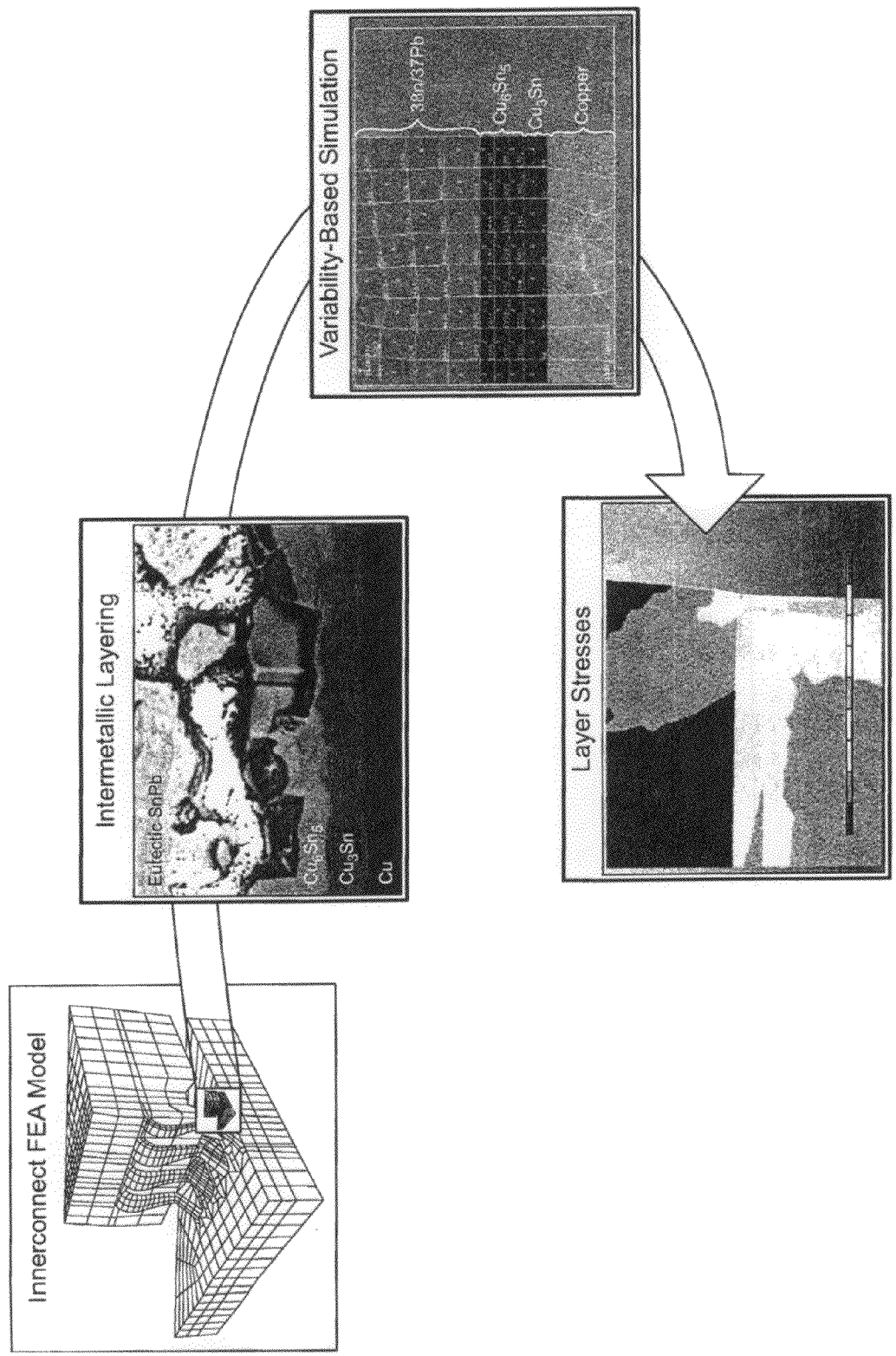
FIG. 17: Global stress translated to local microstructure through simulation of intermetallic layers in solder.

An overview of analytical steps used in simulating real material behavior at the electronic component level is shown in FIG. 17. A portion of an exemplary electronic component, having "j-leads" is shown. It would be understood by one of ordinary skill in the art that the steps depicted in FIG. 17, as with elsewhere herein, can equally be applied to other lead configurations such as, but not limited to, those known as "gull-wing". The inset panel A of FIG. 17 shows a global FEA model of one fourth of the exemplary device soldered to a circuit board. FEA methods as used in the art can be incorporated with the methods described herein. The whole device has 14 "j" shaped connector leads, but because this is a quarter symmetry model, only three and one half of the (total of 14) connectors are shown. (The half-connector is in the foreground of the panel.) A "global" structural analysis is performed on this model to predict the stresses throughout the component and board. The other three quarters of the component are assumed to have identical stresses. A cutaway from panel A of FIG. 17 reveals how the component microstructure is modeled. Although both solder and leads can fail independently of one another during device operation, solder has a more complex structure than the leads and thus is more challenging to model.

The j connectors in the exemplary device of FIG. 17 are copper, though the methods herein can be used to model connectors made from other materials. The "solder pad" on the exemplary circuit board of FIG. 17, on which the "j" connectors sit, is also copper. The inset panel B of FIG. 17 shows a close-up of the exemplary solder joint microstructure, demonstrating that the solder joint is not a homogeneous monolith but composed of polycrystalline tin-lead. In particular, the solder shown (eutectic solder) contains 63% Sn (tin), even though it is often referred to as "lead solder". Interface layers from chemical reactions between the tin-lead eutectic and the copper at both the "j" connector and the board. The interface layers are composed principally of the intermetallic compounds $Cu_6Sn_5$ and $Cu_3Sn$.

Figure 18:
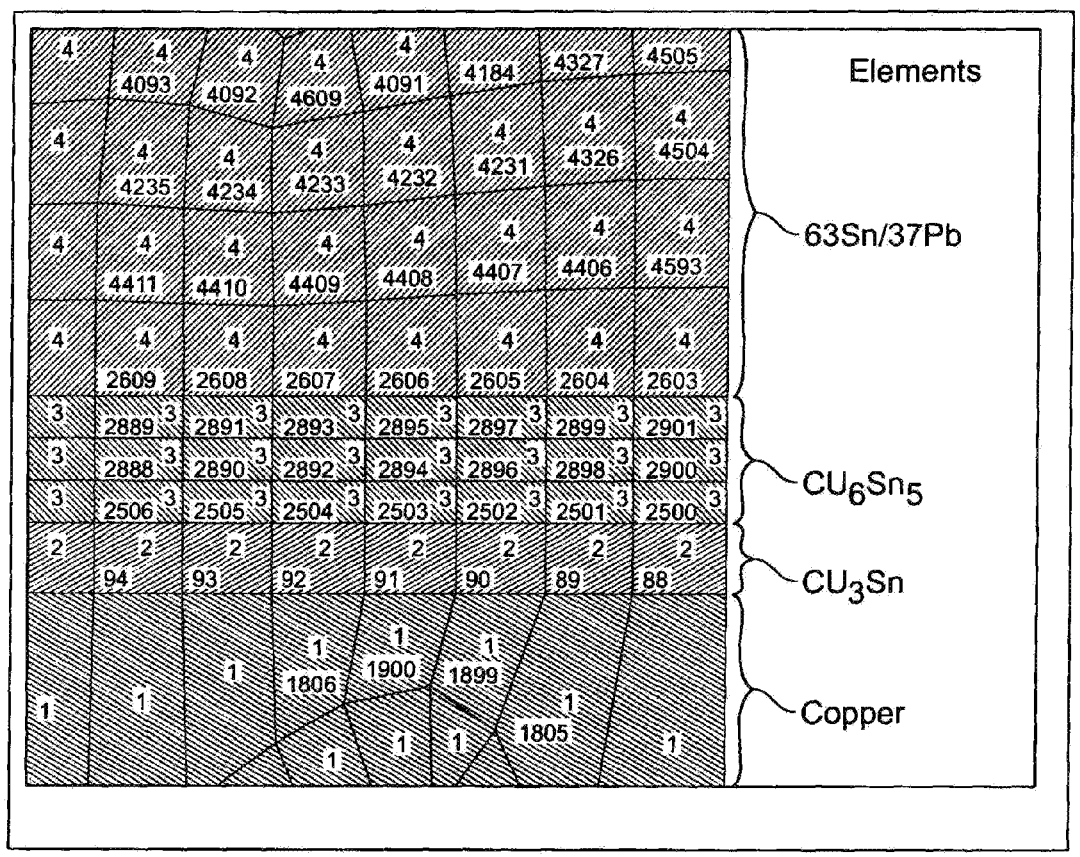
FIG. 18: FEA simulation of the material layering variability between the solder and substrate.

Inset panel C of FIG. 17 shows a "local" FEA model of the interconnect microstructure at the interface between the solder and copper in the board. The stresses from the global model are the boundary conditions for the local model. The FEA models created for various $Cu_3Sn$ and $Cu_6Sn_5$ thicknesses to simulate this real world variability. FIG. 18 is taken from panel C of FIG. 17 and shows an exemplary FEA model for 4 microns of $Cu_3Sn$ and 7 microns of $Cu_6Sn_5$. The bottom layer in the model in FIG. 18 is the copper. (The elements of this layer are designated with a 1 at their centers.) The next layer is $Cu_3Sn$, designated with 2 at the centers of the elements. The next layer is $Cu_6Sn_5$, designated with 3 at the centers of the elements. The top layer is 63Sn/37Pb solder, designated with 4 at the element centers.

The local model takes into account intermetallic layering to predict the stresses at the interfaces as shown in the inset panel D of FIG. 17. The FEA model of the interconnect microstructure is only good at a particular time, and should be continually updated, because the composition of the solder/lead joint changes due to diffusion of the layers and because the diffusion rates are themselves affected by loads and thermal cycling that are applied during device operation. Diffusion persists at a noticeable rate, even at room temperature, such that over a period of even as little as a year, a layer of a given intermetallic material may change in thickness by a factor of three or four.

The stresses that translate from global loadings on the component to local regions of the materials are particularly critical at the interface between the copper lead and the solder. These localities are of compounded significance due to the existence of a complex microstructure of intermetallic layers between the copper and the solder. When molten Sn—Pb solder contacts the lead, intermetallic compounds (IMC) are formed between the solder and the lead. To model the complex stress state of the microstructure at the copper/solder interface, finite element models have been created for the copper/intermetallic/solder region (FIG. 17). Because the thickness of the intermetallic layers change with time, a series of finite element models must be incorporated within the modeling approach.

The life of the component is measured as the life of the finite element model of the component. In general, the life is given by the life of the first RVE to fail, having calculated the life for each RVE associated with each significant node.

Intermetallic Layer Models

Models of intermetallic layer growth can also be incorporated into the methods herein, as follows.

The $Cu_6Sn_5$ layer grows much faster than the $Cu_3Sn$ layer in the molten state. The thickness of $Cu_3Sn$ in a newly formed joint is about a few hundred angstroms ($\sim 10^{-8}$ m) while $Cu_6Sn_5$ is about 1 μm ($10^{-6}$ m) thick (see, e.g., Frear D. R., Burchett, S. N. and Morgan, H. S., *The Mechanics of Solder Alloy Interconnects*, Frear, D. R., Burchett, S. N., Morgan, H. S. and Lau, J. H., Eds., Van Nostrand Reinhold, NY, (1994)). The intermetallic layers also grow at the interface of the solder and the substrate during long term storage at ambient temperatures and more rapidly at high temperatures (see, e.g., Davis, P. E., Warwick, M. E. and Kay, P. J. (1982). *Plating and Surface Finishing*, 69, pp. 72-76). In extreme cases, the intermetallic compound growth reaches the surface of the solderable coating over a significant area of the sample and renders the joint unsolderable with mild fluxes (Brothers, *The Western Electric Engineer*, p 49 (1981)).

Two types of solid state growth can be distinguished from a kinetic standpoint: linear and parabolic growth. Cu substrates in contact with Sn/Pb solder alloys are usually approximated by parabolic or subparabolic growth kinetics, indicating that the growth is limited by bulk diffusion of elements to the reaction interface (see, e.g., Wassink, R. J. K., Soldering in Electronics, $2^{nd}$ Ed., Electrochemical Publications Limited, Ayr, Scotland, (1989); Romig, A. D., Jr., Chang, Y. A., Stephens, J. J., Frear, D. R., Marcotte, V. and Lea, C., "Physical Metallurgy of solder-substrate reactions," *Solder Mechanics: A State of the Art Assessment*, Frear, D. R., Jones, W. B. and Kinsman, K. R., Eds., The Minerals, Metals and Materials Society, Publishers, Warrendale, Pa., (1991); Kay, P. J. and Mackay, C. A., *Transactions of the Institute of Metal Finishing*, 54, pp. 68-74, (1976)).

In a study by Tu et al. (Tu, K. N. and Thompson, R. D., *Acta Metallurgica*, 30, pp. 947-952, (1982)) on bimetallic Cu/Sn thin films, $Cu_6Sn_5$ was found to form immediately at room temperature whereas no $Cu_3Sn$ was detected. In the temperature range 115° C. to 150° C., $Cu_3Sn$ layer grew and a parabolic reduction rate of $Cu_6Sn_5$ was observed with activation energy of 0.99 eV. Davis et al. (Davis, P. E., Warwick, M. E. and Muckett, S. J., *Plating and Surface Finishing*, 70, pp. 49-53 (1983)) also found that un-aged samples had $Cu_6Sn_5$ layers but not $Cu_3Sn$. $Cu_3Sn$ appeared after thermal aging at 135° C. Dehaven (DeHaven, P. W. (1985). *Proceedings of the Materials Research Society*, 40, pp. 123-128), studying the reaction rate of Cu with 60Sn-40Pb in molten state, found that a sample quenched after one minute had only $Cu_6Sn_5$, while a sample quenched after 5 minutes had both $Cu_3Sn$ and $Cu_6Sn_5$.

The activation energy for growth of $Cu_3Sn$ on polycrystalline copper was found to be 1.27 eV and 0.47 eV for $Cu_6Sn_5$ (Dunn, D. S., Marinis, T. F., Sherry, W. M. and Williams, C. J. (1985). Proceedings of the Materials Research Society, 40, pp. 129-138). A study by Dimfield and Ramon (Dimfield, S. F. and Ramon, J. J., (1990), *Welding Journal*, pp. 373-377) of Sn/Pb solder on a copper substrate showed that time-at-temperature dependence of layer thickness obeyed $t^{1/2}$ kinetics (where t is time). Pinizzotto et al., (Pinizzotto, R. F., Jacobs, E. G., Wu, Y., Sees, J. A., Foster, L. A. and Pouraghabagher, C., *International Reliability Physics Symposium*, March 1993, incorporated herein by reference) studied the growth of $Cu_6Sn_5$ and $Cu_3Sn$ by annealing 63Sn-37Pb solder and Cu samples for 0 to 64 days at temperatures of 110° C. to 160° C. Good linear correlation of thickness with $t^{1/2}$ indicates that the formation of intermetallics is a diffusion controlled process. A value for diffusion coefficient is also calculated. The growth law can be expressed as (Wassink, Soldering in Electronics, 2nd Ed., (1989), incorporated herein by reference).

$$d = \sqrt{Dt} \tag{31}$$

where d=Layer Thickness (μm), D=diffusion coefficient, and t=Time (sec). The value of diffusion coefficient is given by the Arrhenius equation:

$$D = D_0 e^{-Q/kT} \tag{32}$$

where $D_0$=Diffusion Constant=$3.8 \times 10^6$ cm²/s; Q=activation energy; k=Boltzmann's Constant; and T=Absolute Temperature.

Combining Eqs. (31) and (32) yields:

$$d = (D_0 e^{(-Q/kT)} t)^{1/2} \tag{33}$$

which serves as a response surface to relate time and temperature to the thicknesses of the intermetallic layers. Equation (33) can be used to determine the stresses in the solder bond joint.

The activation energies for growth of $Cu_6Sn_5$ and $Cu_3Sn$ are 0.80 eV and 1.69 eV respectively (Pinizzotto, et al., *International Reliability Physics Symposium*, (1993), incorporated herein by reference). Solder joints typically cannot be formed successfully for reflow times less than 20 s. However, increase in reflow time results in increase of intermetallic layer thickness and possible degradation of strength. Apart from reflow conditions, thermal cycling can also affect the layer thickness (see, e.g., Tu, P. L., Chan, Y. C. and Lai, J. K. L., "Effect of Intermetallic Compounds on the Thermal Fatigue of Surface Mount Solder Joints," *IEEE Transactions on Components, Packaging and Manufacturing Technology Part B*, 20(1), pp. 87-93, (1997), incorporated herein by reference).

It has been found that the intermetallic thickness increases with reflow times according to an exponential growth law (see Tu et al., *IEEE Transactions on Components, Packaging and Manufacturing Technology Part B*, 20(1), pp. 87-93, (1997)). With longer reflow times the intermetallic layer gets thicker, and the interface with the bulk solder becomes rougher (Tu et al., *IEEE Transactions on Components, Packaging and Manufacturing Technology Part B*, 20(1), pp. 87-93, (1997)). The layer also thickens with higher reflow temperature during soldering, prolonged storage, and long term operation of the electronic assembly even at room temperature (So, A. C. K., Chan, Y. C., and Lai, J. K. L., "Aging Studies of Cu—Sn Intermetallic Compounds in Annealed Surface Mount Solder Joints," *IEEE Transactions on Components, Packaging and Manufacturing Technology—Part B*, 20(2), pp. 161-166, (1997)). A study by Pang et al. (Pang, H. L. J., Tan, K. H., Shi, X. Q. and Wang, Z. P., "Microstructure and intermetallic growth effects on shear and fatigue strength of solder joints subjected to thermal cycling aging," *Materials Science and Engineering A*, 307, pp. 42-50, (2001)) showed that for a more severe thermal cycling, the total intermetallic thickness increased at a faster rate than what was predicted by Tu et al. (*IEEE Transactions on Components, Packaging and Manufacturing Technology Part B*, 20(1), pp. 87-93, (1997)).

Parameter values for $Cu_6Sn_5$ and $Cu_3Sn$ intermetallic layers are listed in Table 2.

TABLE 2

Parameter values for $Cu_6Sn_5$ and $Cu_3Sn$ intermetallic layers

|  | $Cu_6Sn_5$ | $Cu_3Sn$ |
| --- | --- | --- |
| Q (Activation Energy eV) | 0.8 | 1.27 |
| $D_0$ (Diffusion Constant μm²/s) | 2.52E05 | 9.37E10 |
| T (Temperature F.) | 256 | 256 |
| k (Boltzmann's Constant J/K) | 1.38E-23 | 1.38E-23 |

Figure 19:
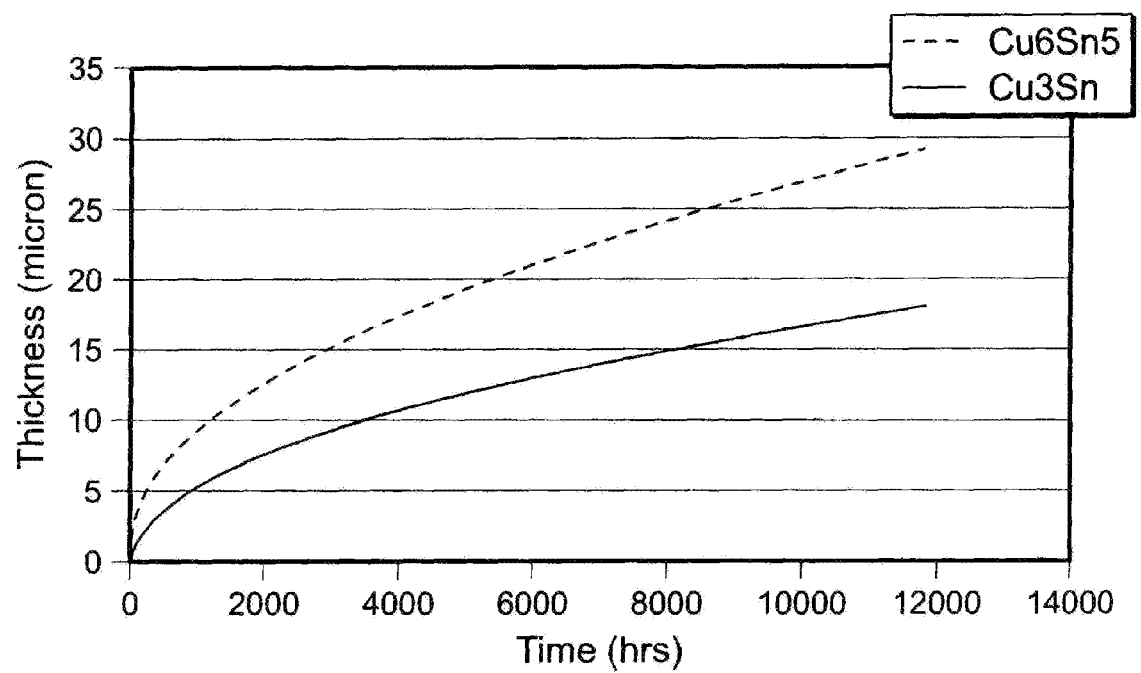
FIG. 19: Intermetallic layer thickness as a function of time at 256° F.
Figure 20:
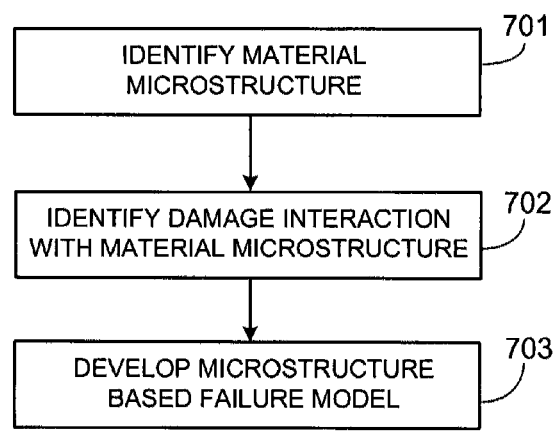
FIGS. 20-27 depict a flowchart of an embodiment of a method as further described herein.
Figure 21:
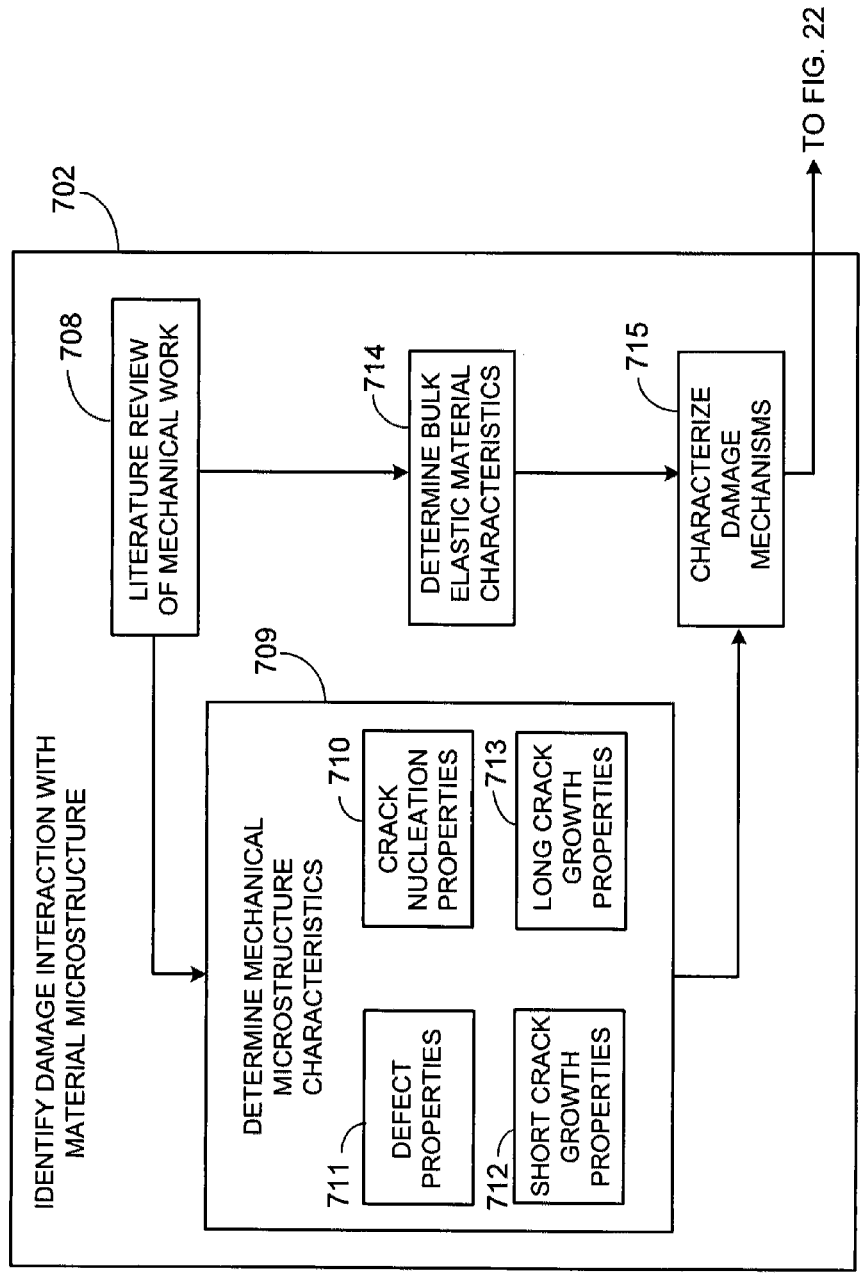

Substituting Eq. (33) into (32) and using the values in Table 2, the thickness of the intermetallic layers as a function of time at a temperature of 256° F. are shown in FIG. 19 for the example of a copper-solder joint.

Figure 22:
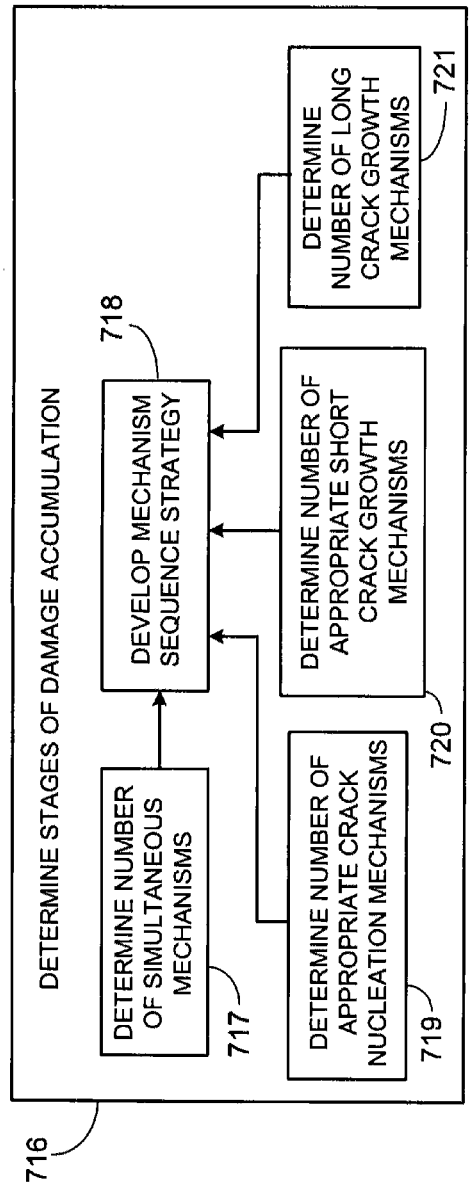
Figure 23:
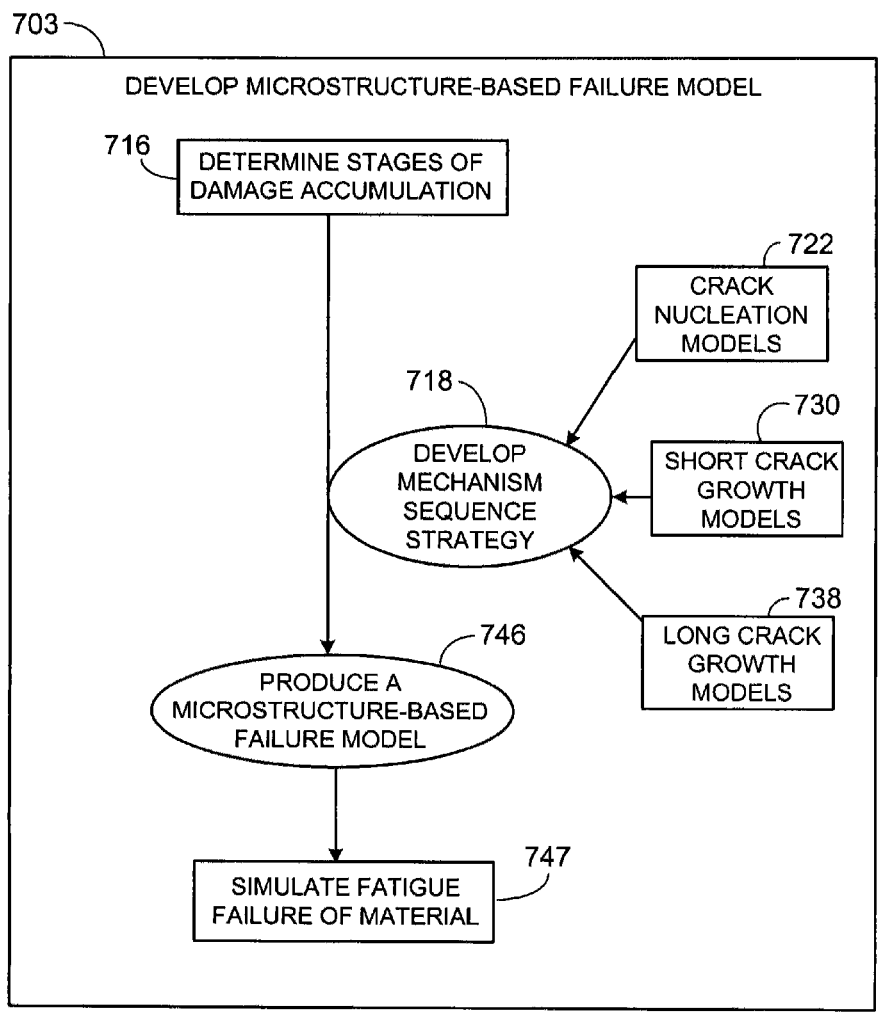

Now referring to FIGS. 20-27, which contain flowcharts of an embodiment of a method described herein, the method generally includes identifying the material microstructure 701 (FIGS. 20, 21), identifying the damage interaction with the material microstructure 702 (FIGS. 20, 21), and developing a microstructure-based failure model 703 (FIGS. 22, 23). Each of these steps is now further described.

Identification of material microstructure is described in connection with FIG. 8, step 41, herein.

Identification of the damage interaction with the material microstructure 702 (FIG. 21) includes identifying processes necessary to characterize active damage mechanisms 715 that become the basis of microstructure-based failure model development 703 (FIGS. 22, 23). First, a literature review 708 is undertaken to determine if information exists about either the bulk elastic material characteristics 714 or the mechanical (i.e., loaded) microstructural characteristics 709. Models found in the literature at 708 can be used unchanged, or may be modified in a manner within the capability of one of ordinary skill in the art, depending on the application in question. Determining mechanical microstructure characteristics 709 includes such quantities as material density, and strength against cracking, slipping, etc. An assessment of defect properties 710 then defines features such as grain slip planes, pores, or inclusions, and other local stress risers such as composite laminate plies and fiber which are likely to cause local plastic deformation. There are a wide variety of other potential defects within any given material, as would be understood by one of ordinary skill in the art. Crack nucleation properties 711 define the mechanisms that cause local plastic deformation to nucleate cracks. Short crack growth properties 712 then define the active mechanisms at the short crack tip that govern the erratic behavior of short cracks, such as grain boundary blockage, grain orientation, ply/matrix interface, and the local frictional strength. Long crack growth properties 713 define elastic and plastic crack growth rate parameters, such as stress intensity factors and strain energy release rates, as well as threshold characteristics. Determining bulk elastic material characteristics 714 encompasses obtaining a data for a number of properties including shear modulus, Poisson's ratio, and specific fracture energy, although the appropriate properties vary greatly depending upon the material and microstructural arrangement. This information that pertains to bulk elastic material characteristics 714 and mechanical microstructure characteristics 709, is used to characterize the damage mechanisms 715, as well as to link them to one another during predictions of failure.

Figure 24:
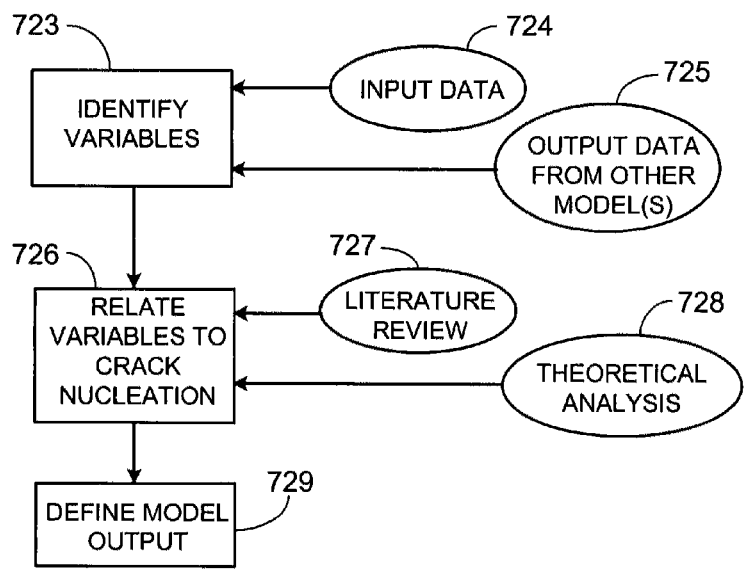

Now referring to FIGS. 22, 23, and 24, development of the microstructure-based failure model 703 is generally accomplished by determining the stages of damage accumulation 716 (FIG. 22), including identifying which mechanisms are in effect. Thus, for each mechanism in effect, models are developed, as follows: crack nucleation models 722 (FIG. 23); short crack growth models 730 (FIG. 23); long crack growth models 738 (FIG. 23). The crack nucleation, short crack growth, and long crack growth models are linked (e.g., sequenced and/or nested) to produce an overall failure model 746 (FIG. 23).

Determining the stages for damage accumulation 716 (FIG. 22) is typically based on heuristics, and begins by determining the number of simultaneous damage mechanisms 717 that exist (e.g., ductile nucleation in one phase occurring simultaneously with brittle nucleation in a second phase). Then a mechanism sequencing (or nesting) strategy 718 is developed that, in general, links these models. This strategy may be one that is known from the scientific literature, and is typically based on a hierarchical model of the materials. Microstructural characteristics of the materials can be used in this step. Linking is used to predict the fatigue response at the component level because fatigue damage can start at a very small scale and grow to final fracture. A lower level model that describes the component uses the appropriate parameters to determine the initial state of the next level in a system hierarchy. The next level uses the results from the previous level along with the appropriate parameters specific to its level to determine the initial state of the next level, and so on. Through the use of these "nested" modeling techniques, component reliability can be linked to the physical mechanisms at each level. Additionally, by modeling each level of the fatigue process individually, and rigorously linking the levels, various size effects are included. The sequencing strategy makes use of the numbers of, respectively, nucleation models 719, short crack growth models 720, and long crack growth models 721 required at each level. Each of the mechanisms characterized in step 715 (FIG. 20) will have a corresponding model. Multiple models may be needed for each level due to multiple mechanisms for each damage level, and different mechanisms may be active simultaneously 717.

FIG. 23 shows how the various mechanisms are linked together to simulate fatigue. From determining stages of damage accumulation 716, thereby developing a mechanism sequencing strategy 718, models for each of crack nucleation 722, short crack growth 730, and long crack growth 738, are input into the sequencing strategy. From this is produced a microstructure-based failure model 746, from which fatigue failure of the material is simulated 747.

Models for each of crack nucleation 722, short crack growth 730, and long crack growth 738 can be developed, as applicable, according to the steps shown in FIG. 24. First, identify the important random variables 723 based on the required model inputs 724, or outputs 725 from other models (should the model be nested). Then, relate the important variables to crack nucleation 726, through, for example, literature review 727, and/or theoretical and/or experimental considerations 728. Crack life and crack cycles are similar concepts when discussed regarding fatigue failures. Finally, define model output 729 (parameters that could also serve as inputs to other models at the next level).

In obtaining the damage models 722, 730, 738, time-dependent issues such as dwell and creep fatigue must be addressed if they are determined to be important random variables for the respective models.

Figure 25:
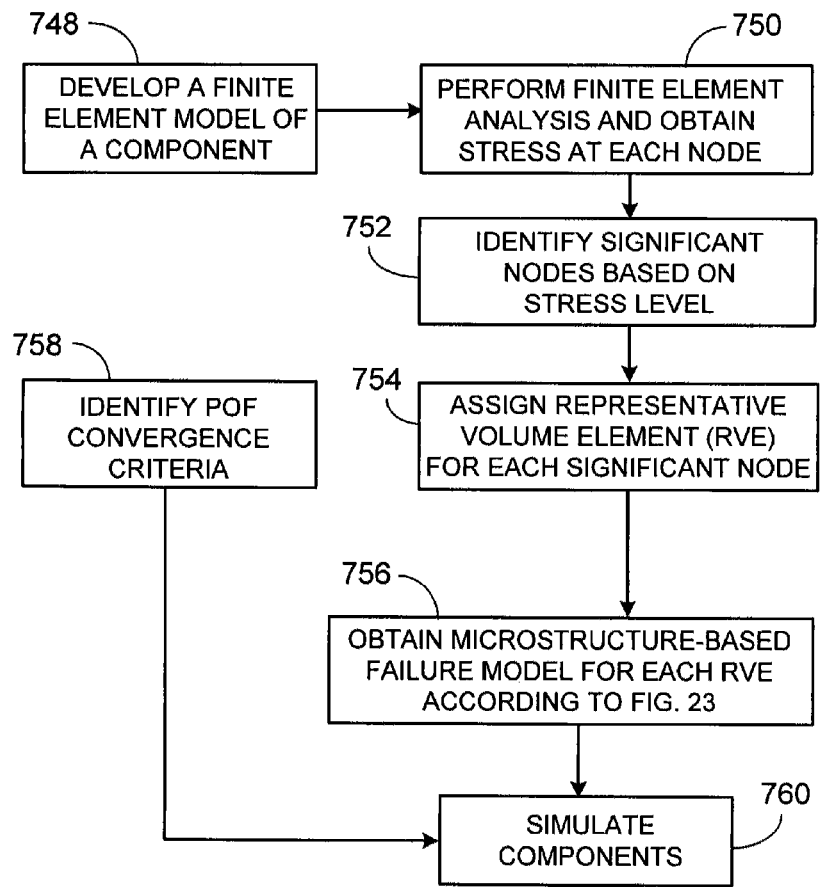
Figure 26:
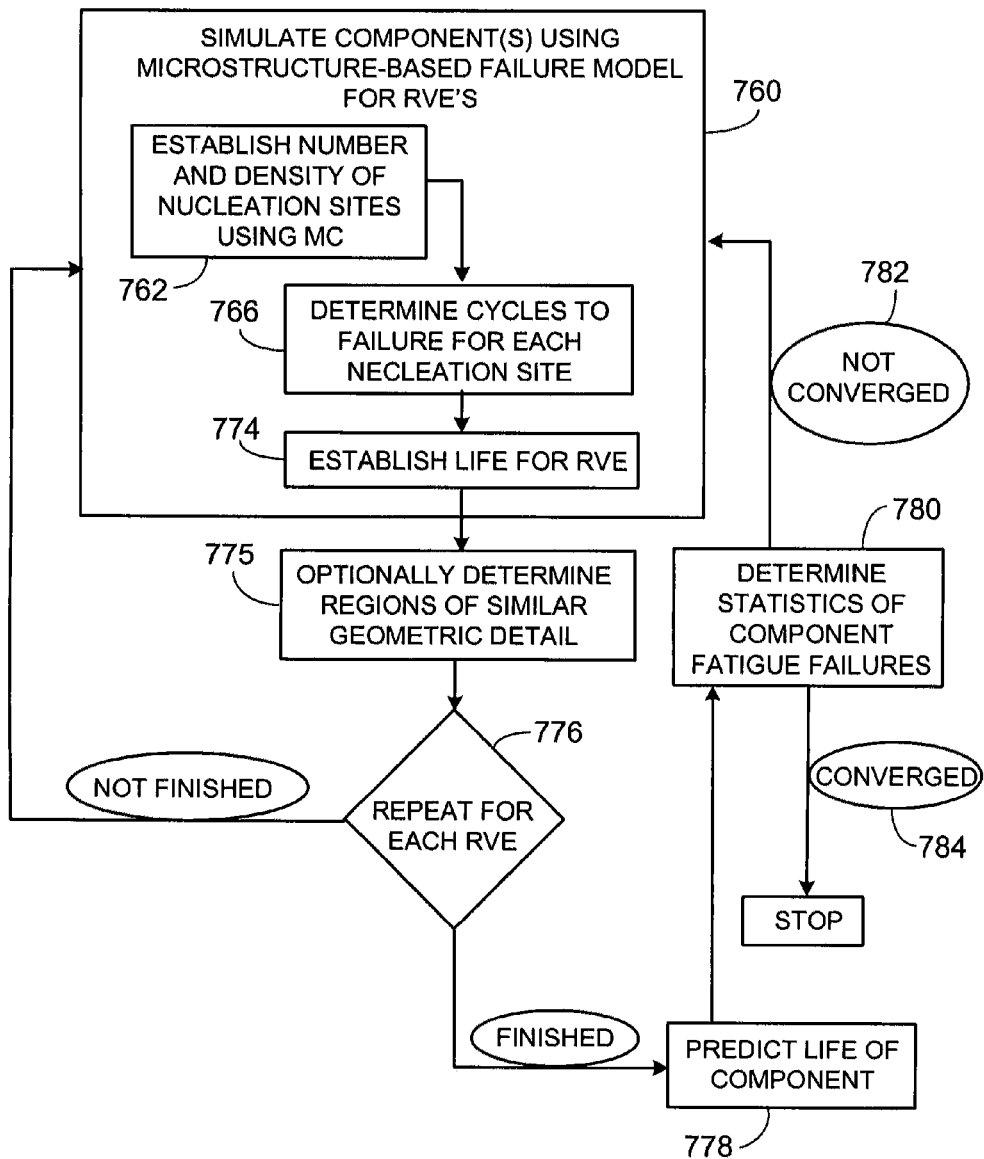

Microstructure-based failure model 746 is limited to a single microstructure and single set of loading conditions. Most real-world components will have many material microstructural arrangements and, more likely than not, will experience multiple loading conditions. Now referring to FIG. 25, to apply the method to a real-world component, a Finite Element Model (FEM) 748 is developed or obtained. The FEM should consider appropriate time, temperature, and displacement conditions. Then the FEM is analyzed to obtain the stress and temperature at each node at each time (when appropriate) 750. With these stresses and temperatures, the significant nodes 752 are identified. Significant stresses could be those above material fatigue strength at that temperature, or in excess of a safety factor applied to fatigue strength as determined by one of ordinary skill in the art. Typically the nodes that are not significant are not subsequently used in a failure model; this permits the methods to concentrate on the most likely sources of failure. Around these significant nodes, a Representative Volume Element (RVE) 754 is developed. An RVE is a finite region of the FEM that has a consistent stress and temperature. An RVE may, in fact, only be two dimensional, but it is nevertheless referred to as a volume element. The information for each RVE should include the stress and temperature on the RVE, the dimensions, and the properties and microstructure of the material within the RVE. The microstructures within each RVE are determined, and the process of FIGS. 20-24 is applied to each RVE 756 to obtain an overall microstructure-based failure model 746 (as in FIG. 24) for each RVE. At some point prior to beginning the first simulation of the component 760, one or more probability of failure (POF) convergence criteria 758 is identified for the eventual statistics that describe the simulated component fatigue failures 780 (FIG. 25-26). The necessary statistical significance will be different for different situations.

The component is simulated 760 FIG. 26 by using the overall microstructure-based failure model developed for each RVE 756. First the number and density of potential nucleation sites (starting points for a crack) within each RVE is established using, for example, the probabilistic-based Monte Carlo (MC) method 762. Other simulation methods known in the art are also applicable. The use of MC methods for establishing the number and density of potential nucleation sites is documented within the open literature. The MC method uses as a starting point a number of nucleation sites, and can be run many times for different starting numbers to obtain a probabilistic output.

Figure 27:
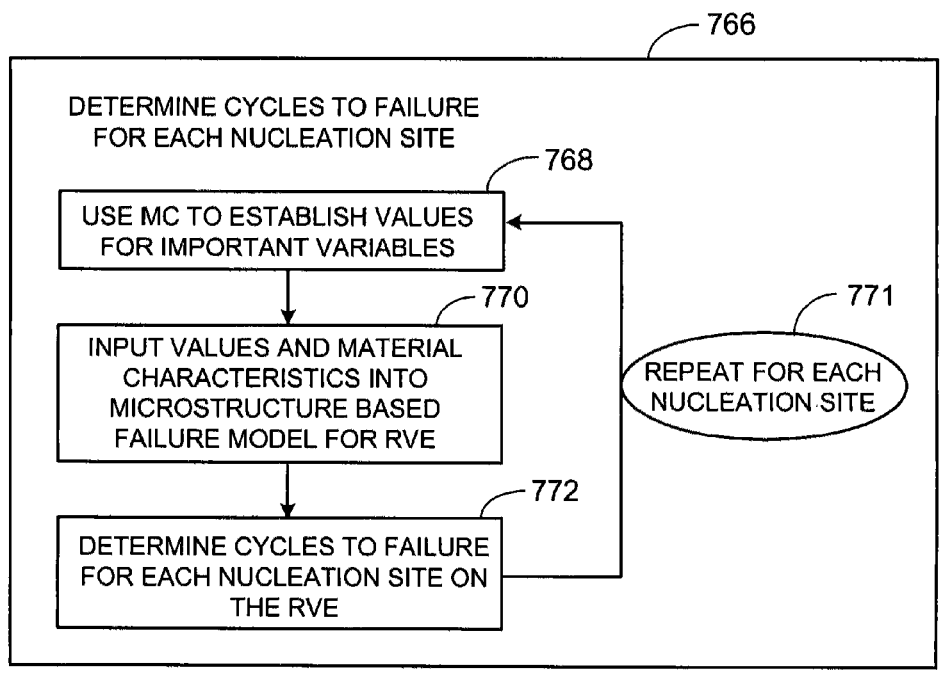

Next the cycles/time to failure for each potential nucleation site 766 is determined. Steps involved in a typical method of determining the cycles/time to failure are shown in FIG. 27. First, use MC methods to establish values for each of the random input variables 768, such as stress at grain boundaries, in the overall failure model 746 (FIG. 24) for the potential nucleation site in question. The appropriate set of those values is input into the microstructure-based failure model for the potential nucleation site in question 770 to determine the cycles/time to failure for that site 772.

The process of FIG. 27 is repeated 771 for each potential nucleation site within the RVE 772 and the "life" of the RVE is established 774. The life of the RVE is the smallest number of cycles/time to failure for any of the included potential nucleation sites.

Now, referring to FIG. 26 again, the component having established a life for the RVE, optionally, regions of similar geometric detail can be identified, (such as by symmetry of the component), and the same established RVE Life can be used for each RVE having a similar geometric detail. This permits creation of a spatial correlation for these regions.

Simulating 762 (FIG. 26) is repeated for each RVE 76 in this simulated component. Once all RVE's have been simulated, the predicted life of the component 778 is the minimum number of cycles/time to failure for any RVE. The result can optionally be included with any previous predictions to determine the statistics on these component fatigue failures 80. For example, the statistics could include a POF, a cumulative distribution function (CDF), or a probability density function (PDF) of failure characteristics. One of ordinary skill in the art will recognize that the desired component statistics will vary considerably based on the problem at hand. Next, the statistics are checked against the POF convergence criteria and, if not met 782, another component failure 760 is simulated by repeating the process. If the convergence criteria are met 784, the process stops.

Should the RVE be so large that computer analysis of every potential nucleation site would be cumbersome, the process may be modified. Step 766 would be changed to evaluate only a statistically significant number of potential nucleation sites, and probabilistic methods (also called system reliability methods) would be used to estimate RVE life 774, rather than directly computing the shortest life of each potential nucleation site.

Another aspect of the method is that it can be modified to account for an FEM that accounts for variation in stress, temperature, time, and/or dimension such as voltage, current, and dwell (the time spent dwelling at a given condition). Here, step 750 is modified so the FEM analysis results in a statistical distribution of stresses rather than a single value of stress.

These statistical distributions of stresses, temperature, and time may be found experimentally or developed using any number of probabilistic methods. Then in step 768, stress, temperature, and time will be included in the random variables whose value is established using MC analysis, also a probabilistic method.

Still another modification of the technology adds a spatial correlation to the FEM. This correlation is beneficial when a component has multiple locations of similar detail. An optional step finds the fatigue life for regions of the component with similar geometric detail 775 repeats the process for each RVE 776 and then determines the component fatigue life based in part on a spatial correlation from the information gained from step 775. The spatial correlation comes from using a common established life for the RVE 774 whenever encountering an RVE that is one of the group having similar detail. This may lead to the use of the various probabilistic methods to calculate component life (based on the particular circumstances).

The probabilistic method used in determining cycle to failure for each nucleation site 766, providing values for random variables 762 (FIGS. 25-27), 764, 768, and estimating RVE fatigue life 774 include Fast Probability Methods (FPM) and Simulation Methods (ST). FPM techniques include response surface FPM and direct FPM. Direct FPM methods will always provide a solution, but when a response surface may be used its use can increase the efficiency of the prediction calculations. A response surface, however, cannot be formed when considering variables that vary with cycles/time and, thus, present discontinuities. Direct FPM are then necessary, although such variables may possibly be handled using multiple nested response surface equations, a single response surface equation will not suffice.

Other potential FPM approaches include First Order Reliability Methods (FORM), Second Order Reliability Methods (SORM), Advanced Mean Value (AMV) methods, and Mean Value (MV) methods. Potential ST approaches include Monte Carlo (MC) and importance sampling. MC methods are used in an embodiment of the technology for simulating components using the microstructure-based failure models for the RVE's 760.

The methods described herein are preferably performed by a suitably programmed computer. The computer, as further described herein, is preferably a portable, desktop, or workstation type apparatus having a dedicated user interface. Such computers include systems known as Personal Computers (PC's), workstations, and laptop or notebook computers. Additionally, the methods of the invention may be practiced on networked computers, CPU-clusters, and so-called mainframe computers.

It is therefore consistent with the description herein that the various methods are implemented, in the form of computer program instructions, and executed on a computer. Suitable programming languages for expressing the program instructions include, but are not limited to, one or more languages selected from the group consisting of: C, C++, a variant of FORTRAN such as FORTRAN77 or FORTRAN90, Java, Visual Basic, Perl, Tcl/Tk, JavaScript, and ADA, or even a scripting or non-compiled language. It is to be understood that various aspects of the methods may be written in different computing languages, where such languages are preferred for particular applications, and the various aspects are caused to communicate with one another by appropriate system-level tools available on a given computer.

The computer program instructions can be stored in a computer memory during execution, and may additionally be stored on any of various forms of computer-readable media known in the art, such as, but not limited to, CD-Rom, flash memory such as SD-cards or compact flash cards, DVD-Rom, optical discs, and high capacity storage drives, both stand-alone and networked. It is thus consistent with ordinary practice of the present invention that the computer program instructions can be delivered to a user on a transferable medium such as a CD-Rom, and also delivered over a computer network, such as by downloading over the Internet through a web-interface, or made available via a file-sharing system on a local network.

FIG. 1 shows a schematic of a general-purpose computer system 500 suitable for practicing the methods described herein, such as predicting the failure of an electronic component. The computer system 500, shown as a self-contained unit, comprises at least one data processing unit (CPU) 522, a memory 538, which will typically include both high speed random access memory as well as non-volatile memory (such as one or more magnetic disk drives), a user interface 524, a disk 534 optionally controlled by a disk controller 532, and at least one optional network or other communication interface card 536 for communicating with other computers as well as other devices, such as via a high speed networking cable, or a wireless connection. At least the CPU 522, memory 538, user interface 524, disk controller 532 and network interface card 536, communicate with one another via at least one communication bus 533.

Memory 538 stores procedures and data, typically including some or all of: an operating system 540 for providing basic system services; one or more application programs 556, such as finite element analysis routines 552, and such as user level programs for viewing and manipulating images, calculating geometric representations of objects, and manipulations thereof; authoring tools (not shown in FIG. 28) for assisting with the writing of computer programs; a file system 542, one or more user interface routines 546 for handling communications with a user via user interface 524, database routines 544 to manipulate one or more databases 550 that store three-dimensional and property data for materials, and other information, optionally graphics routines 554 for controlling display of data and electronic components, preferably including manipulatable three-dimensional images of materials, and optionally a floating point coprocessor 548 where necessary for carrying out high level mathematical operations. The methods of the present invention may also draw upon functions contained in one or more dynamically linked libraries, not shown in FIG. 28, but stored either in memory 538, or on disk 534.

Figure 28:
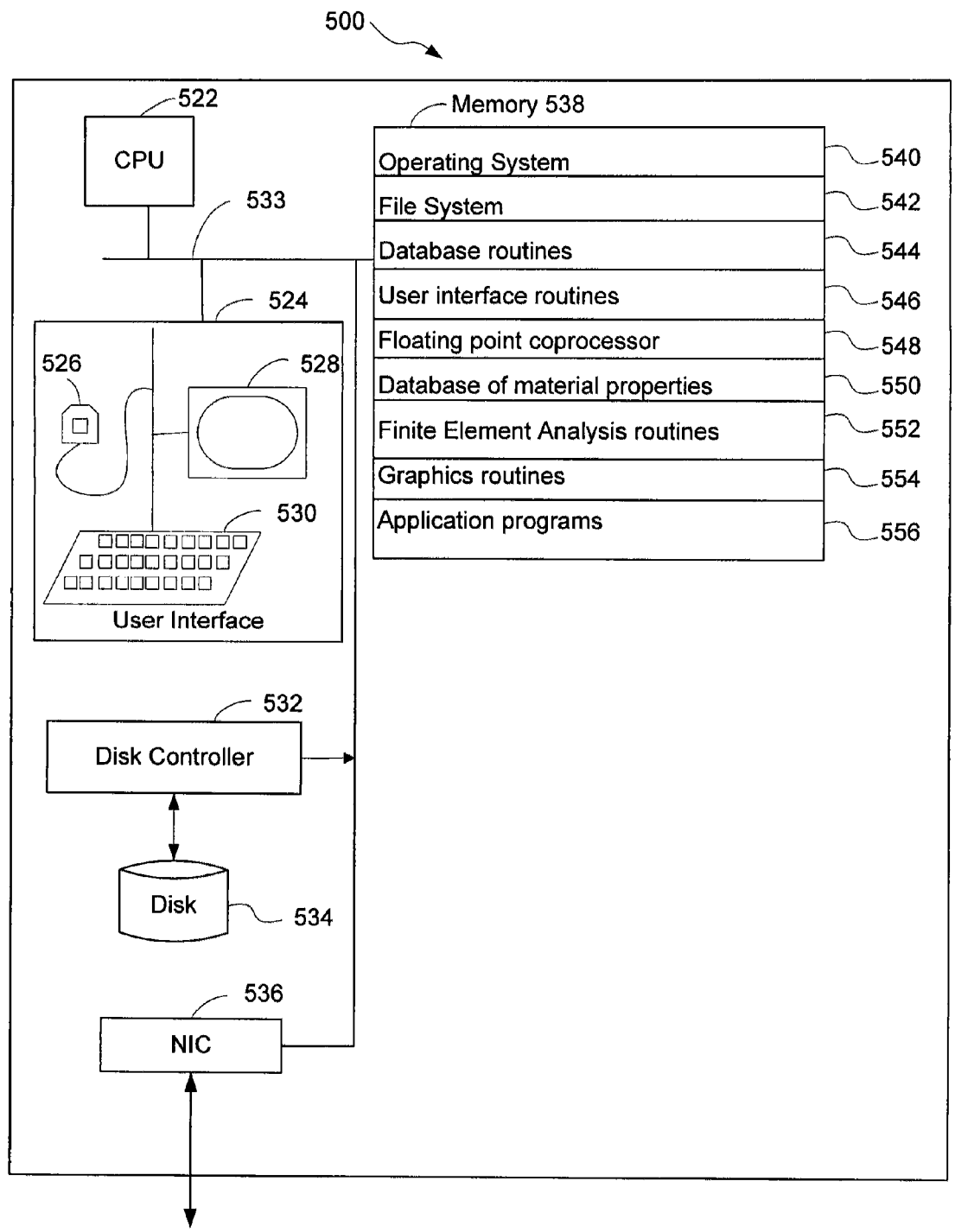
FIG. 28 is a diagram of a computer apparatus for predicting the failure of a component that incorporates a preferred embodiment of the present technology.

The database and other routines shown in FIG. 28 as stored in memory 538 may instead, optionally, be stored on disk 534 where the amount of data in the database is too great to be efficiently stored in memory 538. The database may also instead, or in part, be stored on one or more remote computers that communicate with computer system 100 through network interface card 114.

User interface 524 may include one or more of a mouse 526, display screen 528, keyboard 530, touchpad (not shown), stylus (not shown), and speech recognition unit (not shown).

Memory 538 is encoded with instructions for receiving input from a user and for simulating an electronic component life, preparing statistics 112, and displaying the prediction 116. Instructions include programmed instructions for performing one or more of: receiving input describing the component's material characteristics, and values for other variables necessary to predict failure, such as the types of materials to simulate ; using a microstructure-based failure model to simulate the life of RVE's by establishing the density and number of nucleation sites within an RVE; determining the cycles/time to failure for each nucleation sites within the RVE; establishing an RVE life for each RVE based on the cycles/time to failure for each nucleation site; predicting the life of the simulated component 110 based on the established RVE lives; preparing statistics to describe a group of predictions; comparing statistics to a previously input Probability of Failure (POF) criterion; and displaying an output of the calculations.

The principles of the present technology are further illustrated by the following examples. These examples describe possible preferred embodiments for illustrative purposes only, they do not limit the scope of the technology as set forth in the appended claims.

EXAMPLES

Example 1

Exemplary Software

Methods for predicting fatigue failure in components of products are available in a proprietary virtual prototyping software tool, VPS-MICRO™, available from Vextec Corporation, that allows the simulation of real material behavior.

Example 2

Automobiles

The amount of electronic content in automobiles is expected to double by the end of this decade, bringing it to about 30% of the cost of the vehicle. Electronics inside an automobile are delivered in the form of modules known as electronic control units (ECU's). These are actually boards containing chips, usually in a housing that protects the delicate electronics from the hostile environment of a car. A modern high-end car can have as many as 80 or 90 separate ECU's.

Example 3

Overall Automobile System Reliability

Integrated vehicle test simulation software for prediction of overall vehicle and fleet reliability has been tested. This methodology is based on conventional system-level reliability estimation techniques (e.g., Dey, A., Tryon, R., Rudy, R., and Forrest, M., "Automotive System Reliability Simulation Software," *Huntsville Simulation Conference*, September, 2000). Integration of this approach with the fatigue simulation as described herein can also be accomplished. The system-level reliability "roll-up" methodology uses existing failure data, test data or reliability estimates for the various elements that make up the system. The simulation virtually "cycles" or tests the specified number of systems.

If, as in the case of the automotive world, systems are repaired or replaced as failures occur, simulation can use data associated with that. Real world maintenance sometimes replaces a number of cooperating system elements after the failure of an individual element (e.g., a display unit such as a LED may be replaced along with a failed ECU). The simulation approaches described herein allow for replacement of related or connected groupings of system elements. Such groupings can be manually incorporated, or could be automatically incorporated based on historic knowledge about maintenance practices or warranty specifications that are built into the process.

A Monte Carlo process is used to simulate the testing or virtual driving of the user-defined number of systems. Besides reliability metrics for each system element, the Monte Carlo simulation process uses the following input: the number of systems to be simulated (relationship to simulation accuracy); and the mileage or time to which each system is to be tested (metrics for results comparisons such as 36,000 miles).

When an element within the system has a simulated failure, the incident is recorded and the system is repaired virtually until simulation proceeds to user-defined target mileage (or time, on/off cycles, etc.). Thereafter, the next system is simulated and tested similarly. This process continues until the desired simulation accuracy (user defined number of systems to be simulated) is achieved.

For system elements with no historic data (new products), DaimlerChrysler reliability engineers have effectively used test data and/or reliability estimates in order to conduct a roll-up. They have even found that the simulation can be used as an effective forecaster when some of the failure predictions are questionable or sketchy. For example, the simulation can be made using min./max. estimates for elements with unknown exact reliability metrics. This effectively bounds the reliability prediction and provides at least some insight about reliability driving parameters so that focused testing or analysis can be conducted cost effectively.

Example 4

Use of Finite Element Analysis

An OEM designer uses FEA to translate loading conditions to the applied stress state for a geometrically complex design. Software configured according to methods herein accepts the input of the geometry tolerances and residual stresses in the form of simple statistical descriptions. The global FEA stresses are superimposed on a representative volume element (RVE) 3-D microstructural model for each node of the global FEA.

A reality of cost effective manufacturing is the inherent difficulty in controlling complex component microstructural variation. It is typical that the material microstructure will be different at different locations within the component.

Each location on the forging has a different microstructure and therefore a different strength. A casting with a complex cross section would be expected to have similar variations. The reliability of each RVE is determined using the appropriate probabilistic fatigue algorithms for the selected material. The analyses for all the individual RVE's are combined using standard industry system reliability modeling techniques to determine the fatigue reliability of the entire component. If the RVE are statistically independent, the system reliability is the union of the RVE reliabilities. If the RVE are statistically dependent, the system reliability can be determined using correlated Monte Carlo simulation. This results in prediction of fatigue reliability as probability of failure relative number of cycles or time or even the probability of exceeding a fatigue threshold.

Example 5

Future Electronics Design for Reliability

Reliability Roll-up

Overall vehicle electronics are a system of individual modules. A vehicle OEM has historic warranty records, test results, or engineering reliability estimates. Taking advantage of this data, the reliability analysis approach described herein will serve to identify those modules which most critically define overall vehicle reliability, so that reliability specification goals can be established for Tier I contracts (i.e., those contracts between an OEM and from a source for purchase of a primary component).

Figure 29:
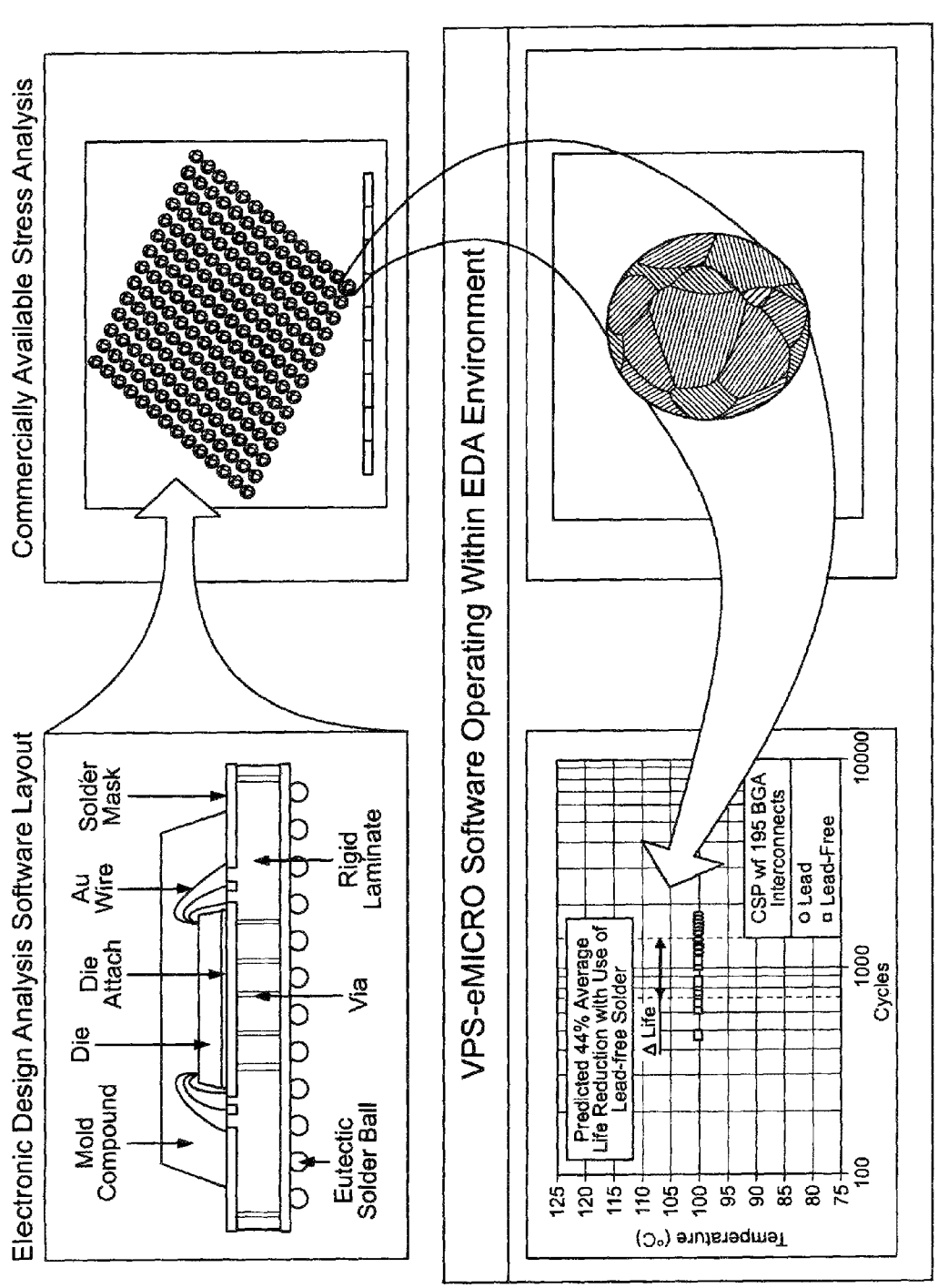
FIG. 29. Physics of failure simulation within EDA framework.

Tier I electronic modules, such as automotive ECU's, are made up of any variety of printed circuit boards (PCB's) as shown in FIG. 29, devices (e.g., monitors, controllers) and connections. When an individual board is found to be compromising overall vehicle (fleet) reliability, corrective action can include either re-engineering a board within the ECU, or procuring a similar board from an alternative supplier to achieve desired reliability.

At the PCB supplier level, interconnect reliability is a primary cause of overall board failure. Interconnects are made of various materials (e.g., lead or lead-free) and material suppliers provide sources of variability that impact interconnect reliability (e.g., variation in grain size, defect populations). Predictions from EDA and/or FEA software already used within the electronics design space establish "global" stresses. As shown in FIG. 29, global stress can be translated to the material level and material specific failure physics algorithms (discussed herein) can be used to predict interconnect life or reliability. Given this, when a designer changes a chip scale package (CSP) within the board layout, then the stresses imposed on the CSP will change as well as the associated life prediction. Interconnect design immediately rolls up to establish PCB reliability, which rolls up to establish module reliability which establishes overall vehicle electronics reliability.

When adopted, such methods can reduce overall engineering costs, while providing far more insight into reliability drivers than current methods.

In some instances an product, such as a circuit board, comprises a number of components that are each modeled by separate, different finite element models. In such cases, a roll-up of lifetime predictions for each component to an overall lifetime prediction for the product relies on methodology described elsewhere, e.g., U.S. patent application Ser. No. 10/636,887, to Nasser et al., filed Aug. 7, 2003, and incorporated herein by reference.

Figure 47:
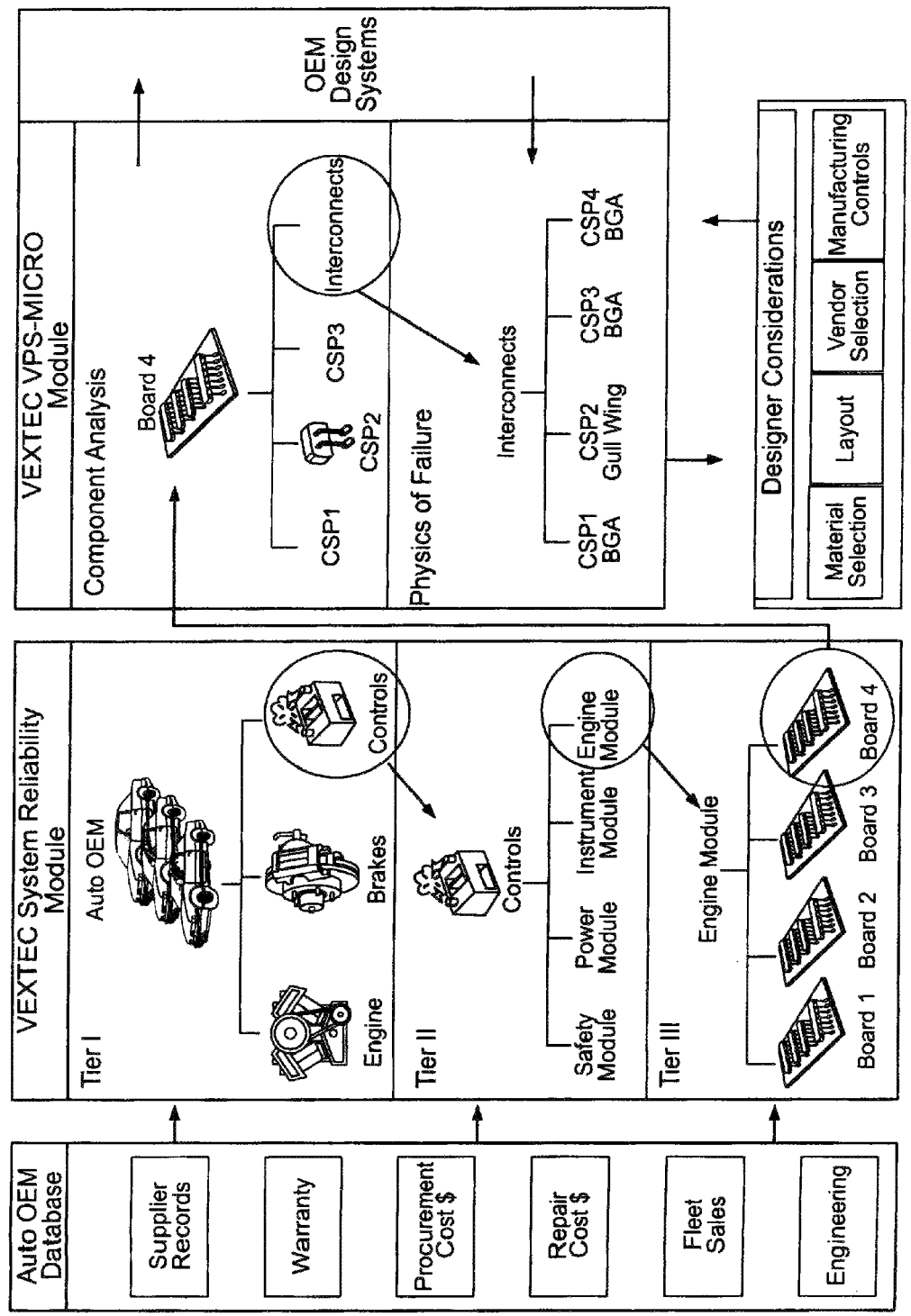
FIG. 47: Future desktop computational reliability modeling (DCRM) vision.

As shown in FIG. 47, this approach incorporates the described system-level reliability roll-up and material failure physics modeling as an integrated software approach. Simulations are based on data stored within the OEM systems. This includes reliability, engineering, product cost, and repair cost information. The appropriate information is rolled-down to provide the input for physics of failure modeling. The described material-based failure physics simulation can be conducted within the OEM design environment where rationalized engineering trade-offs can be assessed in timely fashion.

In FIG. 47, the system reliability module uses information about products from a number of tiers. The lowest tier contains a number of boards. Boards 1-3 can be modeled with test data, for example. Board 4, for example, is simulated by the component analysis and physics of failure methods as further described herein. Failure data from the Auto OEM database is input to the system reliability module as part of the overall system prediction analysis.

Example 6

Analysis of BGA

Figure 54:
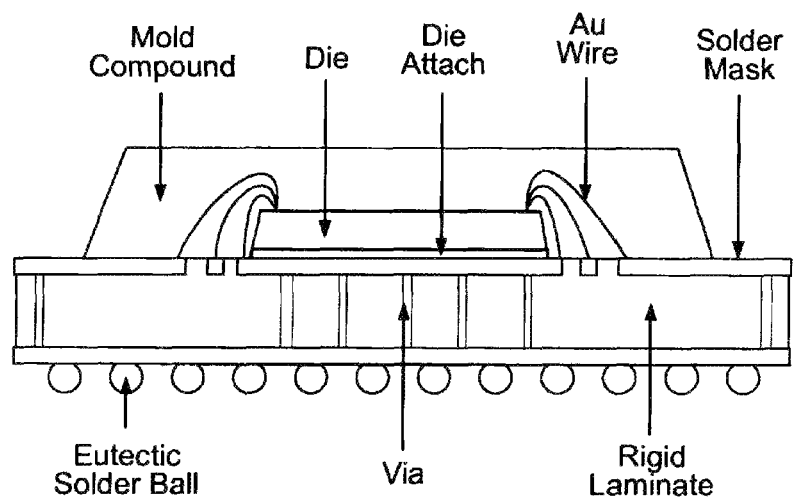
FIG. 54: BGA chip.
Figure 54:
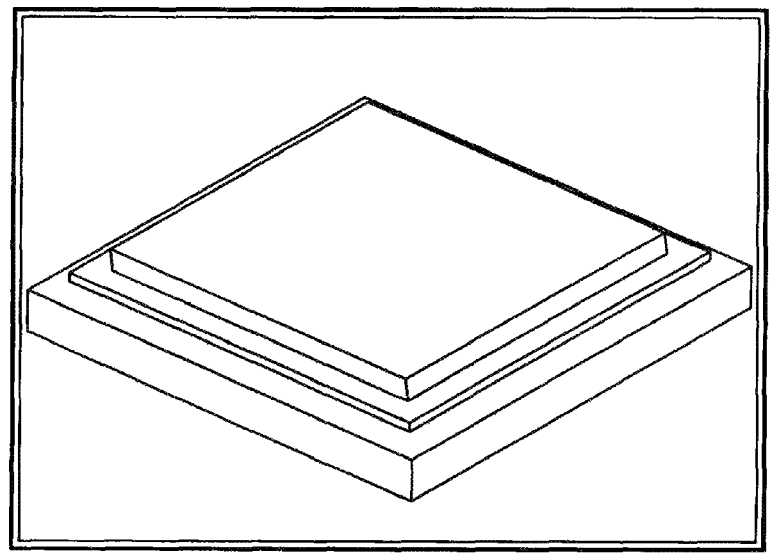

Finite element analysis can be used to obtain stress distributions and stressed areas of a ball grid array (BGA) having 196 solder joints in a 14×14 array. A cross-section, and a perspective view of the chip is shown in FIG. 54. Statistical modeling of microstructure can be used to obtain distribution of grain level stresses. A microstructural fatigue life model is applied to identify critical sites of failure. The overall steps are outlined in FIG. 29. A global model of the whole component is constructed and used in a single finite element analysis. RVE's are constructed for the eutectic solder balls because that is where failure predominantly occurs. Each ball is an interconnect.

A phase coarsening algorithm, as described herein, was implemented to vary grain size with cycling. Stress distribution due to inter-metallic layering was obtained by modeling of the inter-metallic layers.

Material properties and operating conditions were adopted from literature values. Material properties for the BGA finite element model were as in Table 9, (taken from, e.g., B. A. Zahn, 'Solder joint fatigue life model methodology for 63Sn37Pb and 95.5Sn4Ag0.5Cu materials,' *Electronic Components and Technology Conference*, pp. 83, (2003), incorporated herein by reference).

TABLE 9

|  | 63Sn37Pb | 95.5Sn4Ag0.5Cu | FR4 | Mold Substrate | Mold Compound |
| --- | --- | --- | --- | --- | --- |
| Length (m) | 4.60E−04 | 4.60E−04 | 0.017 | 0.015 | 0.013 |
| Width (m) | 4.60E−04 | 4.60E−04 | 0.017 | 0.015 | 0.013 |
| Height (m) | 3.09E−04 | 3.09E−04 | 1.66E−03 | 3.60E−04 | 8.50E−04 |

TABLE 9-continued

|  | 63Sn37Pb | 95.5Sn4Ag0.5Cu | FR4 | Mold Substrate | Mold Compound |
| --- | --- | --- | --- | --- | --- |
| Ex (Mpa) | 30000 | 41000 | 15973 | 2200 | 21710 |
| Ey (Mpa) | — | — | 15973 | — | — |
| Ez (Mpa) | — | — | 7036 | — | — |
| Gxy (Mpa) | — | — | 7205.9 | — | — |
| Gyz (Mpa) | — | — | 3142.1 | — | — |
| Gxz (Mpa) | — | — | 3142.1 | — | — |
| PRxy (Mpa) | 0.4 | 0.38 | 0.11 | 0.2 | 0.25 |
| PRyz (Mpa) | — | — | 0.39 | — | — |
| PRxz (Mpa) | — | — | 0.39 | — | — |
| CTEx (1/C) | 2.60E−05 | 2.00E−05 | 1.60E−05 | 1.50E−05 | 9.50E−06 |
| CTEy (1/C) | — | — | 1.60E−05 | 1.50E−05 | — |
| CTEz (1/C) | — | — | 8.40E−05 | 5.80E−05 | — |

The finite element analysis of the BGA is carried out as follows: input CTE and other material properties for the printed circuit board; bulk solder properties (63Sn37Pb or 95.5Sn3.5Ag1Cu), laminate, and mold compound; apply a uniform temperature change; and obtain induced strains and stresses in each solder joint in the ball grid array.

Figure 55:
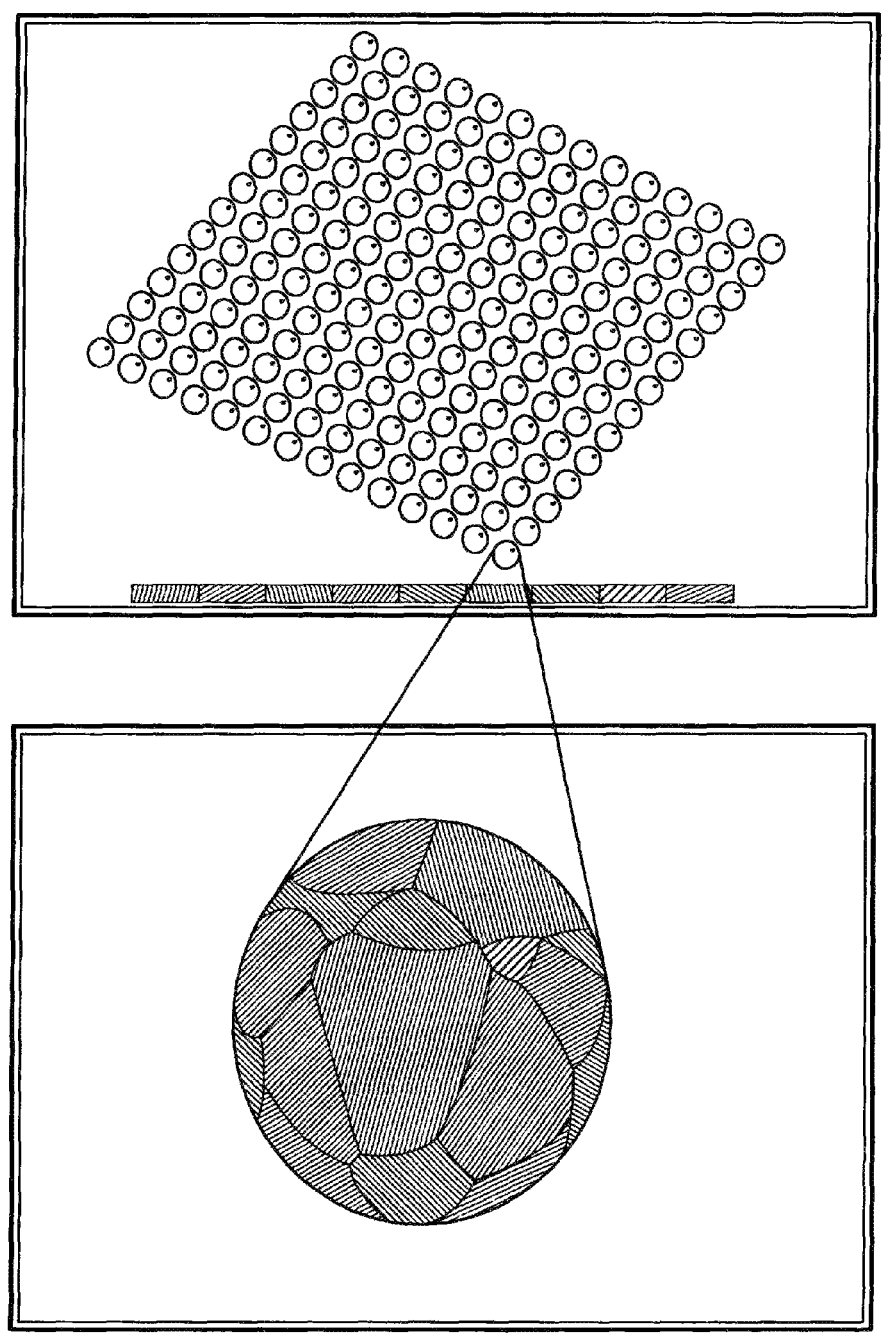
FIG. 55: finite element model and RVE of a BGA chip.
Figure 56:
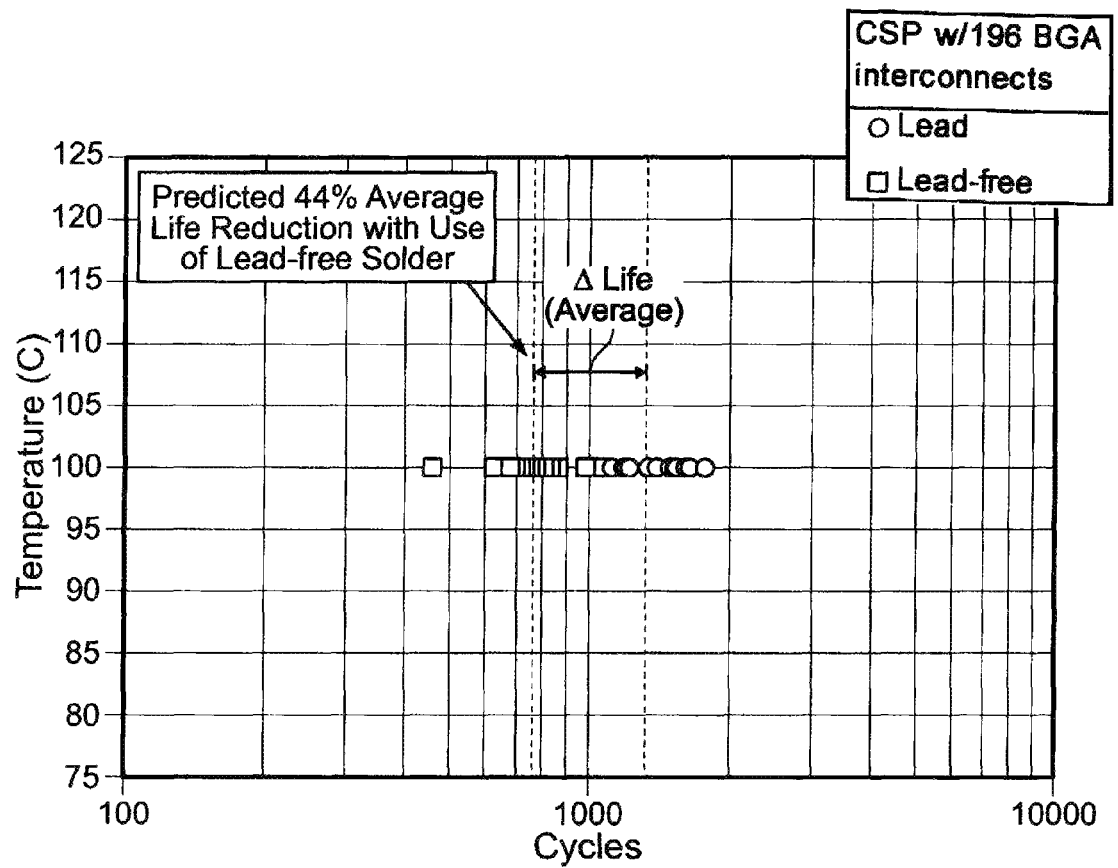
FIG. 56: predicted lifetime of BGA solder.

Predictions for the BGA are shown in FIG. 56. These predictions are consistent with a finding that lead solder is better in fatigue at lower strain ranges but lead-free better at higher strain ranges. The finite element analysis and RVE are shown in FIG. 55.

Example 7

Interconnect Fatigue Simulation

Global Modeling

Figure 30:
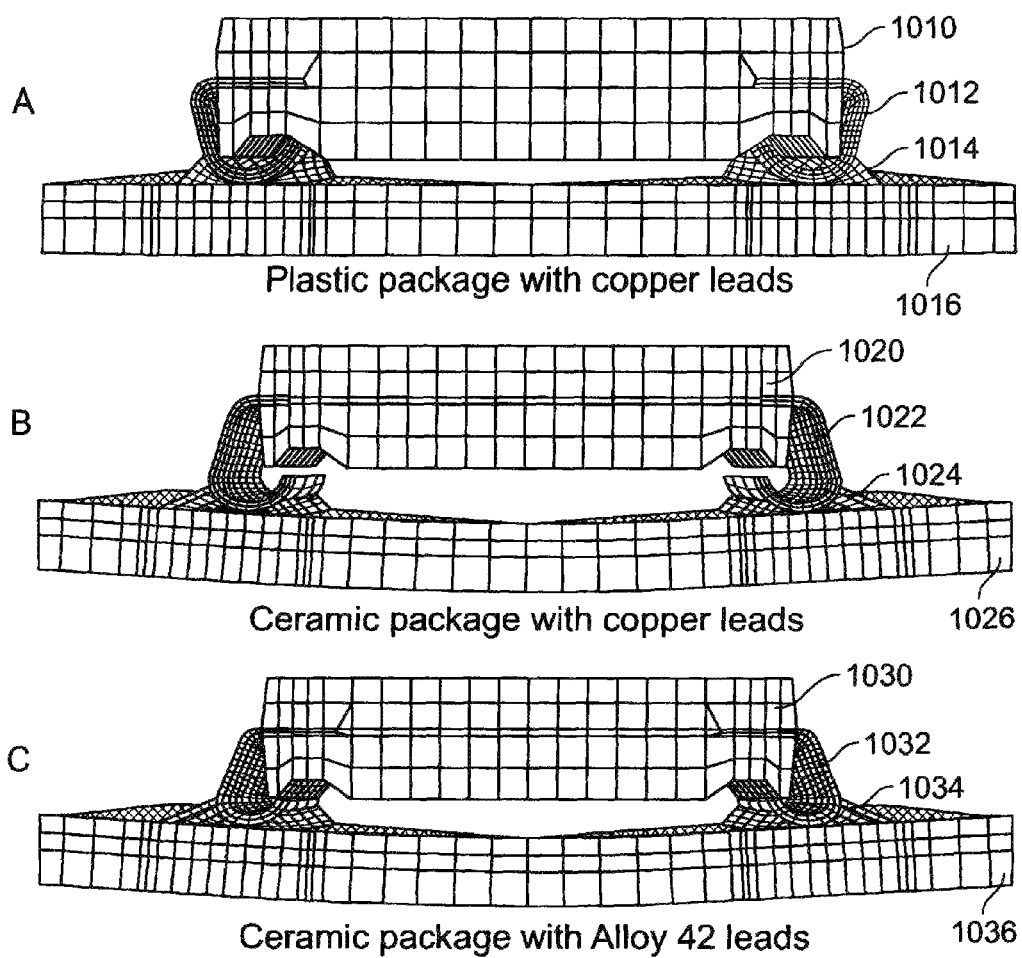
FIG. 30: A variety of lead connection configurations.

A thermo-mechanical stress analysis for a J-leaded device for several different packages with different material layering combinations was performed. FIG. 30 shows side on views of examples of chip packages having different types of materials that can be used in a finite element model. In this model an Alloy 42 (a common non-Cu alloy for making conductive leads) lead is soldered to a FR-4 circuit board (as is typically used in the industry) with a copper metallization layer. Panel A of FIG. 30 shows a plastic chip package 1010 with copper leads 1012 connected to circuit board 1016, with solder 1014. Panel B of FIG. 30 shows a ceramic chip package 1020 with copper leads 1022 connected to circuit board 1026 with solder 1024. Panel C of FIG. 30 shows a ceramic chip package 1030 with Alloy 42 leads 1032 connected to circuit board 1036 with solder 1034. For each of the products shown in the panels of FIG. 30, it is possible to model each part (packaging, solder, etc.) with different models of fatigue according to the mechanisms prevalent in the respective materials. Thus, for example, a model of crack growth can be deployed only for the solder, with the remaining components modeled without attempting to predict cracking. The effect of heating on each of the packages in panels A-C can be modeled. It can be seen that the circuit boards in panels B and C are both predicted to bend under the influence of heat, because the ceramic chip packages used for each are particularly rigid under those conditions, and in each case, the bending of the circuit board places stress on the solder.

Figure 31:
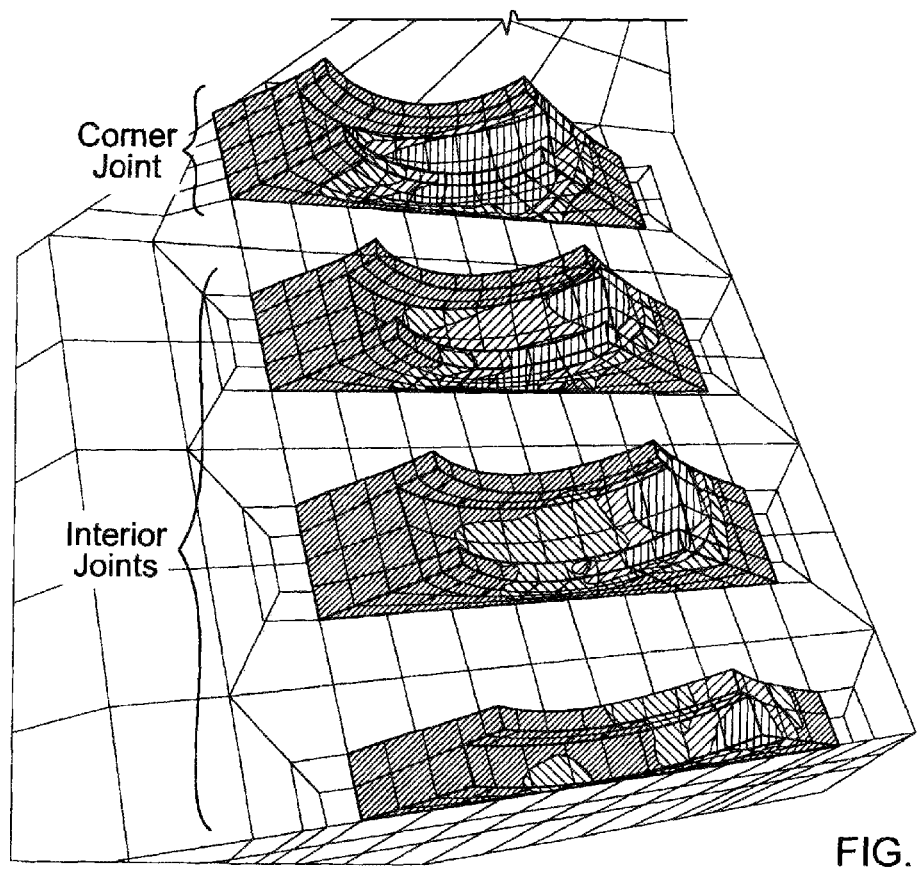
FIG. 31: Thermal induced strains vary depending on whether edge (top most) or inner device connection location.

FIG. 31 shows an example of the global strain response of a selection of the solder joints for the condition displayed in FIG. 30, panel B. The topmost (corner) solder joint has the highest strain and the interior joints have lower strains. For the feasibility demonstration described later herein, only the corner joint was simulated since it has the highest stresses and can be considered a representative example.

Example 8

Integrated Approach to Reliability-based Design of Future Electronics Systems (Physics of Failure Validation)

Interconnect Solder Material Fatigue Simulation Results

Figure 32:
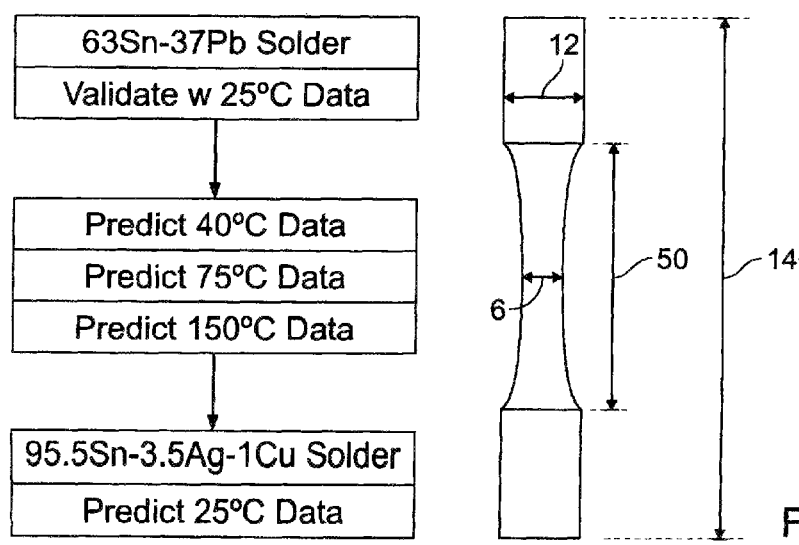
FIG. 32: Process used for predicting lead and lead-free solder fatigue (left panel), and sample of solder (right panel), respectively.

This example documents success in predicting lead solder fatigue response at high temperature based on model development with room temperature data (see, e.g., Nasser, L., Krishnan, G., Tryon, R., "Electronic Material Microstructural, Variability-Based, Total Life Fatigue Prediction Approach," *Intelligent Processing & Manufacturing of Materials Conference*, Jul. 19-23, 2005). Thereafter, as indicated in FIG. 32 (left panel), it was assumed that the same failure mechanisms driving lead solder response were active in lead-free response, and fatigue predictions were also made for lead-free solder material. FIG. 32 (left panel) shows the steps taken in the approach to modeling lead solder at room temperature, higher temperatures, and then lead-free solder at room temperature. FIG. 32 (right panel) shows a model of a piece of solder, as used herein. Specimens were made having the geometry shown, for both compositions. Although not shown, the cross-section of the solder is cylindrical.

The first step was to develop an input library for solder alloys to provide the appropriate input parameters for simulation of damage mechanisms at the microstructural scale.

Figure 33:
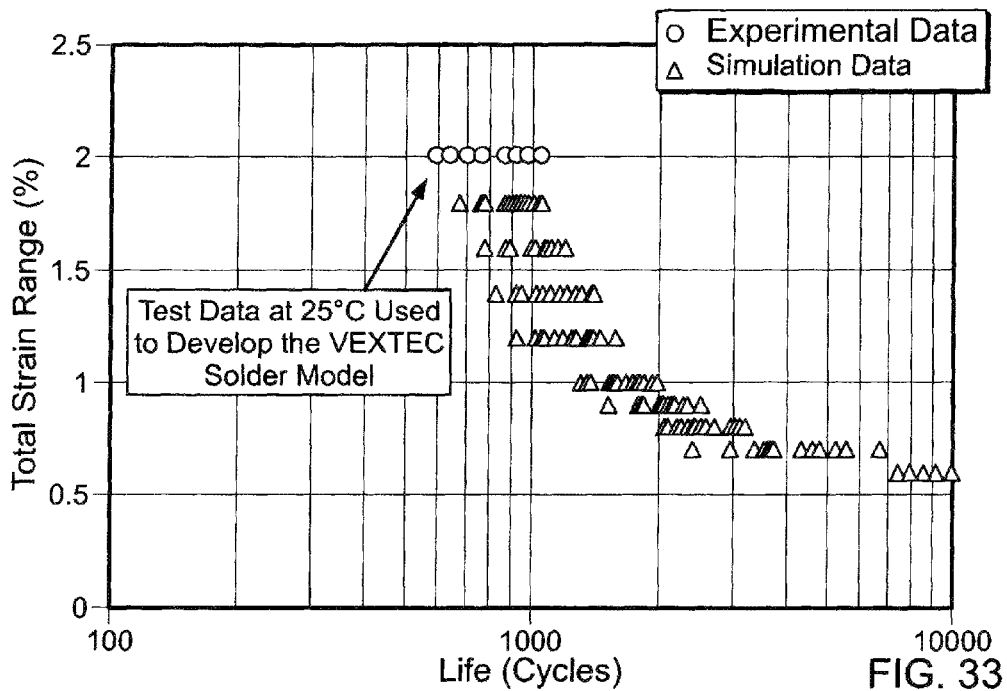
FIG. 33: Fatigue simulation for 63Sn37Pb at 25° C., 1 Hz.

The simulation procedure accounts for variations in material parameters such as grain size, grain orientation, crack growth coefficients and inherent strength of the grains. Since 63Sn-37Pb eutectic solder alloy has been extensively studied by the electronics industry, this material was a logical starting point. Material performance data on this alloy are widely available at various temperatures and frequencies. Table 3 presents a listing of the model input parameters used for 63Sn-37Pb simulations along with the references from which the data came. As indicated in Table 3, values for some parameters could not be found in the available literature. Therefore, engineering judgment was used to estimate values for these parameter, and fatigue was predicted for a strain range of 2%. Initial predictions with the methods described herein were compared to experimental data at 25° C. and 2% strain range (see J. H. L Pang, B. S. Xiong, and T. H. Low, 'Low cycle fatigue models for lead-free solders,' *Thin solid films*, Vol. 462, p. 408, (2004)). Thereafter these few parameters were further adjusted until the model successfully replicated these limited experimental data at 25° C. Upon achieving satisfactory results at 2% strain range, the complete 25° C. S-N (strain range—number of cycles to failure) curve was predicted for lower strain ranges (FIG. 33). Unfortunately no experimental data was available to compare with these predictions. As shown in FIG. 33, the method (as embodied in a program such as VPS-MICRO™) predicts the expected scatter in fatigue life, thereby demonstrating that the techniques described herein can account for actual microstructural variability that exists in solder materials.

TABLE 3

Input parameters used in simulation of lead solder fatigue.

| Parameter | Reference |
| --- | --- |
| Bulk shear modulus | Siewert et al. |
| Poisson's ratio | Siewert et al. |
| Grain size and phases | Liu et al. |
| Small crack growth coefficient | Unknown |
| Long crack growth coefficients | Zhao et al. |
| Frictional strength (Yield strength of the grain) | Siewert et al. |
| Grain boundary SIF | Zhao et al. |
| Orientation factor | Assumed |
| Specific fracture energy | Unknown |

Literature citations for work referenced in the table are as follows: X. W. Liu, and W. J. Plumbridge, 'Thermomechanical fatigue of Sn-37 wt. % Pb model solder joints,' *Materials Science and Engineering*, Vol. A362, pp. 309, (2003); J. Zhao, Y. Mutoh, Y. Miyashita, and L. Wang, 'Fatigue crack growth behavior of Sn—Pb and Sn-based lead-free solders,' *Engineering Fracture Mechanics*, Vol. 70, pp. 2187, (2003); and T. Siewert, S. Liu, R. D. Smith, C. J. Madeni, 'Properties of lead-free solders, release 4.0,' National institute of standards and technology and Colorado school of Mines, (2002), all of which are incorporated herein by reference in their entirety.

Figure 34:
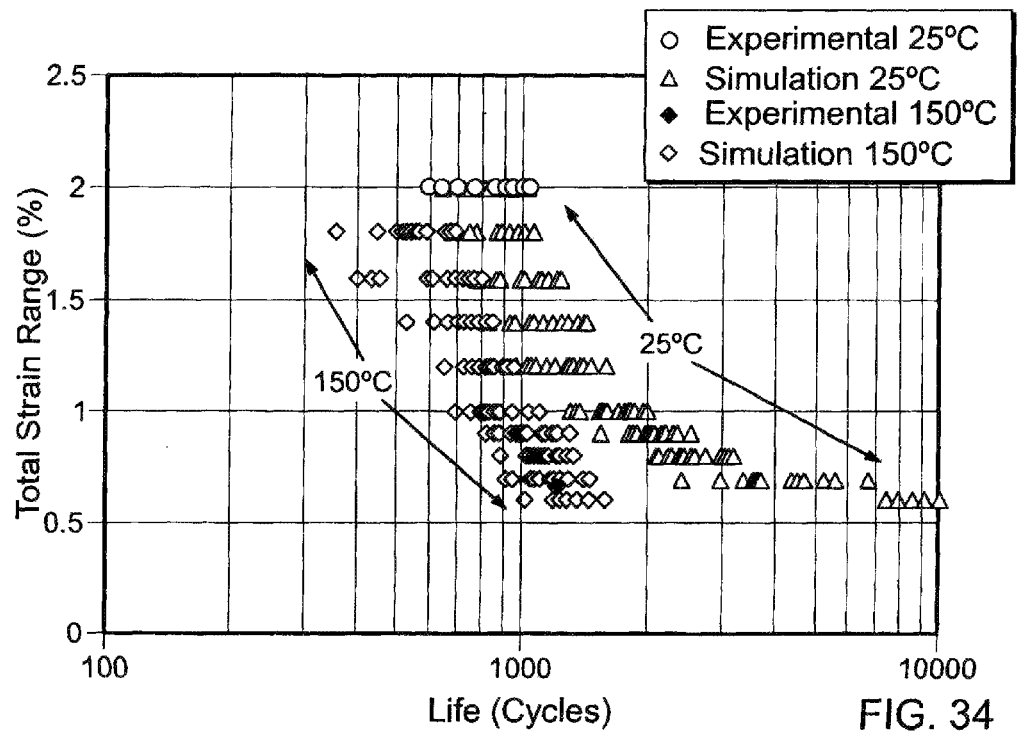
FIG. 34: Comparison of 63Sn37Pb fatigue predictions at 25° C., 1 Hz and 150° C., 1 Hz.

This model, developed based on 25° C. data, was then used to make higher temperature predictions for the same SnPb solder alloy. This was accomplished by first studying the effect of temperature on the material properties of the SnPb solder and making appropriate modifications to model input parameters. FIG. 34 shows the comparison of the predictions at 25° C. and 150° C. (Data from FIG. 33 is replicated on FIG. 34 to facilitate comparison.) Through the open literature, a single 150° C. fatigue test data point was accessed for this material. As shown in FIG. 34, this data point falls within the expected scatter at approximately 0.7% strain range. This suggests that the model can successfully simulate solder temperature effects. As expected, the 150° C. fatigue lives are lower than those at 25° C. It is interesting to note that the model predicts that the effect of temperature is more pronounced at lower strain ranges than at higher ones.

Figure 35:
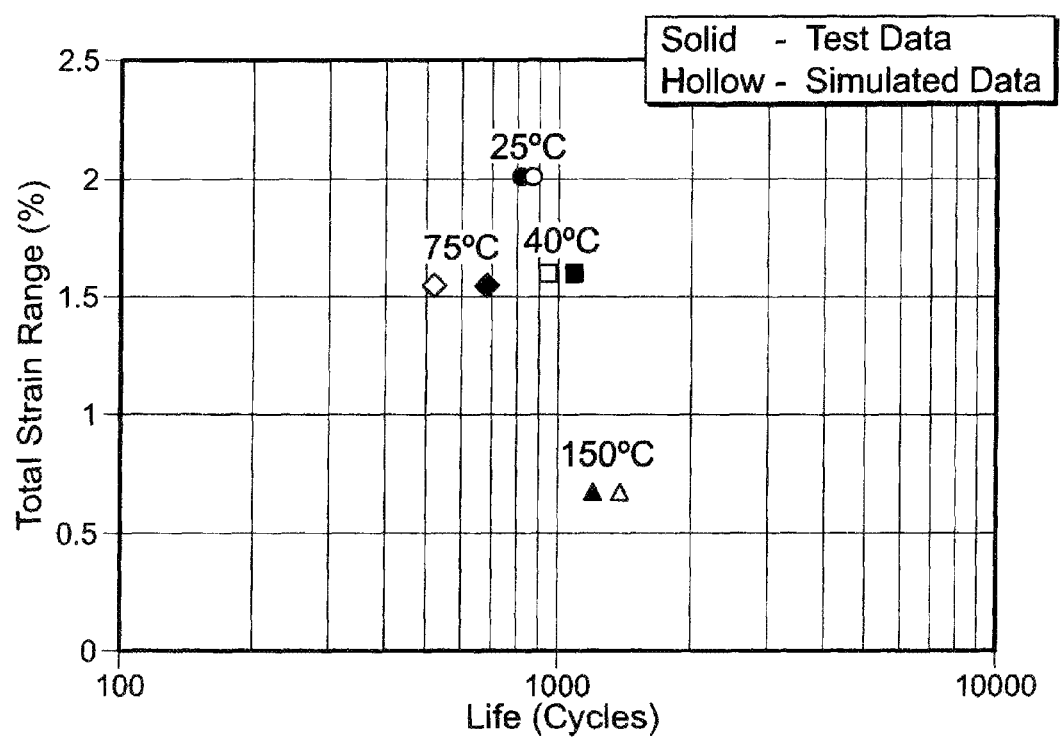
FIG. 35: Comparison of mean simulation values with test data at various temperatures.

Simulations were also made at 40° C., 1 Hz and 75° C., 1 Hz since a single test data point was obtained for each of these temperatures. Again, the actual fatigue test point was within the predicted scatter for the appropriate strain range; therefore, the method, as embodied in software such as VPS-MICRO™, appears to be successfully predicting temperature effects on solder fatigue life. FIG. 35 presents a comparison of the mean predicted life with experimental data at the appropriate strain range. Furthermore, the simulated data in FIG. 35 neither consistently under-estimates nor consistently over-estimates the experimental values, thus showing that there is no bias in the model.

Prediction of Lead-Free Solder

As stated previously, it was assumed that the same failure mechanisms driving lead solder response were active in lead-free response. Therefore the inputs were only modified to account for collected information about microstructural properties (e.g., grain size) and bulk material properties. Thereafter fatigue predictions for lead-free solder material were made, e.g., using a program such as VPS-MICRO™. Since the national electronics manufacturing initiative (NEMI) has suggested that 95.5Ag-3.5Sn-1.0Cu solder has promising characteristics for widespread electronics industry use, that material was selected for evaluation. The properties the input parameters used are listed in Table 4 (see also Nasser, L., Tryon, R., and Krishnan, G., "Electronic material, variability-based, total life fatigue prediction approach," Intelligent Processing and Manufacturing of Materials Conference, (2005)).

Some parameters did not change from those used for lead material predictions. This was either purposeful or just due to lack of reliable information about what they should be.

TABLE 4

Input parameters required for simulation of lead-free solder fatigue.

| Parameter | Reference |
| --- | --- |
| Bulk shear modulus | Modified based on data in Siewert et al. |
| Poisson's ratio | Modified based on data in Siewert et al. |
| Grain size and phases | Modified based on data in Amagai et al. |
| Small crack growth coefficient | Unchanged |
| Long crack growth coefficients | Changed based on data in Zhao et al. |
| Yield strength of the grain | Unchanged |
| Grain boundary SIF | Modified based on Zhao et al. |
| Orientation factor | Assumed |
| Specific fracture energy | Unchanged |

Literature citations for works referenced in the table are: M. Amagai, M. Watanabe, M. Omiya, K. Kishimoto, and T. Shibuya, 'Mechanical characterization of Sn—Ag based lead free solders,' *Microelectronics Reliability*, Vol. 42, pp. 951, (2002); J. Zhao, Y. Mutoh, Y. Miyashita, and L. Wang, 'Fatigue crack growth behavior of Sn—Pb and Sn-based lead-free solders,' *Engineering Fracture Mechanics*, Vol. 70, pp. 2187, (2003); and T. Siewert, S. Liu, R. D. Smith, C. J. Madeni, 'Properties of lead-free solders, release 4.0,' National institute of standards and technology and Colorado school of Mines, (2002), all of which are incorporated herein by reference in their entirety.

Figure 36:
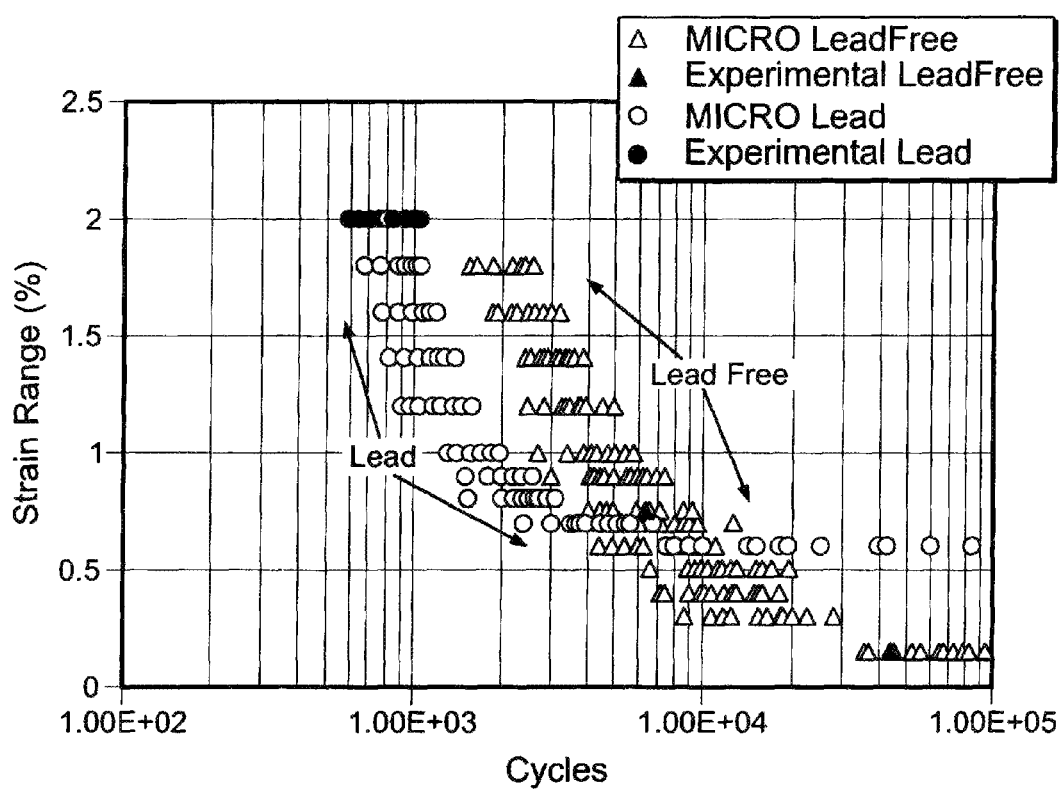
FIG. 36: Comparison of lead and lead-free solder predictions at 25° C., 1 Hz.

Fatigue predictions at 25° C., 1 Hz were made and compared with limited experimental data available in Pang, et al. (*Materials Science and Engineering A*, 307, pp. 42-50, (2001)). As shown in FIG. 36, predictions accurately capture the two experimental data points presented in Pang, et al. Along with the lead-free predictions, the earlier presented lead solder predictions of total strain at 25° C. are shown in FIG. 36. The simulations show a very interesting feature, the lead and lead-free fatigue lives cross over. This suggests that lead solder actually performs better than lead-free solder at lower strain ranges. One possible reason for this could be the strain hardening effect that occurs when the lead-free solder material is at room temperature. This strain hardening nature was observed in one hysteresis loop assumed to be the cycle at half life. Further data on cyclic hardening is needed to verify the strain hardening phenomenon. Further it should be noted that the results shown here are for a laboratory material specimen and not for an actual solder joint geometry. For an actual solder joint, other issues such as thermal residual stresses, and inter-metallics (interface layers between alternating layers of metals, shown as different colored layers in FIG. 17), play a role influencing fatigue life.

Figure 37:
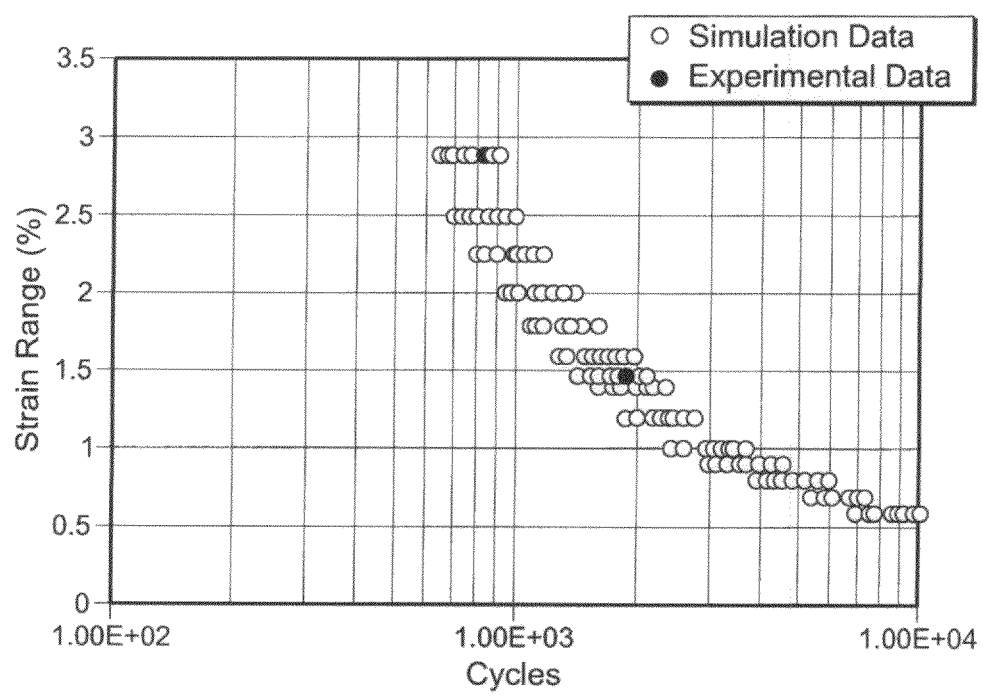
FIG. 37: Lead-free solder predictions at 125° C., 0.001 Hz.

The final step in this process was to verify that the methods could successfully predict the effects of temperature on lead-free solder fatigue. Fatigue predictions at 125° C., 0.001 Hz lead-free solder are presented in FIG. 37. Within VPS-MICRO, only the material properties were modified to account for the temperature and frequency change effects. As shown, these predictions compare well with single experimental result obtained from Pang, et al. (*Materials Science and Engineering A*, 307, pp. 42-50, (2001))

Example 9

Solder Simulation

There are many sources of stress to be considered when modeling solder joints. For example, movement of a vehicle or sudden acceleration of a component will affect stresses on every solder joint within it. Vibration caused by acoustic noise, wind buffeting, or machinery will also place stresses on solder joints. A mismatch of thermal coefficient of expansion during heating and cooling cycles induces a primary stress. As components mounted to an electronic circuit board with solder rise in temperature, they expand at a different rate than the board or even the solder itself. Over time, all of these stresses induce fatigue and failure of the solder joints.

Damage to the solder joints does not cause loss of function initially, but as cracks form and propagate through the joint, electrical disconnect can occur. In the modeling and testing for this example, through cracks were expected to cause a significant change in the resistance or capacitance of the components on a circuit board. In most cases, through cracks eventually result in a complete loss of electrical connectivity between components. The process of modeling includes the following steps:

(1) Identify a low reliability solder joint for analysis
(2) Develop a finite element model of the solder joint
(3) Apply loads to the model that are representative of environment and obtain one or more stress models.
(4) Transfer the stress models to a fatigue analysis software tool
(5) Compare the calculated fatigue results with testing and refine model if needed Several test articles were constructed to explore the damage mechanisms exhibited by different surface mount components, solder types, and coatings, and to identify a low reliability solder joint for subsequent analysis. The test boards used in the analysis are made from FR4, and contained many different components at different locations, and with different coatings and orientations. The articles were thermally cycled in a test chamber over a 2 hour period from −55° C. to 95° C. Through the thermal testing, several of the resistors showed higher than average failure rates, and were selected for further analysis. These components have a statistically significant number of failures which will be useful in corroborating the failures predicted by the methods described herein.

In developing finite element models of the solder joint and resistors, several solutions were developed to address material shape and structure. In particular, the contours of the solder are typically very complex and therefore may require specialized modeling. Additionally, conformal coatings significantly change stress fields with the device because a conformal coat "hangs on" to all the components and limits the amount of deformation caused by rise in temperature. This hanging on thereby reduces stress. These issues were overcome to produce an accurate FEA model of the components, as further described herein.

One of the primary challenges with modeling electrical components such as interconnects is to establish the contours of the solder. Solder cools from a liquid to solid state during the manufacturing process, so the shape is driven by surface tension and adhesion to the metal surfaces. Accordingly, one way of modeling the contours is to apply tools that have been developed to simulate surfaces whose shapes are dominated by surface tension forces. For example, Surface Evolver, a program developed by Dr. Kenneth Brakke at Susquehanna University provides a simulation of contours of such surfaces. This is an interactive program for studying surfaces shaped by molecular surface tension and other energies, subject to various constraints, by minimizing energy (such as surface tension and gravity). In the electronics industry, it is used for predicting reflowed solder joint shapes and hence may also be used to model the geometry resulting from the solidification of liquid solder. Surface Evolver models the solder surface as a collection of triangulated facets, thus capturing the complicated topology involved.

For integration into the finite element model of the surface mounted chip under testing, inputs and outputs from Surface Evolver were compared to those used with the finite element analysis (FEA) program, ANSYS. The geometric descriptors defined in Surface Evolver (vertex, edge, facet, and body) were verified to be analogous to the ANSYS geometry definitions (key point, line, area, and volume, respectively). ANSYS can therefore be used with geometric outputs from Surface Evolver. Since Surface Evolver only generates the geometry of the solder joint surface, the interior and interface geometries of the FEA also need to be defined.

Figure 38:
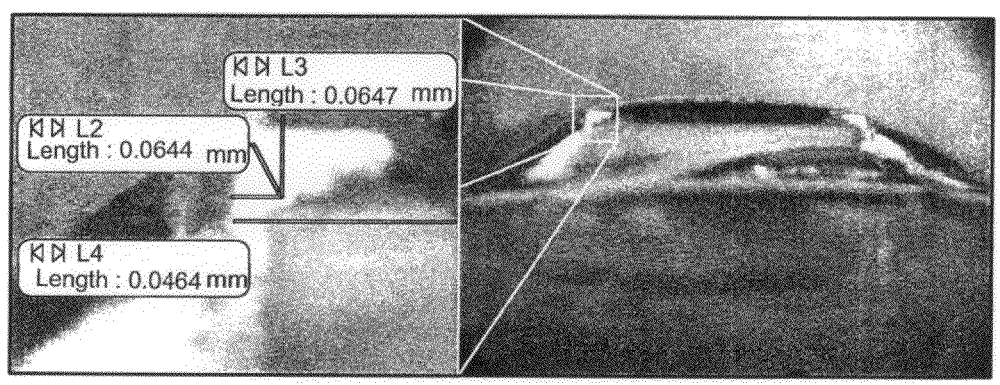
FIG. 38: Microscopic measurement of the fillet dimensions for resistor.
Figure 39:
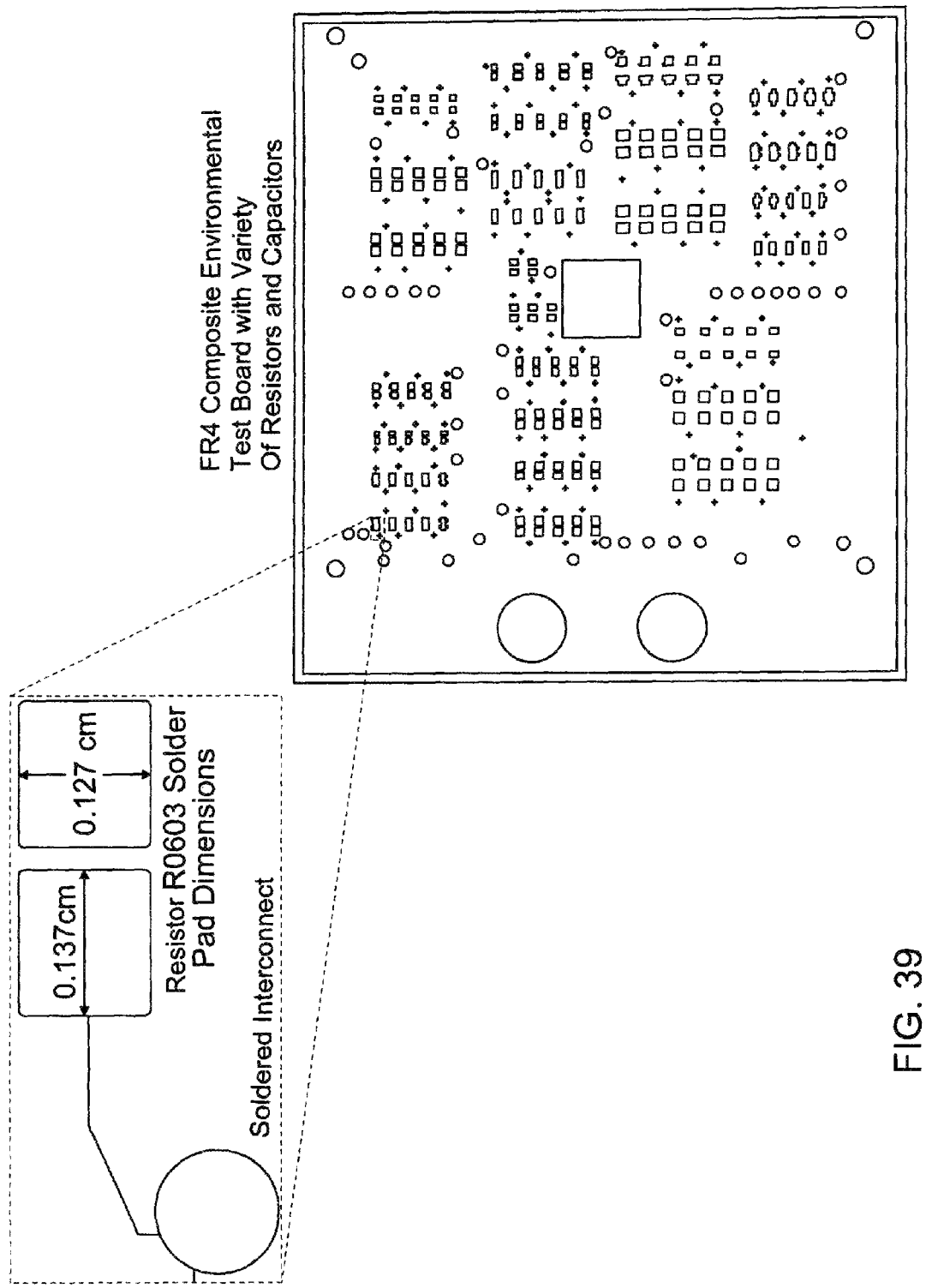
FIG. 39: Dimension measurement for solder-pad.

The dimensions of the resistor and solder pad are inputs required by Surface Evolver to generate solder shapes. The dimensions for the resistor setup under test, were obtained from microscopic measurements, see for example FIG. 38. Also visible in FIG. 38 is the chip-scale package covered with a conformal coat (which acts as a moisture barrier). The thickness of the coat was input into a global FEM for the chip. The resistor was observed to measure 0.06"×0.03" (1.6 mm×0.8 mm). FIG. 39 illustrates the microscopically measured dimensions for the solder-pad and the chip as a portion of the entire test board setup.

TABLE 5

Variation in solder joint measurements

|  | Length (mm) | Width (mm) |
| --- | --- | --- |
| C1 left | 2.5465 | 1.8975 |
| C3 left | 2.5256 | 1.8905 |
| C4 left | 2.4697 | 1.8696 |
| C1 right | 2.5395 | 1.9533 |
| C3 right | 2.5325 | 1.9324 |
| C4 right | 2.4767 | 1.9045 |
| average | 2.515 | 1.908 |
| COV(%) | 1.322 | 1.581 |
| R91 left | 2.2395 | 1.9393 |
| R92 left | 2.2395 | 1.7649 |
| R93 left | 2.2535 | 1.7789 |
| R91 right | 2.2395 | 1.8138 |
| R92 right | 2.1837 | 1.8138 |
| R93 right | 2.2325 | 1.7928 |
| average | 2.231 | 1.817 |
| COV(%) | 1.091 | 3.457 |

A key to the success of this approach is the consistency of solder joint measurements. This was explored using measurements from many components on the circuit board as shown in Table 5. This data revealed that there is less than 2% variation in most measurements. These dimensions are controlled by the printing methodology and the type of surface mount devices. Since the processes are very consistent, as indicated by the measurements, the stresses are likely to be very consistent between similar components on the board.

Figure 40:
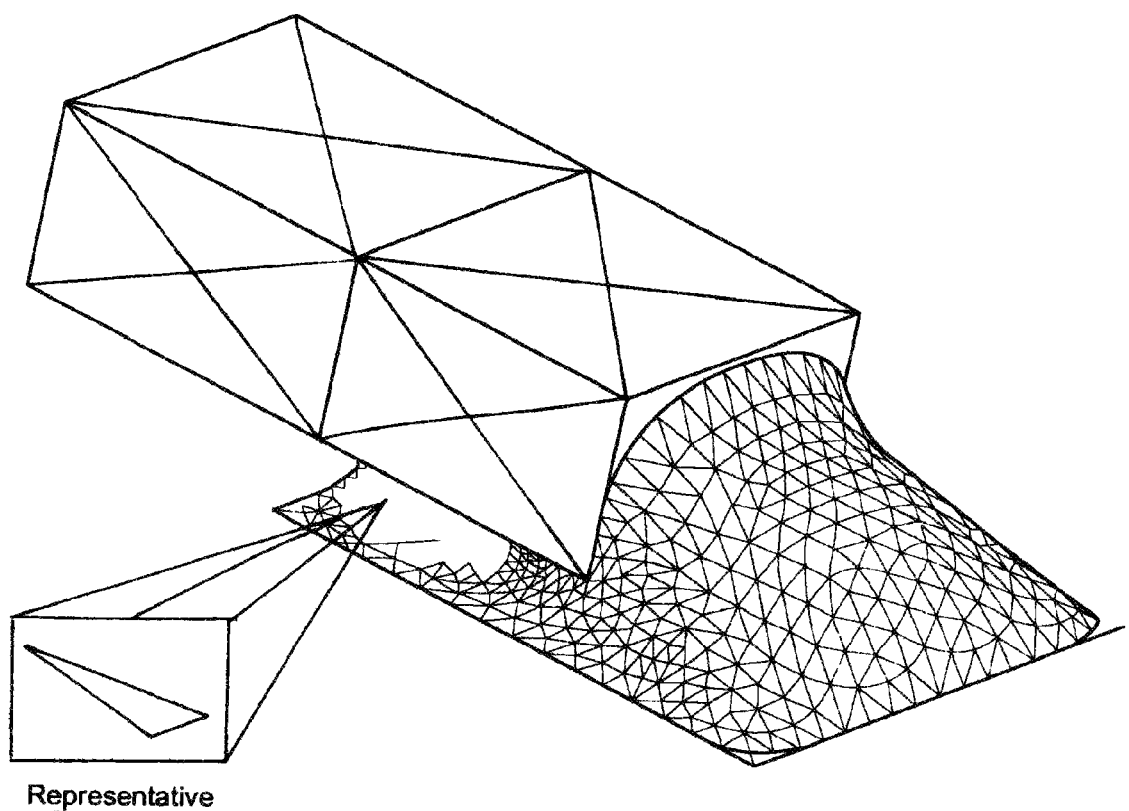
FIG. 40: Surface Evolver representation of solder.

FIG. 40 shows a resistor model generated with Surface Evolver. Microscopic observations of the test board verify that the FEA model simulates the solder joint geometry. The next step involved using the Surface Evolver command language to translate the surface geometric connectivity data generated into an equivalent full volume ANSYS readable input. Further manipulations may be necessary to convert the resulting file into a form that can be directly imported into a program such as ANSYS.

For example, highly skewed facets, an instance of which is shown in FIG. 40, were generated by Surface Evolver in several places. A successful translation of geometry output from Surface Evolver should produce a complete set of key points, lines, areas, and one volume for ANSYS. Several of the ill-shaped triangular facets could have resulted in a finite number of possible geometric discontinuities which are repaired by hand after importing the geometry into ANSYS. For example, the analyst is able to adjust the facet shapes by using an automated geometry optimizer within ANSYS, or by manually redrawing the facet shapes with an ANSYS editor.

Figure 41:
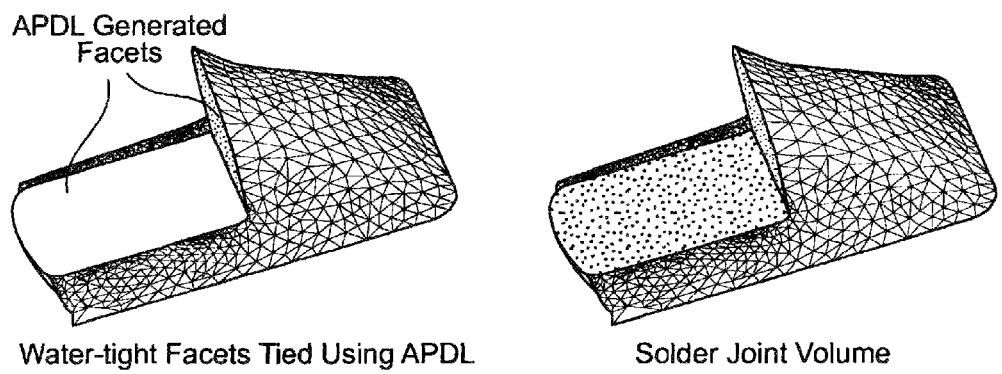
FIG. 41: Facet interfaces and solder volume generated from the output from FIG. 24.

FIG. 41 shows a zero radius fillet between the vertical and horizontal planes of the chip terminal. Because of the zero radius feature, infinite stresses will exist at this location. The finite element geometry at the solder pad-chip terminal interface was modified to a fillet having a finite radius, with the intention to capture the proper distribution of stresses along these regions. The fillet dimensions for the test resistor was verified though microscopic measurements. The curvature on the fillet at the top of the terminal pad is the same as that on the bottom of the pad.

Figure 42A:
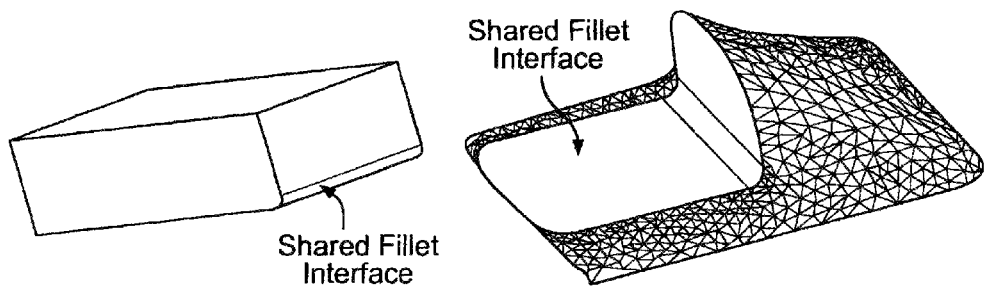
FIG. 42: The fillet incorporated in the electronic assembly analyzed for thermal fatigue.
Figure 42B:
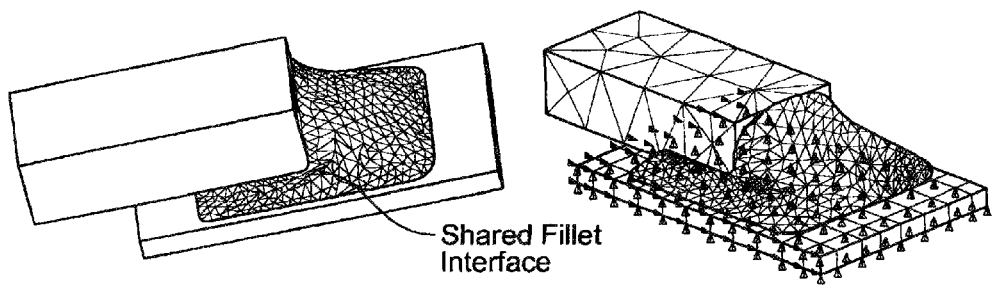

FIG. 42 shows details of the geometry of a fillet incorporated in a soldered resistor electronic assembly which was analyzed for thermal fatigue. ANSYS Parametric Design Language was used to incorporate a fillet in both the solder joint and resistor chip.

Conformal Coatings

A conformal coating is defined as a thin polymeric layer which "conforms" to the topography of the printed circuit board and its components. The coating acts as an insulator, protecting the circuitry and components against shorts and contact with moisture and other contaminants. It also provides mechanical protection from vibration and thermal shock. The electronic assembly failure data from testing revealed that the type of conformal coating used in the resistors influenced the failure rates. The thermal properties of two types of common coating were used in the finite element analysis of the conformal coated assembly.

Figure 43:
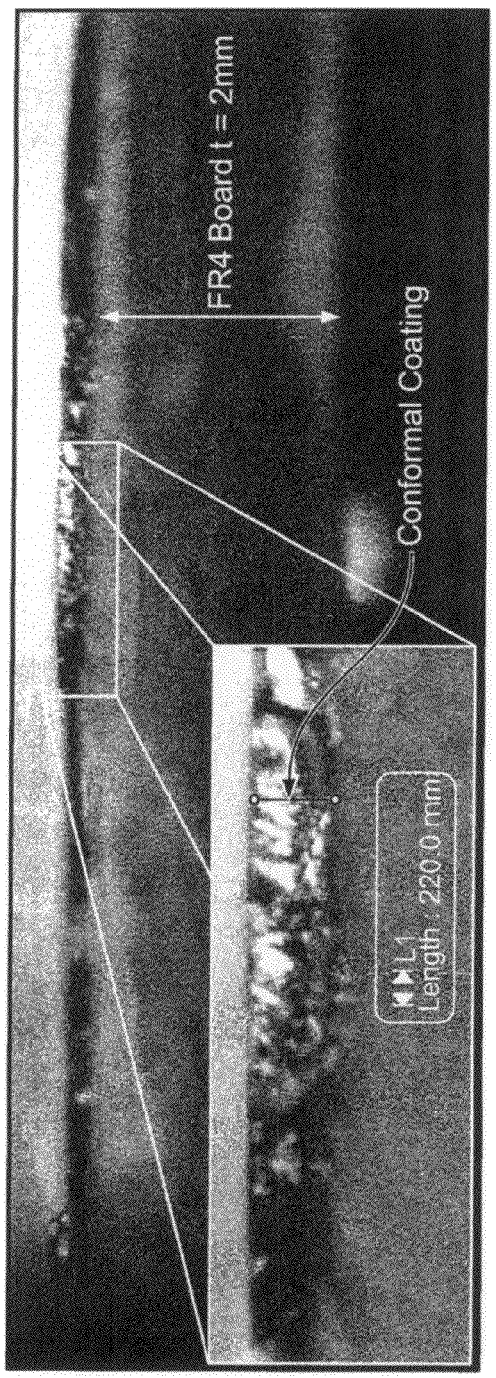
FIG. 43: Coating thickness measured by a binocular microscope.

The thickness of the conformal coating used in the R0603 printed circuit board assembly was independently verified though microscopic measurements. FIG. 43 shows the microscopically measured thickness of the coating. The coating near the resistor assembly measures nominally 220 microns.

A literature search revealed that the coefficient of thermal expansion of the Dymax 984 conformal coat was 69e-6 in./in./° C., which was approximately three times greater than that of the solder joint (26e-6 in./in./° C.). The influence of two conformal coats (Dymax 984 and Dymax 986) on the electronic assembly reliability was incorporated into the model. Preliminary FEA was performed, representative of the conformal coated printed circuit board assembly. The conformal coating greatly improved the reliability of the electronic assembly under test. The thermal fatigue endurance of the assembly coated with Dymax 986 was predicted to be higher than the electronic assembly coated with Dymax 984.

The finite element analysis evaluated the stresses incurred by thermal cycling of the component in tests. The temperature ranged from 95° C. to −45° C. For the purposes of the stress analysis, the zero stress state of the joint was taken at the eutectic solder solidification temperature of 183° C.

FIG. 42 shows the half symmetry finite element model of the resistor. Two independent volumes were generated, the solder joint and the resistor. The ANSYS model was meshed with quadratic tetrahedral elements, assigned appropriate material properties, and further analyzed to investigate the thermal stress characteristics of the component.

To perform a steady-state thermal analysis with properly defined constraints, the printed circuit board was additionally incorporated into the resistor-solder assembly. Isotropic material properties were specified for the resistor chip and the solder. Appropriate orthotropic material properties were defined for the printed circuit board (composite material). The material properties used for the three components are presented in Table 6.

TABLE 6

Material properties of the components in the finite element model

| Component | Elasticity Modulus (Pa) | Coefficient of thermal expansion (° C.$^{-1}$) |
|---|---|---|
| Resistor | EX = 2.76E11 | ALPX = 6.4E−6 |
| 63Sn37Pb Solder | EX = 2.74E10 | ALPX = 2.6E−5 |
| Printed Circuit Board | EX = 1.597E10 | ALPX = 1.6E−5 |
| | EY = 1.597E10 | ALPY = 1.6E−5 |
| | EZ = 7.036E9 | ALPZ = 8.4E−5 |
| | GXY = 7.205E9 | |
| | GYZ = 3.1421E9 | |
| | GXZ = 3.142E9 | |

The net increase in coefficient of thermal expansion of the entire assembly resulted in lower magnitude of stresses at the critical region (solder pad-chip terminal interface), than without a conformal coating. At a temperature delta of 150° C., a maximum principal stress of 16 ksi was observed along the critical regions of the assembly which did not have the conformal coat. A Dymax 984 coat decreased the stress to 13 ksi. The Dymax 986 material, which had a higher coefficient of thermal expansion (128e-6 in/in/Celsius as compared to 69e-6 in/in/Celsius for Dymax 984) when used on the assembly, decreased the stress further to 12.8 ksi.

Figure 44:
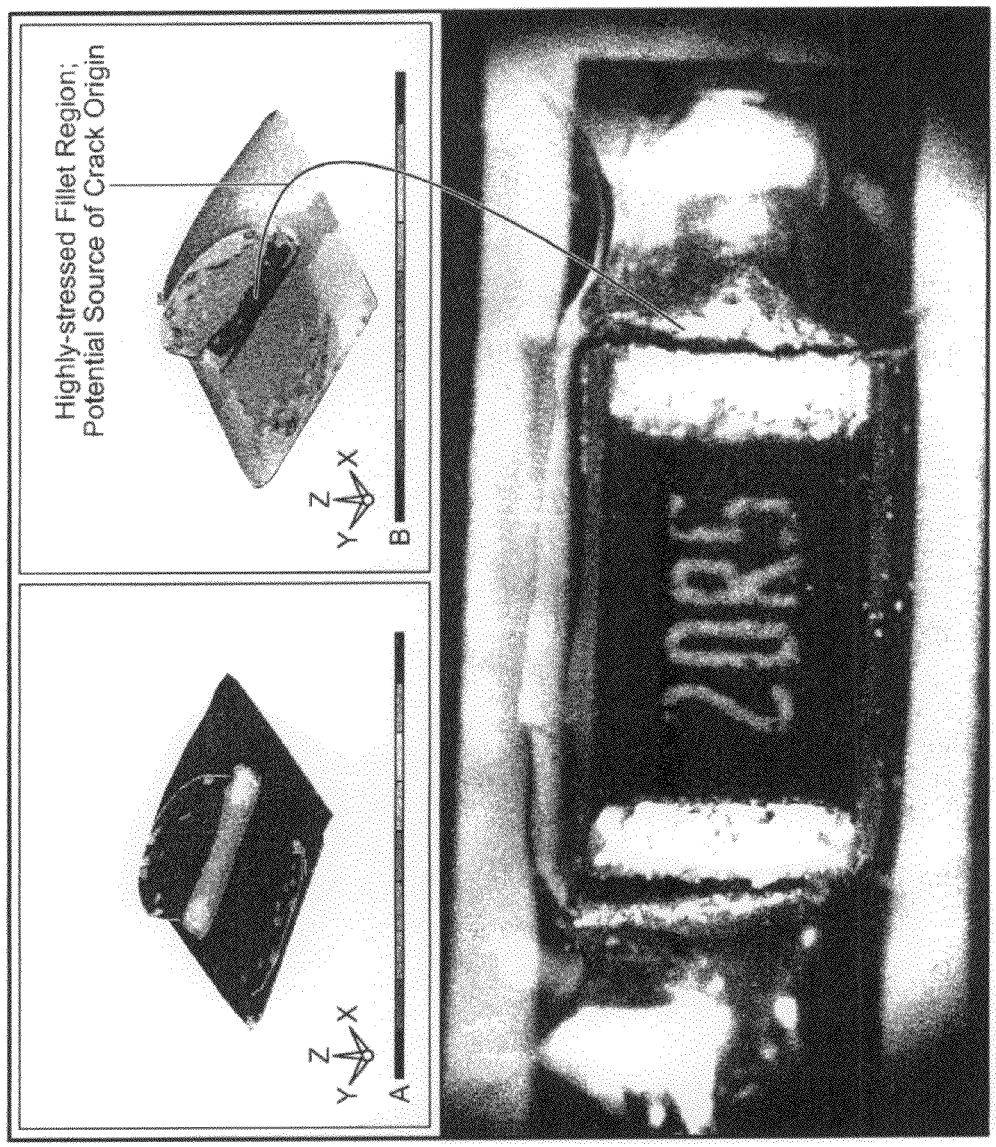
FIG. 44: Von Mises stress distribution along the Dymax 984 coated solder pad-chip terminal fillet interface.

FIG. 44 presents the distribution of the largest magnitudes of stresses along the solder pad-chip terminal filler interface. Microstructural crack mechanisms trigger in the regions of localized high stresses. The regions are shown in FIG. 44*b*, where the largest magnitudes of stresses were observed. These critical regions were identified as potential sources for a micro-crack to nucleate and propagate through the assembly, leading to a failure. The finite element stress model is used as an input to the fatigue analysis.

When compared to the test results, the predicted models successfully captured the physics of failure. The finite element model accurately predicted the stresses induced by thermal cycling. The probabilistic microstructural fatigue model will be used to predict the statistical variation in the test data and the relative effect of the conformal coating.

VPS-MICRO™ is a probabilistic microstructural fatigue software that predicts the mean and scatter in the number of cycles to failure for complex components with complex stress distributions. The inputs to VPS-MICRO™ are: finite element or other stress results files; the statistical distributions that describe the microstructural geometry; and other random variables. VPS-MICRO™ performs a "total life" analysis that includes crack nucleation, small crack growth, and long crack growth or any subset thereof. The crack nucleation and small crack growth routines are based on physics of failure using crystalline dislocation theory. The long crack growth routine is based on elastic plastic fracture mechanics.

The analysis uses Monte Carlo techniques to simulate many globally identical interconnect joints. Each joint has a unique microstructure and thus a unique fatigue response, allowing for the evaluation of the effects of material variability. Computations are performed on the ensemble of simulated joints to determine statistical. fatigue descriptions such as average, scatter, and distribution type.

Figure 45:
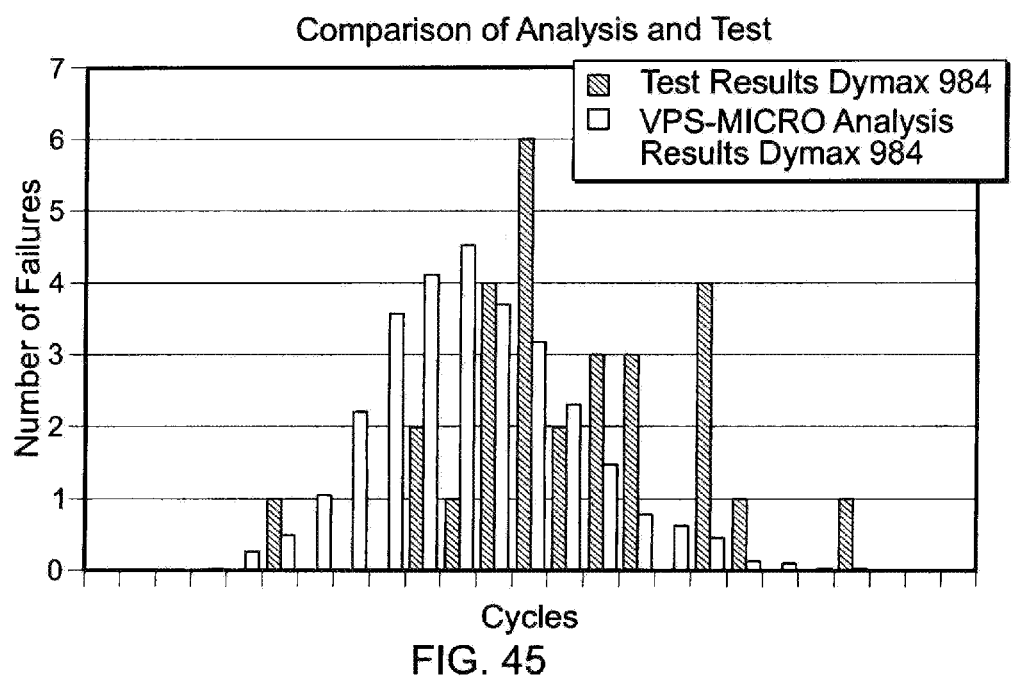
FIG. 45: Comparison of Analysis and Test (lower scale omitted).

FIG. 45 compares the statistical distribution of the VPS-MICRO™ predicted fatigue life data of the solder joint assembly subjected to different conformal coatings. At a delta temperature of 150° C., the resistor assembly without a conformal coat was used as the baseline life span. The resistor assembly with a Dymax 984 conformal coat had a predicted mean life 60% greater than the assembly with no coating. The assembly with a Dymax 986 conformal coating had a predicted mean fatigue life almost 2½ times the components with no coating. The Dymax 986 material (which had a higher coefficient of thermal expansion, 128e-6 in/in/Celsius as compared to 69e-6 in/in/Celsius for Dymax 984) when used on the assembly improved the thermal fatigue endurance of the electronic assembly significantly.

Figure 46:
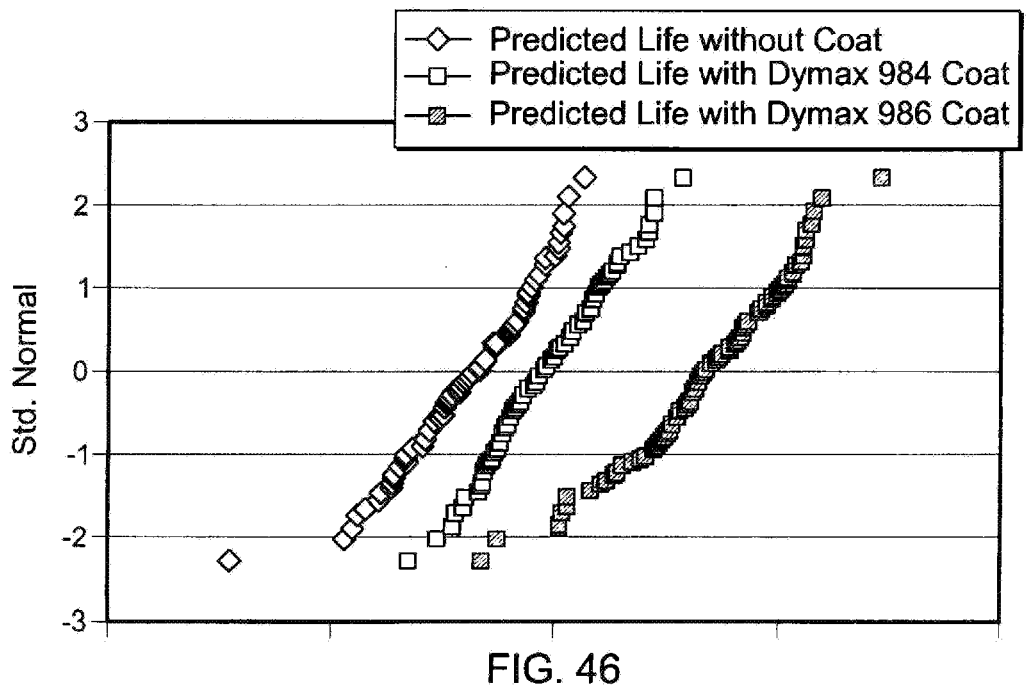
FIG. 46: Statistical distribution for the resistor assembly (with and without conformal coatings), subjected to a delta temperature of 150 Celsius.

FIG. 46 compares the actual test data and predicted fatigue life data for the Dymax 984 coated resistor assembly subjected to a delta temperature of 150° C. The Dymax 984 coated VPS-MICRO™ predicted failure data had a predicted mean life somewhat less than compared to a actual testing mean life. The finite element analysis of the component with the conformal coating gives a preliminary indication of how the coating adheres to the component and if coating egresses between the chip and the board. The current model assumes that the coat adheres to the chip and the board but does not adhere to the solder itself. It is also assumed that the coating does not egress between the chip and the board. Changes in the coating FEA will change the stresses which will affect the mean life.

The Dymax 984 coated VPS-MICRO™ predicted failure data had a predicted coefficient of variation (COV) of 28% as compared to an actual test COV of 28%. The COV of the fatigue life distribution FIG. 46 is indicative of the fatigue mechanism. Therefore it can be concluded that the model captures the mechanisms experienced by the test. This is an important finding because if the modeling captures the same mechanism as the test, the model can be used for assessing fatigue response at different loading conditions.

Example 9

Intermetallic Layer Simulation

This example considers the real world variation that exists in electronic power and digital circuit devices. As shown herein, temperature cycling causes device material layers to vary in thickness. This in turn, creates stresses which ultimately results in device degradation and failure.

Representative Volume Element of the Interface Microstructure:

To model the complex stress state of the microstructure at the copper/solder interface, two dimensional ANSYS finite element models were created for the copper/intermetallic/solder region. Because the thickness of the intermetallic layers change with time, a series of finite element models were created for various $Cu_3Sn$ and $Cu_6Sn_5$ thicknesses. FIG. 48 shows an example FEA model for 4 microns of $Cu_3Sn$ and 7 microns of $Cu_6Sn_5$. The bottom layer in the model in FIG. 48A is the copper. (The elements of this layer are designated with a 1 at their centers.) The next layer is $Cu_3Sn$, designated with 2 at the centers of the elements. The next layer is $Cu_6Sn_5$, designated with 3 at the element centers. The top layer is 63Sn/37Pb solder, designated with 4 at the element centers. Note the regular mesh that is used in the local RVE model.

Figure 49:
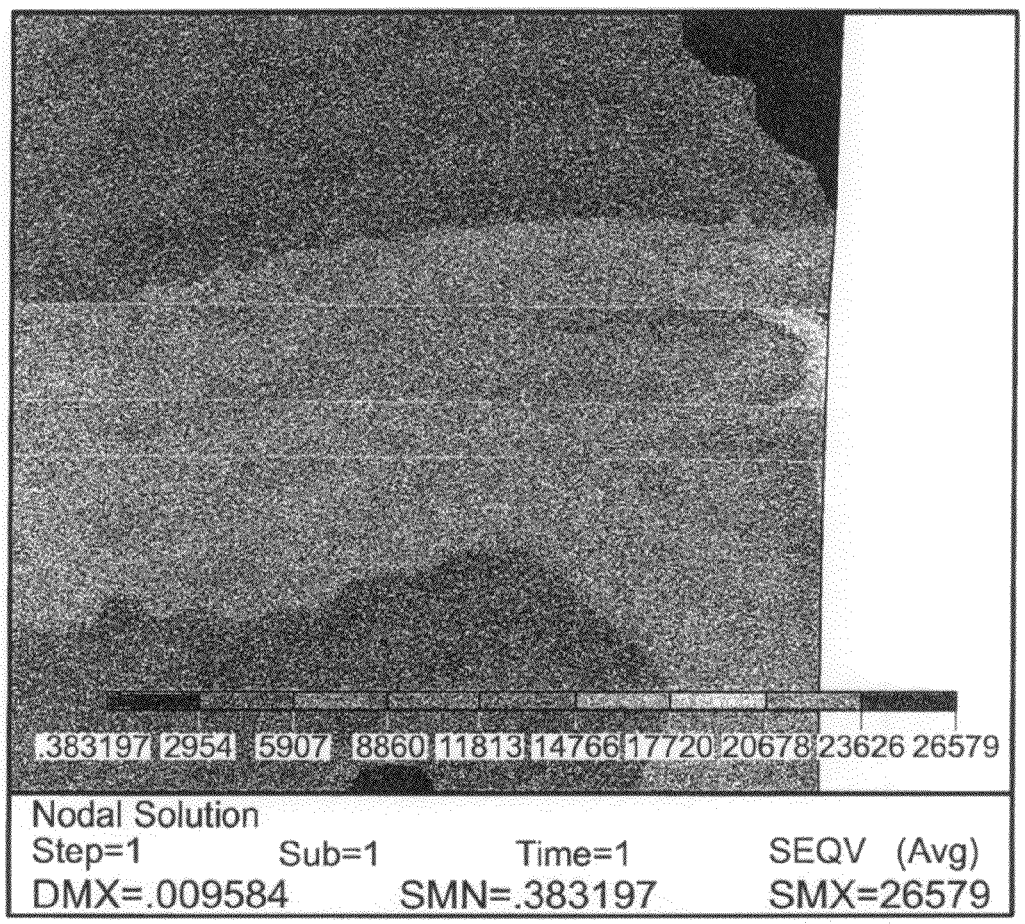
FIG. 49: Thermal stress of the FEA model for a temperature of 256° F.
Figure 50:
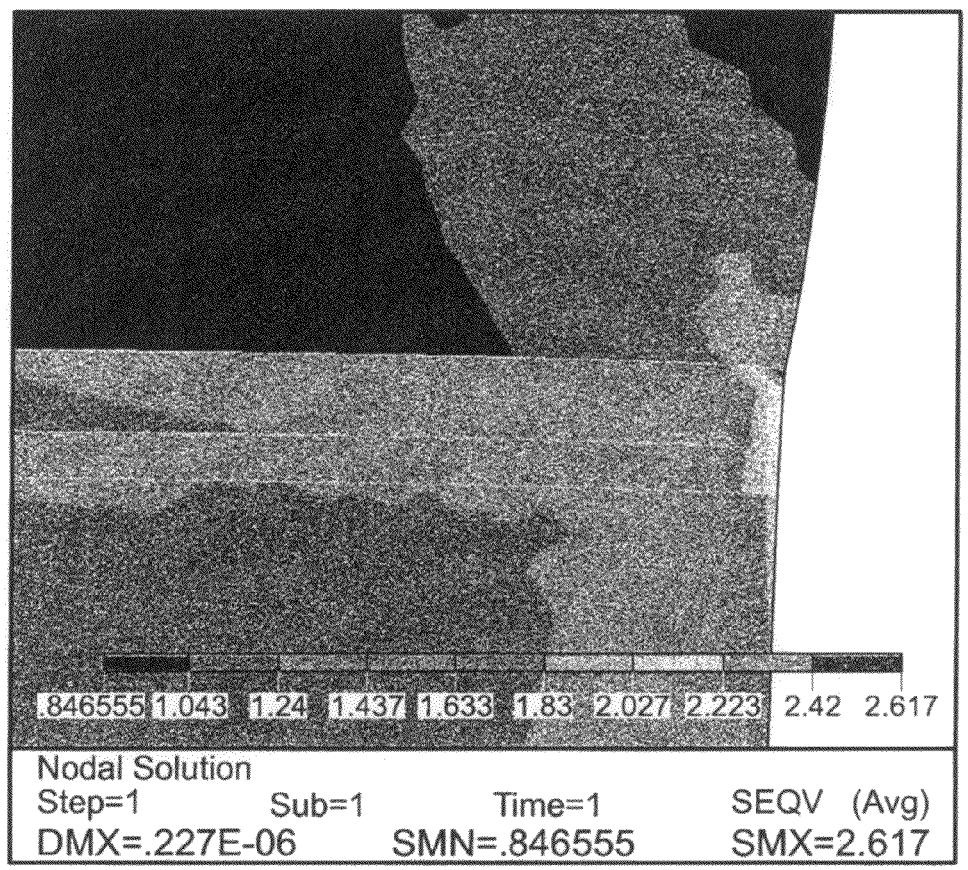
FIG. 50: Structural stress distribution of the FEA model for an applied tensile load of 1 psi.

The complex stress state in the 4-layer microstructure of the interface is due to thermal as well as mechanical mechanisms (stresses). Each layer has significantly different coefficients of thermal expansion. Thus, even at constant temperature, there are thermal stresses near the interface. Also, each layer has significantly different elastic modulus. Thus, when a mechanical load is applied, strain continuity generates stress concentrations between each layer. The material properties for the layers of the FEA local model are listed in Table 7. FIG. 49 shows the stress caused by the difference in the coefficients of thermal expansion at 256° F. FIG. 50 shows the stresses required for strain continuity for an applied mechanical tensile load of 1 psi. The RVE is adjusted with the proper boundary conditions to represent the local condition of the global model. The thermal stress needs no adjustment because the global model is isothermal at a temperature of 256° F. However, the mechanical stress model is adjusted by applying the nodal stress from the global model as the boundary conditions for the local model. At node 1 in the global FEA model of FIG. 48A, the stress state is primarily tensile with a value of 2580 psi. Thus, the local mechanical stresses can be approximated by multiplying the stresses in FIG. 50 by 2580.

TABLE 7

Material properties of intermetallic layers

| | Solder | $Cu_6Sn_5$ | $Cu_3Sn$ | Cu |
|---|---|---|---|---|
| Young's Modulus (GPa) | 15 | 85.56 | 108.3 | 110.32 |
| Poisson's Ratio | 0.4 | 0.3 | 0.3 | 0.35 |
| Thermal Expansion (PPM/C) | 24.05 | 16.3 | 19.0 | 16.5 |

Figure 51:
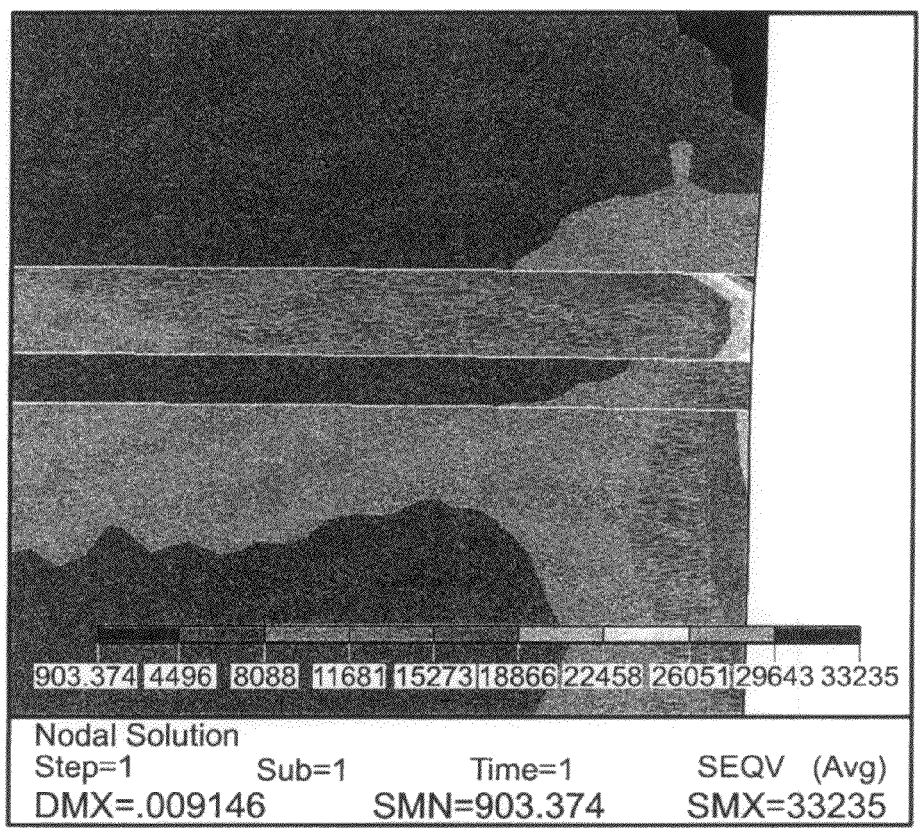
FIG. 51: Combined thermal and structural stress distribution of copper solder interface.

The thermal and mechanical stress states are analyzed independently and then combined using superposition of the component stresses to determine the combined stress state. FIG. 51 shows the combination of the stress states in FIG. 49 and FIG. 50 where the stresses in FIG. 50 have been multiplied by 2580 to account for the global FEA conditions at node 1. The highest stress in the solder is a tensile stress of about 10,000 psi.

Combining the global and local analysis

Figure 48B:
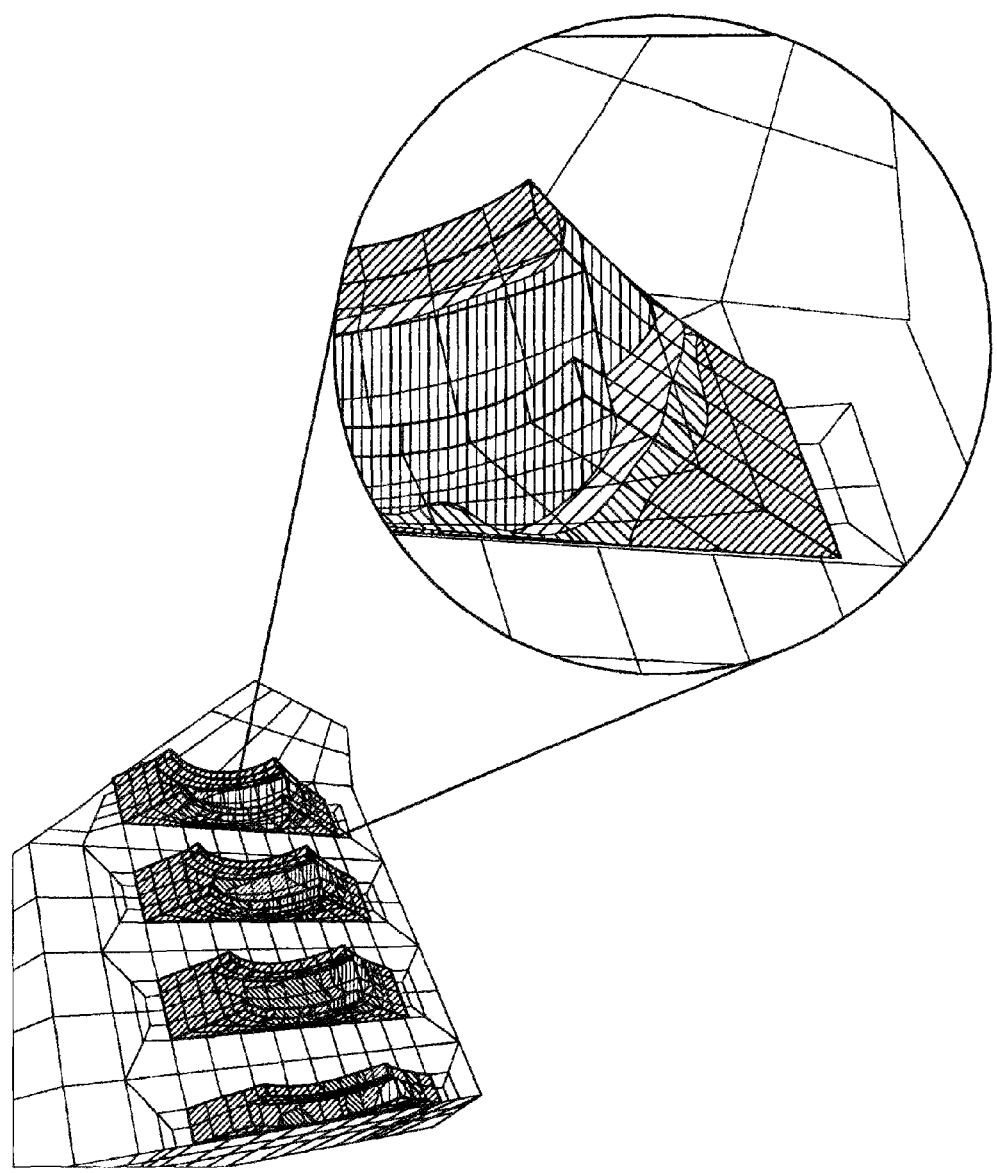

The local stress states at the other locations in FIG. 48B are found accordingly. Each of the three high stress nodes in FIG. 48B was analyzed to find the corresponding local stress state similar to FIG. 51. Along with the local stresses, the area of the highly stressed region was also computed for the fatigue analysis. The high stresses in the global model occur at nodes 1, 2, and 3 in FIG. 48B. The high stress in the solder of the local model occurs at nodes 2599, 2904 and 2905 in FIG. 48A. In this case, each of the 3 nodes of high stress in the global model will have 3 corresponding nodes of high stress in the local model. Therefore there are nine nodes in the combined global/local analysis. In other words, the local model of FIG. 48 is "swept" along a line from nodes 1 to 2 to 3 in the global model of FIG. 48B.

The area associated with each of the nodes is the distance between the nodes in global model multiplied by the distance between the nodes in the local model. Table 8 gives the matrix of stresses and areas for each node corresponding to the global/local location.

TABLE 8 stresses with the corresponding stressed area
for the combined global/local analysis.

| | Global node | | | | | |
|---|---|---|---|---|---|---|
| | 1 | | 2 | | 3 | |
| Local Node | Stress (psi) | Area (in$^2$) | Stress (psi) | Area (in$^2$) | Stress (psi) | Area (in$^2$) |
| 2599 | 10000 | 5.0E−6 | 8670 | 1.0E−5 | 5840 | 1.0E−5 |
| 2903 | 7830 | 1.0E−5 | 6660 | 2.0E−5 | 4200 | 2.0E−6 |
| 2904 | 5690 | 1.0E−5 | 4420 | 2.0E−5 | 2650 | 2.0E−5 |

Figure 52:
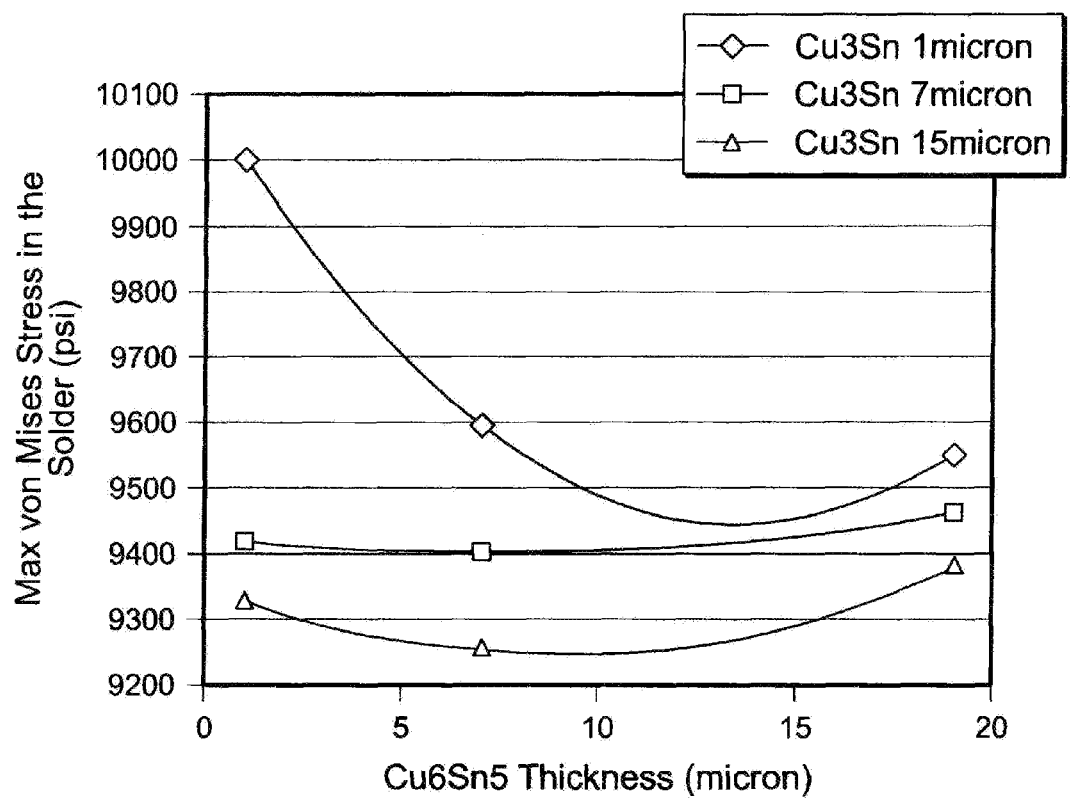
FIG. 52: The change in the maximum stress in the solder with the thickness of the intermetallic layers.

FIG. 51 shows that the stress in the solder is less than the stress in the other layers. However, the fatigue strength of the solder is considerably less than the other layers (this will be discussed later in this report). In fact, industry data indicates that fatigue cracking most often occurs in the solder near the $Cu_6Sn_5$/solder interface. This interface location is where the maximum stress occurs in the solder. FIG. 52 shows that the maximum stress in the solder is affected by the thickness of the $Cu_6Sn_5$ layer. FIG. 52 shows the change in stress as a function of $Cu_6Sn_5$ layer thickness for a constant $Cu_3Sn$ layer thickness. The data in FIG. 52 was derived by developing nine finite element models similar to FIG. 48A for different thicknesses of the intermetallic layers. Significantly, this illustrates the importance in considering both geometric variability and material variation characteristics in prognosis architectures. These factors have a direct impact on stress and therefore on crack initiation and ultimate device failure.

A response surface can now be determined to relate the stress in the solder to the temperature and dwell time experienced by the solder joint. Using least squares, a sixth order polynomial surface is fit to the points in FIG. 52 as $$\sigma = c_1 + c_2 d_1 + c_3 d_2 + c_4 d_1^2 + c_5 d_2^2 + c_6 d_1 d_2 \tag{34}$$

where $\sigma$ is the von Mises stress, $d_1$ and $d_2$ are the thickness of $Cu_6Sn_5$ and $Cu_3Sn$ intermetallic layer respectively, and $c_i$ is the coefficients of the least squares fit such that:
$c_1 = 10036.0889039212$,
$c_2 = -55272.7755651648$,
$c_3 = -82829.9514176154$,
$c_4 = 1769898.75800935$,
$c_5 = 2460018.71645026$, and
$c_6 = 1694734.15427898$.

The global induced thermal stresses was evaluated at 256° F. and was found to be a linear function with respect to temperature. Also, knowing the relationship between the intermetallic layer thickness and time and temperature, the overall response surface relating time and temperature to stress in the solder is $$\sigma = \frac{T}{256}(c_1 + c_2 d_1 + c_3 d_2 + c_4 d_1^2 + c_5 d_2^2 + c_6 d_1 d_2) \tag{35}$$

where:

$$d_n = (D_n e^{(-Q_n/kT)} t)^{\frac{1}{2}}$$

$n = 1$ for Cu6Sn5

$n = 2$ for Cu3Sn

Parameter values for $Cu_6Sn_5$ and $Cu_3Sn$ intermetallic layers are listed in Table 2, herein.

The maximum stress in the solder as a function of time at 256° F. can be determined using Eq. (35) as shown in FIG. 53.

Figure 53:
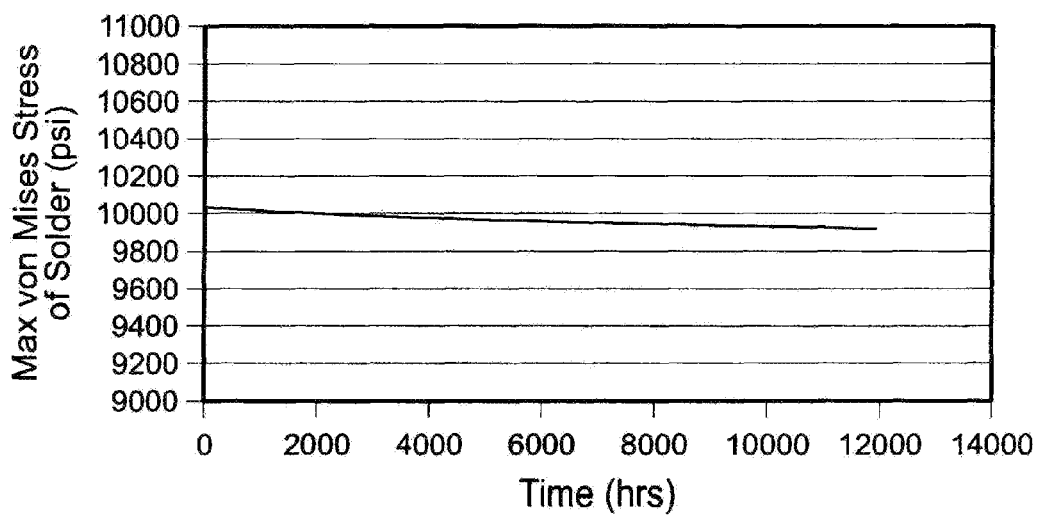
FIG. 53: Maximum stress variability near the $Cu_6Sn_5$ interface as a function of time at 256° F.

Although the FIG. 53 demonstration indicates that the stress in the solder does not change significantly with time, this varies greatly with thermal and mechanical loading and in general, the stress in the solder can be expected to change with time.

REFERENCES

The instant specification has referenced a number of publications. To the extent that any of them has not been specifically incorporated by reference herein, any such reference is incorporated herein by reference in its entirety.

The foregoing description is intended to illustrate various aspects of the present technology. It is not intended that the examples presented herein limit the scope of the present technology. The technology now being fully described, it will be apparent to one of ordinary skill in the art that many changes and modifications can be made thereto without departing from the spirit or scope of the appended claims.

What is claimed:

1. A method of predicting time to failure of a metallic component of an electronic device, the method comprising:

generating a finite element model of the component, wherein the finite element model comprises a plurality of nodes, and wherein a value of at least one stress variable is associated with each node of the plurality of nodes;

defining at least one representative volume element for each node of the plurality of nodes;

developing a microstructure-based failure model for each of the representative volume elements, wherein the microstructure-based failure model uses random initial values for one or more properties of a material microstructure within each of the representative volume elements, and wherein the microstructure-based failure model represents heterogeneous microstructures in the component, and comprises one or more cyclic fatigue models selected from a first group consisting of crack nucleation, short crack growth, and long crack growth models, and further comprises one or more time-dependent fatigue models selected from a second group consisting of crack nucleation, short crack growth, and long crack growth models;

simulating failure of each node by applying the value of the at least one stress variable for that node to the microstructure-based failure model for each of the representative volume elements for that node, thereby calculating a predicted time to failure for each representative volume element; and calculating a time to failure for the component by choosing the shortest predicted time to failure for any node.

2. The method of claim 1, further comprising:

performing the simulating of failure for each node a plurality of times, using different initial values for the one or more properties of the material microstructure, thereby producing a plurality of predicted times to failure for the component; and deriving a probabilistic model of failure of the component based on the plurality of predicted times to failure.

3. The method of claim 1, wherein one or more of the crack nucleation and short crack growth models further comprises a phase coarsening model.

4. A computer system, configured to predict time to failure of a metallic component of an electronic device, the system comprising:
- a memory; and
- a processor, wherein the processor is configured to execute instructions stored in the memory for:
- generating a finite element model of the component, wherein the finite element model comprises a plurality of nodes, and wherein a value of at least one stress variable is associated with each node of the plurality of nodes;
- defining at least one representative volume element for each node of the plurality of nodes;
- developing a microstructure-based failure model for each of the representative volume elements, wherein the microstructure-based failure model uses random initial values for one or more properties of a material microstructure within each of the representative volume elements, and wherein the microstructure-based failure model represents heterogeneous microstructures in the component, and comprises one or more cyclic fatigue models selected from a first group consisting of crack nucleation, short crack growth, and long crack growth models, and further comprises one or more time-dependent fatigue models selected from a second group consisting of crack nucleation, short crack growth, and long crack growth models;
- simulating failure of each node by applying the value of the at least one stress variable for that node to the microstructure-based failure model for each of the representative volume elements for that node, thereby calculating a predicted time to failure for each representative volume element; and
- calculating a time to failure for the component by choosing the shortest predicted time to failure for any node.

5. The system of claim 4, wherein the processor is further configured to execute instructions comprising:
- performing the simulating of failure for each node a plurality of times, using different initial values for the one or more properties of the material microstructure, thereby producing a plurality of predicted times to failure for the component; and
- deriving a probabilistic model of failure of the component based on the plurality of predicted times to failure.

6. The system of claim 4, wherein one or more of the crack nucleation and short crack growth models further comprises a phase coarsening model.

7. A computer readable non-transitory medium, storing instructions for predicting time to failure of an electronic component, the instructions, when executed by a processor, cause the processor to perform operations comprising:
- generating a finite element model of the component, wherein the finite element model comprises a plurality of nodes, and wherein a value of at least one stress variable is associated with each node of the plurality of nodes;
- defining at least one representative volume element for each node of the plurality of nodes;
- developing a microstructure-based failure model for each of the representative volume elements, wherein the microstructure-based failure model uses random initial values for one or more properties of a material microstructure within each of the representative volume elements, and wherein the microstructure-based failure model represents heterogeneous microstructures in the component, and comprises one or more cyclic fatigue models selected from a first group consisting of crack nucleation, short crack growth, and long crack growth models, and further comprises one or more time-dependent fatigue models selected from a second group consisting of crack nucleation, short crack growth, and long crack growth models;
- simulating failure of each node by applying the value of the at least one stress variable for that node to the microstructure-based failure model for each of the representative volume elements for that node, thereby calculating a predicted time to failure for each representative volume element; and
- calculating a time to failure for the component by choosing the shortest predicted time to failure for any node.

8. The computer readable medium of claim 7, wherein the medium is further encoded with instructions to:
- perform the simulating of failure for each node a plurality of times, using different initial values for the one or more properties of the material microstructure, thereby producing a plurality of predicted times to failure for the component; and
- derive a probabilistic model of failure of the component based on the plurality of predicted times to failure.

9. The medium of claim 7, wherein one or more of the crack nucleation and short crack growth models further comprises a phase coarsening model.

* * * * *